(12) United States Patent
Kando

(10) Patent No.: US 7,471,027 B2
(45) Date of Patent: Dec. 30, 2008

(54) ELASTIC BOUNDARY WAVE DEVICE

(75) Inventor: Hajime Kando, Otokuni-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 380 days.

(21) Appl. No.: 10/543,316

(22) PCT Filed: Dec. 16, 2003

(86) PCT No.: PCT/JP03/16068

§ 371 (c)(1),
(2), (4) Date: Jul. 25, 2005

(87) PCT Pub. No.: WO2004/070946

PCT Pub. Date: Aug. 19, 2004

(65) Prior Publication Data

US 2006/0071579 A1 Apr. 6, 2006

(30) Foreign Application Priority Data

| Feb. 10, 2003 | (JP) | ............................. 2003-032409 |
| Jun. 16, 2003 | (JP) | ............................. 2003-171041 |
| Oct. 29, 2003 | (JP) | ............................. 2003-369303 |

(51) Int. Cl.
*H01L 41/08* (2006.01)
(52) U.S. Cl. ................. 310/313 A; 310/313 R
(58) Field of Classification Search ............ 310/313 R, 310/313 A, 313 B; 333/186, 193
See application file for complete search history.

(56) References Cited

U.S. PATENT DOCUMENTS

| 4,328,472 | A | * | 5/1982 | Grudkowski ................ 333/141 |
| 4,484,098 | A | * | 11/1984 | Cullen et al. ............ 310/313 A |
| 6,025,363 | A | | 2/2000 | Giles |
| 6,420,815 | B1 | | 7/2002 | Tanaka et al. |
| 7,310,027 | B2 | * | 12/2007 | Kando ........................ 333/133 |
| 2002/0057036 | A1 | | 5/2002 | Taniguchi et al. |
| 2002/0079989 | A1 | | 6/2002 | Kadota et al. |

FOREIGN PATENT DOCUMENTS

DE 4132309 A1 4/1993

(Continued)

OTHER PUBLICATIONS

Kazuhiro Yamanouchi et al.; "Piezoelectric Acoustic Boundary Waves Propagating Along the Interface Between $SiO_2$ and $LiTaO_3$"; IEEE Transactions on Sonics and Ultransonics; vol. SU-25; No. 6; pp. 384-389; Nov. 1978.

(Continued)

*Primary Examiner*—Mark Budd
(74) *Attorney, Agent, or Firm*—Keating & Bennett, LLP

(57) ABSTRACT

A boundary acoustic wave device includes a dielectric substance that is laminated on one surface of a piezoelectric substance, an IDT and reflectors used as electrodes are disposed at a boundary between the piezoelectric substance and the dielectric substance, and the thicknesses of the electrodes are set such that the acoustic velocity of the SH type boundary acoustic wave is less than that of a slow transverse wave propagating in the dielectric substance and than that of a slow transverse wave propagating in the piezoelectric substance, so that a boundary acoustic wave device is formed.

25 Claims, 75 Drawing Sheets

FOREIGN PATENT DOCUMENTS

| | | |
|---|---|---|
| JP | 09-219632 | 8/1997 |
| JP | 10-84247 | 3/1998 |
| JP | 10-178331 | 6/1998 |
| JP | 2001-85971 | 3/2001 |
| JP | 2001-196895 | 7/2001 |
| JP | 2002-141769 | 5/2002 |
| JP | 2002-152000 | 5/2002 |
| JP | 2002-204142 | 7/2002 |
| WO | WO 98/52279 | 11/1998 |
| WO | WO 01/29964 A1 | 4/2001 |

OTHER PUBLICATIONS

Official Communication issued in corresponding Korean Patent Application No. 10-2005-7014610, dated Sep. 20, 2006.

Official Communication issued in corresponding European Patent Application No. 03778944.3-2215, dated Apr. 25, 2006.

Yamashita et al.; "Highly Piezoelectric SH-type Boundary Waves."; Technical Report, The Institute of Electronics, Information and Communication Engineers, vol. 96, No. 249 (US96 45-53) pp. 21 to 26, Sep. 1966.

Takashi et al.; "Highly Piezoelectric Boundary Waves in Si/SiO2/LiNbO3 Structure"; 26th EM symposium, May 1997, pp. 53 to 58.

Campbell et al.; "A Method for Estimating Optimal Crystal Cuts and Propagation for Excitation of Piezoelectric Surface Waves"; IEEE Trans. Sonics and Ultrason.; vol. SU-15; pp. 209 to 217; Oct. 1968.

"Acoustic Wave Device Technology Handbook"; edited by Acoustic Wave Device Technology 150th Committee of the Japan Society for the Promotion of Science, first print/first edition issued on Nov. 30, 2001, p. 549.

Shimizu; "SAW Propagation Characteristics on LiTaO3 with Arbitrary Cut"; Journal of the Acoustical Society of Japan, vol. 36, No. 3, 1980, pp. 140 to 145.

Official communication issued in counterpart Chinese Application No. 200380109318.3, issued on Jun. 6, 2008.

* cited by examiner

ELASTIC BOUNDARY WAVE DEVICE

BACKGROUND OF THE INVENTION

1. Field of the Invention

The present invention relates to a boundary acoustic wave device using an SH type boundary acoustic wave and, in particular, the present invention relates to a boundary acoustic wave device including electrodes which are disposed at a boundary between a piezoelectric substance and a dielectric substrate.

2. Description of the Related Art

Previously, various surface acoustic wave devices have been used for RF and IF filters in mobile phones, resonators in VCOs, and VIF filters in televisions. The surface acoustic wave devices utilize a surface acoustic wave, such as a Rayleigh wave or a first leaky wave, propagating along a surface of a medium.

Since the surface acoustic waves propagate along a surface of a medium, the surface acoustic waves are sensitive to changes in the surface condition of the medium. Accordingly, to protect a surface of a medium along which the surface acoustic wave propagates, a surface acoustic wave element is hermetically sealed in a package having a cavity portion such that the surface of the medium described above is disposed therein. Since a package having a cavity as described above has been used, the cost of the surface acoustic wave device is increased. In addition, since the size of the package is larger than the size of a surface acoustic wave element, the size of the surface acoustic wave device is increased.

Another type of acoustic wave is a boundary acoustic wave which propagates along a boundary between solid substances.

For example, in "Piezoelectric Acoustic Boundary Waves Propagating Along the Interface Between $SiO_2$ and $LiTaO_3$," IEEE Trans. Sonics and ultrason., Vol. SU-25, No. 6, 1978 IEEE, a boundary acoustic wave device is disclosed in which an IDT is formed on a 126° rotated Y plate X propagating $LiTaO_3$ substrate, and on the IDT and the $LiTaO_3$ substrate, a $SiO_2$ film having a predetermined thickness is formed. In the above technical paper, it has been disclosed that an SV+P type boundary acoustic wave, a so-called Stoneley wave, propagates. In addition, in "Piezoelectric Acoustic Boundary Waves Propagating Along the Interface Between $SiO_2$ and $LiTaO_3$" IEEE Trans. Sonics and Ultrason., Vol. SU-25, No. 6, 1978 IEEE, the film thickness of the $SiO_2$ film is disclosed as being set to $1.0\lambda$ ($\lambda$ indicates the wavelength of a boundary acoustic wave), and an electromechanical coefficient of 2% is obtained.

The boundary acoustic wave propagates when energy thereof is concentrated at a boundary portion between solid substrates. Accordingly, since the energy is not substantially present on the bottom surface of the $LiTaO_3$ substrate and the surface of the $SiO_2$ film, the properties are not changed by changes in the surface conditions of the substrate and the thin film. Hence, a cavity type package is not required, and as a result, the size of the acoustic wave device is reduced.

In addition, in "Highly Piezoelectric Boundary Acoustic Wave Propagating in $Si/SiO_2/LiNbO_3$ Structure" (26th EM symposium, May 1997, pp. 53 to 58), an SH type boundary acoustic wave propagates in a [001]-Si(110)/$SiO_2$/Y-cut X propagating $LiNbO_3$ structure. This SH type boundary acoustic wave has an increased electromechanical coefficient $k^2$ as compared to that of the Stoneley wave. In addition, with the SH type boundary acoustic wave, as with the Stoneley wave, the cavity type package is not required. Furthermore, since the SH type boundary acoustic wave is an SH type wave, the reflection coefficient of strips forming an IDT reflector is increased as compared to that of the Stoneley wave. Hence, for example, when a resonator or a resonator filter is formed using the SH type boundary acoustic wave, miniaturization is achieved, and in addition, steeper properties are obtained.

In a boundary acoustic wave device, a large electromechanical coefficient is required. In addition, small propagation loss, power flow angle, and temperature coefficient of frequency are also required. The propagation loss degrades the insertion loss of a boundary acoustic wave filter or degrades an impedance ratio of a boundary acoustic resonator. The impedance ratio is a ratio between a resonant resistance or the impedance at a resonant frequency and the impedance at an antiresonant frequency. Accordingly, reduced propagation loss is preferable.

The power flow angle is an angle showing the difference in direction between the phase velocity of a boundary acoustic wave and the group velocity of energy thereof. When the power flow angle is large, an IDT must be obliquely arranged in accordance with the power flow angle. As a result, designing the electrodes is complicated. In addition, due to the deviation in angle, the generation of loss is more likely to occur.

Furthermore, when the operating frequency of a boundary acoustic wave device is changed by temperature, in a boundary acoustic wave filter, practical passband and stopband regions are decreased. In the case of a resonator, the change in operating frequency by temperature described above causes abnormal oscillation when an oscillation circuit is formed. Hence, the change in frequency per degree centigrade, i.e., TCF, is preferably reduced.

For example, when reflectors are provided along a propagation direction and outside a region in which a transmitting and a receiving IDT, which respectively transmits and receives a boundary acoustic wave, are provided, a resonant filter having a low loss is produced. The band width of this resonant filter depends on the electromechanical coefficient of the boundary acoustic wave. When the electromechanical coefficient $k^2$ is large, a wide band filter is obtained, and when it is small, a narrow band filter is obtained. Accordingly, the electromechanical coefficient $k^2$ of a boundary acoustic wave which is used for a boundary acoustic wave device must have a value that is appropriate for its application. When an RF filter for mobile phones is produced, the electromechanical coefficient $k^2$ must be at least 5%.

However, in the boundary acoustic wave device using a Stoneley wave, as disclosed in "Piezoelectric Acoustic Boundary Waves Propagating Along the Interface Between $SiO_2$ and $LiTaO_3$" IEEE Trans. Sonics and Ultrason., Vol. SU-25, No. 6, 1978 IEEE, the electromechanical coefficient $k^2$ is only about 2%.

In addition, in the $Si/SiO_2/LiNbO_3$ Structure disclosed in "Highly Piezoelectric Boundary Wave Propagating in $Si/SiO_2/LiNbO_3$ Structure" (26th EM symposium, May 1997, pp. 53 to 58), in order to excite the boundary acoustic wave, as shown in FIG. 1 of Japanese Unexamined Patent Application Publication No. 10-84247, a complicated four-layered structure of $Si/SiO_2/IDT/LiNbO_3$ was required. Furthermore, when Si was arranged in the [001]-Si(110) orientation which was proposed as the most optimal conditions, a highly difficult bonding method had to be used as disclosed in Japanese Unexamined Patent Application Publication No. 10-84247. In general, it has been difficult to uniformly bond a wafer having a diameter of 3 inches or more, which is used for mass production, by a bonding method. In addition, when the wafer was cut into chips after bonding, defects such as peeling often occur.

With respect to the SH type boundary acoustic wave, as disclosed in "Investigation of Piezoelectric SH Type Boundary Acoustic Wave", Technical Report, The Institute of Electronics, Information and Communication Engineers, Vol. 96, No. 249 (US96 45-53) PAGE. 21 to 26, 1966, in the structure including an isotropic substance and a BGSW substrate, when the conditions are satisfied such that the acoustic velocity of a transverse wave of the isotropic substance and that of a transverse wave of the BGSW substrate are close to each other, the density ratio is small, and the piezoelectric properties are strong, the SH type boundary acoustic wave is obtained.

However, due to limitation of materials that are capable of satisfying the conditions described above, it is difficult to satisfy the aforementioned conditions and properties required for the boundary acoustic wave. For example, in the [001]-Si (110)/X—LiNbO$_3$ structure disclosed in "Highly Piezoelectric Boundary Wave Propagating in Si/SiO$_2$/LiNbO$_3$ Structure" (26th EM symposium, May 1997, pp. 53 to 58), it is necessary to use a highly difficult bonding method for production.

SUMMARY OF THE INVENTION

To overcome the problems described above, preferred embodiments of the present invention provide a boundary acoustic wave device using an SH type boundary acoustic wave, the boundary acoustic wave device having a large electromechanical coefficient, small propagation loss and power flow angle, a temperature coefficient of frequency TCF in an appropriate range, and a simple structure which can be manufactured using a simple method.

In accordance with a first preferred embodiment of the present invention, a boundary acoustic wave device includes a piezoelectric substance, a dielectric substance laminated on one surface of the piezoelectric substance, and electrodes disposed at a boundary between the piezoelectric substance and the dielectric substance, in which the boundary acoustic wave device uses an SH type boundary acoustic wave propagating along the boundary. In the boundary acoustic wave device described above, the thickness of the electrodes is set such that the acoustic velocity of the SH type boundary acoustic wave is low as compared to that of a slow transverse wave propagating in the dielectric substance and to that of a slow transverse wave propagating in the piezoelectric substance.

In accordance with a second preferred embodiment of the present invention, a boundary acoustic wave device includes a piezoelectric substance, a dielectric substance laminated on one surface of the piezoelectric substance, and electrodes disposed at a boundary between the piezoelectric substance and the dielectric substance, in which the boundary acoustic wave device uses an SH type boundary acoustic wave propagating along the boundary. In the boundary acoustic wave device described above, the duty ratio of strips defining the electrodes is set such that the acoustic velocity of the SH type boundary acoustic wave is low as compared to that of a slow transverse wave propagating in the dielectric substance and to that of a slow transverse wave propagating in the piezoelectric substance.

In accordance with a third preferred embodiment of the present invention, a boundary acoustic wave device includes a piezoelectric substance primarily composed of LiNbO$_3$, a dielectric substance laminated on one surface of the piezoelectric substance, and electrodes disposed at a boundary between the piezoelectric substance and the dielectric substance, in which the boundary acoustic wave device uses an SH type boundary acoustic wave propagating along the boundary. In the boundary acoustic wave device described above, $\phi$ of Euler angles ($\phi$, $\theta$, $\psi$) of the piezoelectric substance primarily composed of LiNbO$_3$ is in the range of about −31° to about +31°, and $\theta$ and $\psi$ are in a region surrounded by points A01 to A13 in Table 1 below.

TABLE 1

| POINT | $\psi(°)$ | $\theta(°)$ |
|---|---|---|
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |
| A13 | 0 | 116 |

In the boundary acoustic wave device according to the third preferred embodiment of the present invention, $\theta$ and $\psi$ of the Euler angles are in a region surrounded by points D01 to D07 in Table 2 below.

TABLE 2

| POINT | $\psi(°)$ | $\theta(°)$ |
|---|---|---|
| D01 | 0 | 126 |
| D02 | 13 | 123 |
| D03 | 25 | 112 |
| D04 | 30 | 96 |
| D05 | 29 | 80 |
| D06 | 0 | 80 |
| D07 | 0 | 126 |

In the boundary acoustic wave device according to the third preferred embodiment of the present invention, the thickness of the electrodes is set such that the acoustic velocity of the SH type boundary acoustic wave is low as compared to that of a slow transverse wave propagating in the dielectric substance and to that of a slow transverse wave propagating in the piezoelectric substance.

According to the third preferred embodiment of the present invention, the duty ratio of strips defining the electrodes is set such that the acoustic velocity of the SH type boundary acoustic wave is low as compared to that of a slow transverse wave propagating in the dielectric substance and to that of a slow transverse wave propagating in the piezoelectric substance.

In accordance with a fourth preferred embodiment of the present invention, a boundary acoustic wave device includes a piezoelectric substance primarily composed of LiNbO$_3$, a dielectric substance laminated on one surface of the piezoelectric substance and primarily composed of SiO$_2$, and electrodes disposed at a boundary between the piezoelectric substance and the dielectric substance. In the boundary acoustic wave device described above, when the density of the electrodes, the thickness of the electrodes, and the wavelength of a boundary acoustic wave are represented by $\rho$ (kg/m$^3$), H ($\lambda$), and $\lambda$, respectively, $H > 8{,}261.744\rho^{1.376}$ holds, and Euler angles of the piezoelectric substance are in the range of (0°, 90°, 0°) to (0°, 90°, 38°), (0°, 90°, 142°) to (0°, 90°, 180°), (90°, 90°, 0°) to (90°, 90°, 36°), (90°, 90°, 140°) to (90°, 90°, 180°), (0°, 55°, 0°) to (0°, 134°, 0°), (90°, 51°, 0°) to (90°, 129°, 0°), or (0°, 90°, 0°) to (180°, 90°, 0°).

According to the fourth preferred embodiment of the present invention, the Euler angles of the piezoelectric substance are equivalent to Euler angles represented by the following equation (A) at which boundary acoustic wave properties are obtained which are substantially equivalent to those of the piezoelectric substance.

$$F(\phi, \theta, \psi) = F(60° - \phi, -\theta, \psi) \quad \text{Equation (A)}$$
$$= F(60° + \phi, -\theta, 180° - \psi)$$
$$= F(\phi, 180° + \theta, 180° - \psi)$$
$$= F(\phi, \theta, 180° + \psi)$$

In accordance with a fifth preferred embodiment of the present invention, a boundary acoustic wave device includes a piezoelectric substance primarily composed of $LiNbO_3$, a dielectric substance laminated on one surface of the piezoelectric substance and primarily composed of $SiO_2$, and electrodes disposed at a boundary between the piezoelectric substance and the dielectric substance, in which the boundary acoustic wave device uses an SH type boundary acoustic wave propagating along the boundary. In the boundary acoustic wave device described above, when the density of the electrodes, the thickness of the electrodes, and the wavelength of the boundary acoustic wave are represented by $\rho$ ($kg/m^3$), H ($\lambda$), and $\lambda$, respectively, $H > 8,261.744\rho^{-1.376}$.

In the boundary acoustic wave device according to one of the third to the fifth preferred embodiments, the density $\rho$ of the electrodes is preferably more than about 3,745 $kg/m^3$.

In the boundary acoustic wave device according to one of the third to the fifth preferred embodiments, the thickness H of the electrodes satisfies the following equation (1).

$$33,000.39050\rho^{-1.50232} < H < 88,818.90913\rho^{-1.54998} \quad \text{Equation (1)}$$

In accordance with a sixth preferred embodiment of the present invention, a boundary acoustic wave device is provided which includes a boundary acoustic-wave propagation structure in which an SH type boundary acoustic wave and a Stoneley wave propagate. In the boundary acoustic wave device described above, the acoustic velocity of the SH type boundary acoustic wave is low as compared to that of slow transverse waves of two media forming a boundary, and the acoustic velocity of the Stoneley wave is high as compared to that of at least one of the slow transverse waves of the two media.

According to one of the first to the sixth preferred embodiments of the present invention, each of the electrodes preferably primarily include an electrode layer which is composed of at least one selected from the group consisting of Au, Ag, Cu, Al, Fe, Ni, W, Ta, Pt, Mo, Cr, Ti, ZnO, ITO, and an alloy primarily containing at least one of the above conductive materials.

In addition, besides the electrode layer, the electrodes may each further include at least one second electrode layer including a conductive material other than the conductive materials forming the electrode layer.

In the boundary acoustic wave device according to the first preferred embodiment, the piezoelectric substance, the dielectric substance laminated on one surface of the piezoelectric substance, and the electrodes disposed at the boundary between the piezoelectric substance and the dielectric substance are provided, and the thickness of the electrodes is set such that the acoustic velocity of the SH type boundary acoustic wave is low as compared to that of a slow transverse wave propagating in the dielectric substance and to that of a slow transverse wave propagating in the piezoelectric substance.

In addition, according to the second preferred embodiment of the present invention, the piezoelectric substance, the dielectric substance laminated on one surface of the piezoelectric substance, and the electrodes disposed at the boundary between the piezoelectric substance and the dielectric substance are provided, and the duty ratio of the strips forming the electrodes is set such that the acoustic velocity of the SH type boundary acoustic wave is low as compared to that of a slow transverse wave propagating in the dielectric substance and to that of a slow transverse wave propagating in the piezoelectric substance.

According to the first and the second preferred embodiments of the present invention, since the thickness of the electrodes or the duty ratio of the sprits is set as described above, an SH type boundary acoustic wave device is provided in which the SH type boundary acoustic wave propagates in the dielectric substance and in the piezoelectric substance.

In the boundary acoustic wave device according to the third preferred embodiment of the present invention, since the piezoelectric substance primarily composed of $LiNbO_3$ is used, $\phi$ of the Euler angles ($\phi$, $\theta$, $\psi$) of the $LiNbO_3$ is in the range of $-31°$ to $+31°$, and $\theta$ and $\psi$ are in the region surrounded by the points A01 to A13 in Table 1 described above, the spurious response caused by the Stoneley wave is effectively suppressed, and the electromechanical coefficient $k^2$ of the SH type boundary acoustic wave is increased.

In particular, when $\theta$ and $\psi$ of the Euler angles are in the region surrounded by the points D01 to D07 in Table 2, the electromechanical coefficient $k^2$ of the SH type boundary acoustic wave is increased to about 10% or more.

In addition, in the boundary acoustic wave device according to the third preferred embodiment of the present invention, when the thickness of the electrodes is set such that the acoustic velocity of the SH type boundary acoustic wave is low as compared to that of a slow transverse wave propagating in the dielectric substance and to that of a slow transverse wave propagating in the piezoelectric substance, or when the duty ratio of the strips forming the electrodes is set such that the acoustic velocity of the SH type boundary acoustic wave is low as compared to that of a slow transverse wave propagating in the dielectric substance and to that of a slow transverse wave propagating in the piezoelectric substance, an SH type boundary acoustic wave device is provided in which the SH type boundary acoustic wave reliably propagates along the boundary between the dielectric substance and the piezoelectric substance.

According to the boundary acoustic wave device of the fourth preferred embodiment of the present invention, in the structure in which the dielectric substance primarily composed of $SiO_2$ is laminated on one surface of the piezoelectric substance primarily composed of $LiNbO_3$, and in which the electrodes are disposed at the boundary between the piezoelectric substance and the dielectric substance, since $H > 8,261.744\rho^{-1.376}$ is maintained, and the Euler angles of the piezoelectric substance are in the specific region described above, a boundary acoustic wave device is provided which uses a boundary acoustic wave and which has a large electromechanical coefficient.

In addition, in the boundary acoustic wave device of the fourth preferred embodiment of the present invention, the Euler angles of the piezoelectric substance described above may be substituted for Euler angles represented by the equation (A) at which boundary acoustic wave properties are substantially equivalent to those of the piezoelectric substance.

According to the fifth preferred embodiment of the present invention, since the piezoelectric substance primarily composed of $LiNbO_3$, the dielectric substance laminated on one surface of the piezoelectric substance and primarily composed of $SiO_2$, and the electrodes disposed at the boundary between the piezoelectric substance and the dielectric substance are provided, and when the density of the electrodes, the thickness of the electrodes, and the wavelength of the boundary acoustic wave are represented by $\rho$ ($kg/m^3$), H ($\lambda$), and $\lambda$, respectively, since $H > 8,261.744\rho^{-1.376}$ is maintained, a boundary acoustic wave device is provided which can propagate the SH type boundary acoustic wave while the spurious response caused by the Stoneley wave is effectively suppressed.

In addition, according to the third to the fifth preferred embodiments of the present invention, when the density $\rho$ is more than about 3,745 $kg/m^3$, the thickness of the electrodes at which the propagation loss is 0 is decreased. Hence, the electrodes are easily formed.

Furthermore, when the electrode thickness H satisfies the above equation (1), the temperature coefficient of frequency TCF of the SH type boundary acoustic wave is decreased to about ±20 ppm or less.

According to the sixth preferred embodiment of the present invention, in the boundary acoustic wave device having the boundary acoustic-wave propagation structure in which the SH type boundary acoustic wave and the Stoneley wave propagate, since the acoustic velocity of the SH type boundary acoustic wave is low as compared to that of slow transverse waves of two media forming a boundary, and the acoustic velocity of the Stoneley wave is high as compared to that of at least one of the slow transverse waves of the two media, the propagation loss of the Stoneley wave is degraded, thereby the spurious response caused by the Stoneley wave is suppressed, and as a result, frequency properties of a boundary acoustic wave device using the SH type boundary acoustic wave are improved.

In the present invention, when each of the electrodes each primarily include electrode an layer which is composed of at least one selected from the group consisting of Au, Ag, Cu, Al, Fe, Ni, W, Ta, Pt, Mo, Cr, Ti, ZnO, ITO, and an alloy primarily including at least one of the above metals, a boundary acoustic wave device using the SH type boundary acoustic wave is provided according to preferred embodiments of the present invention. In addition, when the electrodes each further include at least one second electrode layer composed of a metal other than the metals forming the electrode layer, by selecting a metal material forming the second electrode layer, the adhesion between the electrodes and the dielectric substance or the piezoelectric substance is improved, or electric power resistance is improved.

These and other features, elements, characteristics and advantages of the present invention will become more apparent from the following detailed description of preferred embodiments of the present invention with reference to the attached drawings.

DETAILED DESCRIPTION OF THE PREFERRED EMBODIMENTS

Figure 1:
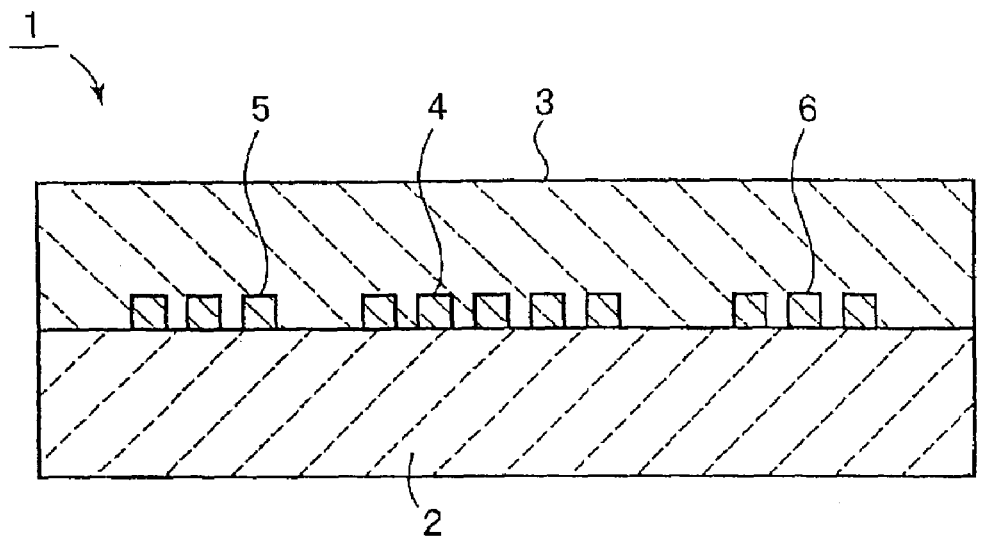
FIG. 1 is a front cross-sectional view of a boundary acoustic wave device according to a preferred embodiment of the present invention.

Hereinafter, particular examples of the present invention will be described with reference to the figures.

When a boundary acoustic wave is propagated between two solid layers, conditions must be satisfied such that energy of the boundary acoustic wave is concentrated between the solid layers. In this case, as described above, in "Investigation of Piezoelectric SH Type Boundary Acoustic Wave", Technical Report, The Institute of Electronics, Information and Communication Engineers, Vol. 96, No. 249 (US96 45-53) PAGE. 21 to 26, 1966, a method is disclosed in which materials are selected such that the acoustic velocity of the transverse wave of the isotropic substance and that of the BGSW substrate are close to each other, the density ratio therebetween is small, and the piezoelectric properties are strong.

In general, when a high velocity region and a low velocity region are provided, the wave concentrates at the region in which the acoustic velocity is low and propagates therethrough. Accordingly, the inventor of the present invention discovered that when the acoustic velocity of a boundary acoustic wave propagating between solid layers is decreased by increasing the thickness of electrodes using an electrode material made of a metal such as Au, which has a large density and low acoustic velocity, disposed between the two solid layers, the condition in which the energy is concentrated between the solid layers is satisfied.

Previously, three known types of bulk waves have been propagated in a solid substance, that is, a longitudinal wave, a fast transverse wave, and a slow transverse wave, and they are called a P wave, an SH wave, and an SV wave, respectively. Whether the SH wave or the SV wave becomes a slow transverse wave is determined by the anisotropic properties of a base material. Among the three types of bulk waves described above, the bulk wave having the lowest acoustic velocity is the slow transverse wave. When the solid substance is an isotropic substance such as SiO₂, only one type of transverse wave propagates therethrough, and this transverse wave is a slow transverse wave.

In addition, in a boundary acoustic wave propagating in an anisotropic base material such as a piezoelectric substrate, in most cases, three displacement components of the P wave, the SH wave, and the SV wave propagate while being coupled, and the type of boundary acoustic wave is determined by the primary component. For example, the Stoneley wave is a boundary acoustic wave primarily composed of the P wave and the SV wave, and the SH type boundary acoustic wave is a boundary acoustic wave primarily composed of the SH component. In addition, depending on the conditions, the SH wave component and the P wave or the SV wave component may propagate in some cases without being coupled therebetween.

In the boundary acoustic wave, since the three displacement components described above propagate while being coupled, for example, in a boundary acoustic wave having an acoustic velocity faster than the SH wave, the SH component and the SV component leak, and in a boundary acoustic wave having an acoustic velocity faster than the SV wave, the SV component leaks. This leaky-wave component causes propagation loss of the boundary acoustic wave.

Accordingly, when the acoustic velocity of the SH type boundary acoustic wave is decreased to less than that of two slow transverse waves of two solid layers, energy of the SH type boundary acoustic wave can be concentrated around electrodes disposed between the two solid layers, and an SH type boundary acoustic wave having a large electromechanical coefficient k² is propagated. As a result, a condition is obtained in which the propagation loss is 0. The present invention was made developed based on this discovery.

In addition, when at least one of the solid layers is made of a piezoelectric substance, and the other solid layer is made of a dielectric substance including a piezoelectric substance, the SH type boundary acoustic wave is excited by electrodes disposed between the solid layers. According to the knowledge of the inventor of the present invention, when a piezoelectric substance is used as the dielectric substance, and a film of the piezoelectric substance formed using an inexpensive film forming method such as sputtering or CVD, the piezoelectric constant of the piezoelectric substance becomes unstable, and unnecessary spurious responses are generated. Thus, a material having no piezoelectric properties is preferably used as the dielectric substance.

FIG. 1 is a schematic front cross-sectional view of a boundary acoustic wave device according to one preferred embodiment of the present invention. In a boundary acoustic wave device 1, on the upper surface of a plate shaped piezoelectric substance 2, a dielectric substance 3 is provided. At the boundary between the piezoelectric substance 2 and the dielectric substance 3, an IDT 4 and reflectors 5 and 6 are provided as electrodes. The reflectors 5 and 6 are disposed on both sides of the IDT 4 along a propagation direction of a surface acoustic wave, and with this arrangement, a boundary acoustic wave resonator is provided in this preferred embodiment.

In the boundary acoustic wave device 1 of this preferred embodiment, the thickness of the IDT 4 and that of the reflectors 5 and 6 are increased such that the acoustic velocity of the SH type boundary acoustic wave is low as compared to that of a slow transverse wave propagating in the dielectric substance 3 and that of a slow transverse wave propagating in the piezoelectric substance 2.

In this preferred embodiment, since the thickness of the electrodes is increased, and thereby the acoustic velocity of the SH type boundary acoustic wave is decreased to less than that of the respective slow transverse waves propagating in the piezoelectric substance 2 and the dielectric substance 3, the energy of the SH type boundary acoustic wave is concentrated at the boundary between the piezoelectric substance 2 and the dielectric substance 3. Hence, an SH type boundary acoustic wave having a large electromechanical coefficient $k^2$ is propagated with a small propagation loss.

In addition to the propagation of the SH type boundary acoustic wave by increasing the thickness of the electrodes, by controlling the duty ratio of strips defining the electrodes as described below, the acoustic velocity of the SH type boundary acoustic wave is decreased to less than that of the respective slow transverse waves propagating in the piezoelectric substance 2 and the dielectric substance 3, and thereby the SH type boundary acoustic wave is concentrated at the boundary and can be propagated therethrough.

Hereinafter, with reference to particular examples, preferred embodiments of the present invention will be described in more detail.

Example 1

As the piezoelectric substance 2, a LiNbO$_3$ substrate having Euler angles (0°, 90°, 0°), that is, a Y plate X propagating LiTaO$_3$ substrate was prepared. By using the LiNbO$_3$ substrate, superior piezoelectric properties are obtained. In addition, as a material for the dielectric substance 3, SiO$_2$ was used. A thin film is easily formed of SiO$_2$, and since SiO$_2$ has a positive temperature coefficient of frequency TCF which offsets a negative TCF of the LiNbO$_3$, SiO$_2$ improves the temperature properties.

By using various electrode materials having different densities, the electrodes were formed between the piezoelectric substance 2 and the dielectric substance 3, and the relationship of the electrode thickness with the acoustic velocity V, the electromechanical coefficient $k^2$, the propagation loss α, the temperature coefficient of frequency TCF, and the power flow angle PFA were measured. The results are shown in FIGS. 2 to 6.

The results shown in FIGS. 2 to 6 were obtained by calculations based on a method disclosed in "A method for estimating optimal cuts and propagation directions for excitation and propagation directions for excitation of piezoelectric surface waves" (J. J. Campbell, and W. R Jones, IEEE Trans. Sonics and Ultrason., Vol. SU-15 (1968) pp. 209 to 217).

In the case of a free boundary, the displacement, the potential, the normal line component of an electric flux density, and the stress in the up and down direction at the respective boundaries between SiO$_2$ and Au and between Au and LiNbO$_3$ were regarded as being continuous, the thicknesses of SiO$_2$ and LiNbO$_3$ were regarded as infinite, and the relative dielectric constant of Au was regarded as 1, such that the acoustic velocity and the propagation loss were obtained. In addition, in the case of a short-circuit boundary, the potentials at the respective boundaries between SiO$_2$ and Au and between Au and LiNbO$_3$ were regarded as 0. In addition, the electromechanical coefficient $k^2$ was obtained by the following equation (2).

$$k^2 = 2 \times |Vf - V|/Vf \qquad \text{Equation (2)}$$

In equation (2), Vf indicates the acoustic velocity of the free boundary.

The temperature coefficient of frequency TCF was obtained from phase velocities V at 20° C., 25° C., and 30° C. by the following equation (3).

$$TCF = V^{-1}(25° C.) \times [(V(30° C.) - V(20° C.))/10° C.] - \alpha s \qquad \text{Equation (3)}$$

In equation (3), αs is the coefficient of thermal expansion of the LiNbO$_3$ substrate in the direction of boundary acoustic wave propagation.

In addition, the power flow angle PFA at optional Euler angles (φ, 0, ψ) was obtained from the phase velocities at angles of ψ−0.5°, ψ, ψ+0.5° by the following equation (4).

$$PFA = \tan^{-1}[V^{-1}(\psi) \times (V(\psi + 0.5°) - V(\psi - 0.5°))] \qquad \text{Equation (4)}$$

The acoustic velocities of a longitudinal wave, a fast transverse wave, and a slow transverse wave in the Y plate X propagating LiTaO$_3$ substrate are 6,547, 4,752, and 4,031 m/second, respectively. In addition, the acoustic velocities of a longitudinal wave and a slow transverse wave of SiO$_2$ are 5,960 and 3,757 m/second, respectively.

Figure 2:
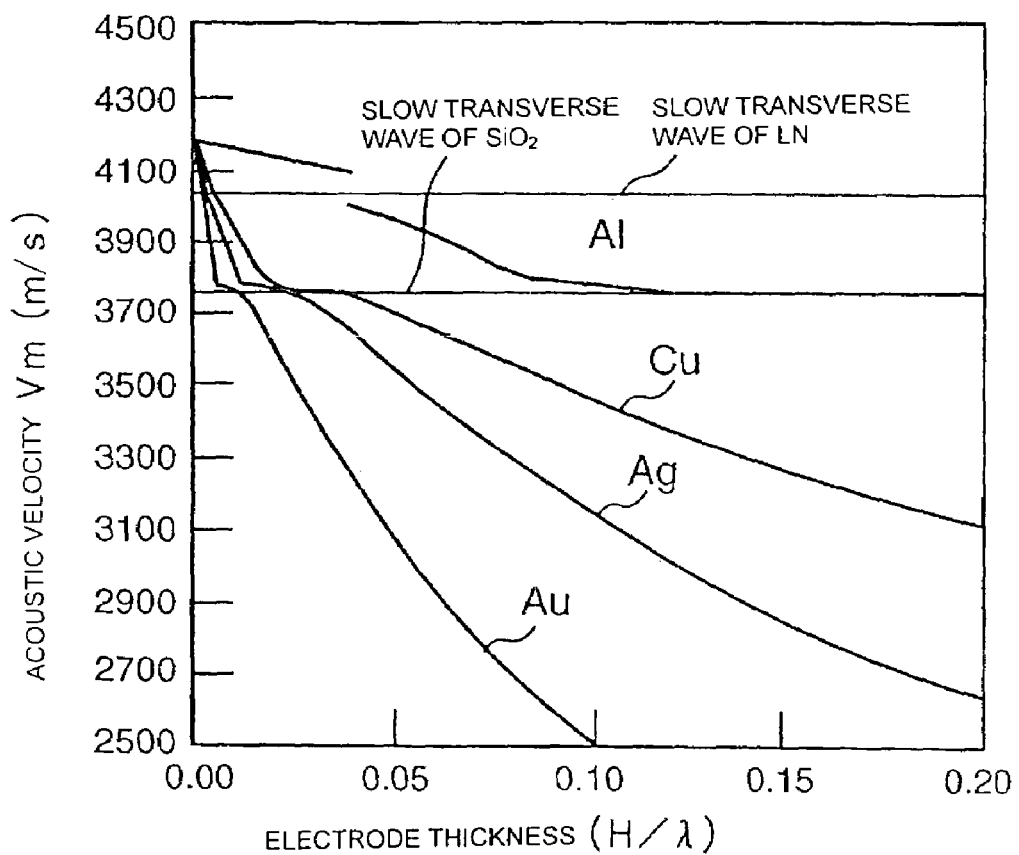
FIG. 2 is a graph showing the relationship between the acoustic velocity V and the thickness H/$\lambda$ of an electrode, which is obtained when electrodes are each formed between a piezoelectric substance and a dielectric substance using electrode materials having different densities.
Figure 3:
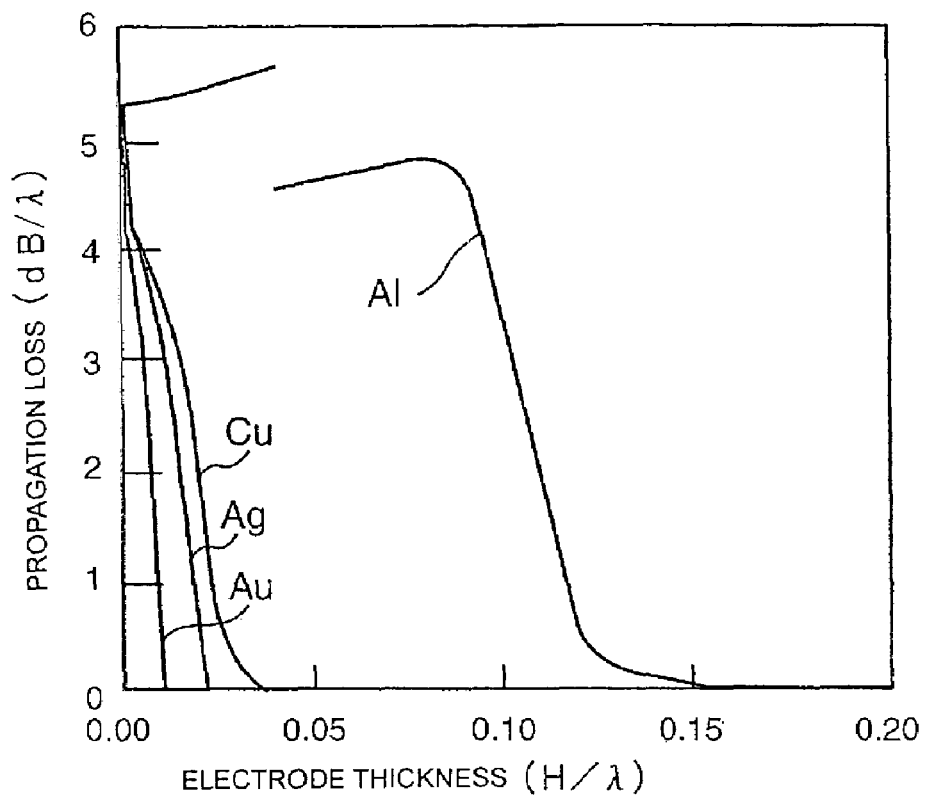
FIG. 3 is a graph showing the relationship between the propagation loss $\alpha$ and the thickness H/$\lambda$ of an electrode, which is obtained when electrodes are each formed between a piezoelectric substance and a dielectric substance using electrode materials having different densities.

According to the graphs shown in FIGS. 2 and 3, it is understood that, with any type of electrode materials, at the thickness at which the acoustic velocity of the SH type boundary acoustic wave becomes 3,757 m/second or less which is the lowest velocity among the longitudinal wave, fast transverse wave, and slow transverse waves, the propagation loss α of the SH type boundary acoustic wave is 0.

Figure 7:
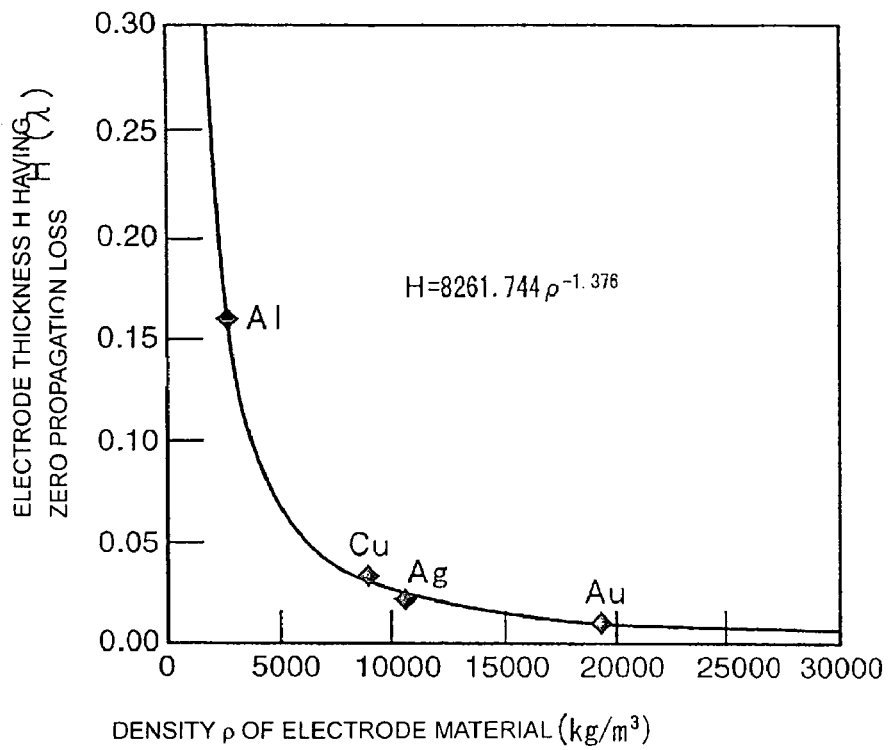
FIG. 7 is a graph showing the relationship between the density $\rho$ of an electrode material and the electrode thickness H ($\lambda$) at which the propagation loss is 0.

FIG. 7 is a graph showing the relationship between the density ρ of the electrode material and the electrode thickness H at which the propagation loss of the SH type boundary acoustic wave is 0. As can be seen from FIG. 7, it is understood that when the following equation (5) is maintained, an SH type boundary acoustic wave having a propagation loss α of 0 is obtained.

$$H(\lambda) > 8{,}261.744\rho^{-1.376} \qquad \text{Equation (5)}$$

In addition, when this type of boundary acoustic wave device is manufactured, electrodes such as an IDT are formed on a piezoelectric substrate made of LiNbO$_3$, or other suitable piezoelectric material by a photolithographic method including lift-off, dry etching or other suitable photolithographic method, and on the electrodes thus formed, a dielectric film made of SiO2 or other suitable material is formed by a deposition method such as sputtering, evaporation, or CVD. Thus, due to irregularities caused by the thickness of the IDT, the dielectric film may be obliquely grown or the quality thereof may become non-uniform in some cases. As a result, the properties of the boundary acoustic wave device may be degraded in some cases. In order to avoid the degradation of the properties described above, the thickness of the electrodes is preferably decreased to as small as possible.

According to research performed by the inventors of the present invention, when the film thickness H of the electrode material for the IDT is at least about 0.1λ, by the irregularities thereof, it is very difficult to form a dielectric thin film having superior quality, and thus, the electrode thickness is preferably decreased to about 0.1λ or less. Accordingly, as shown in FIG. 7, when an electrode material having a density ρ of at least about 3,745 kg/m$^3$ is used, the electrode thickness H at which the propagation loss is 0 can be decreased to about 0.1λ.

Figure 4:
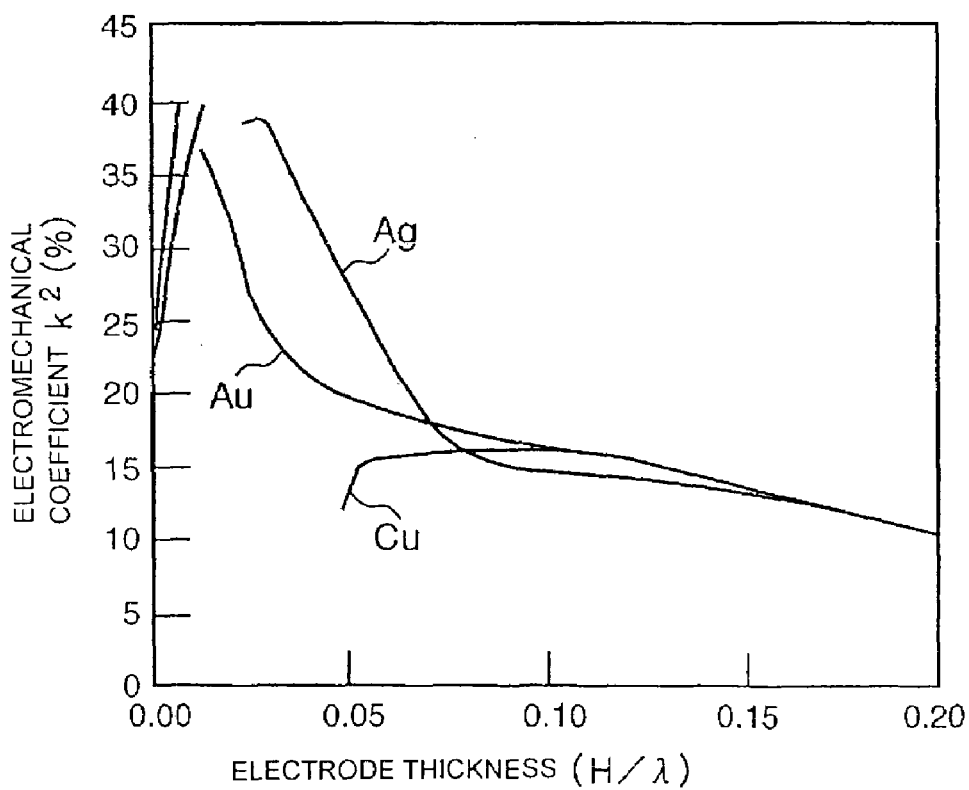
FIG. 4 is a graph showing the relationship between the electromechanical coefficient $k^2$ and the thickness H/$\lambda$ of an electrode, which is obtained when electrodes are each formed between a piezoelectric substance and a dielectric substance using electrode materials having different densities.

In addition, as shown in FIG. 4, at the electrode thickness at which the above equation (5) is maintained, the electromechanical coefficient $k^2$ is large, such as about 10% to about 38%, and thus, a boundary acoustic wave device having a broad band and a low loss is obtained.

Figure 5:
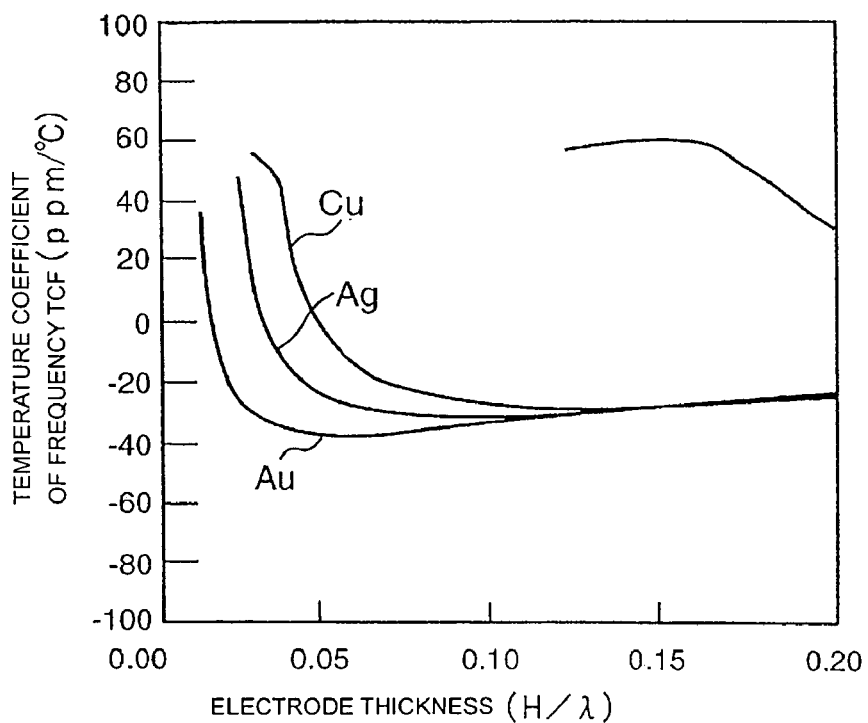
FIG. 5 is a graph showing the relationship between the temperature coefficient of frequency TCF and the thickness H/$\lambda$ of an electrode, which is obtained when electrodes are each formed between a piezoelectric substance and a dielectric substance using electrode materials having different densities.

In addition, as shown in FIG. 5, the temperature coefficient of frequency TCF is in the range of about −40 to about +40 ppm/° C. under most conditions, and that by adjustment of the electrode thickness, TCF is decreased to about ±20 ppm/° C. or less and to about ±10 ppm/° C. or less and may be further decreased to about ±0 ppm/° C. or less.

Figure 8:
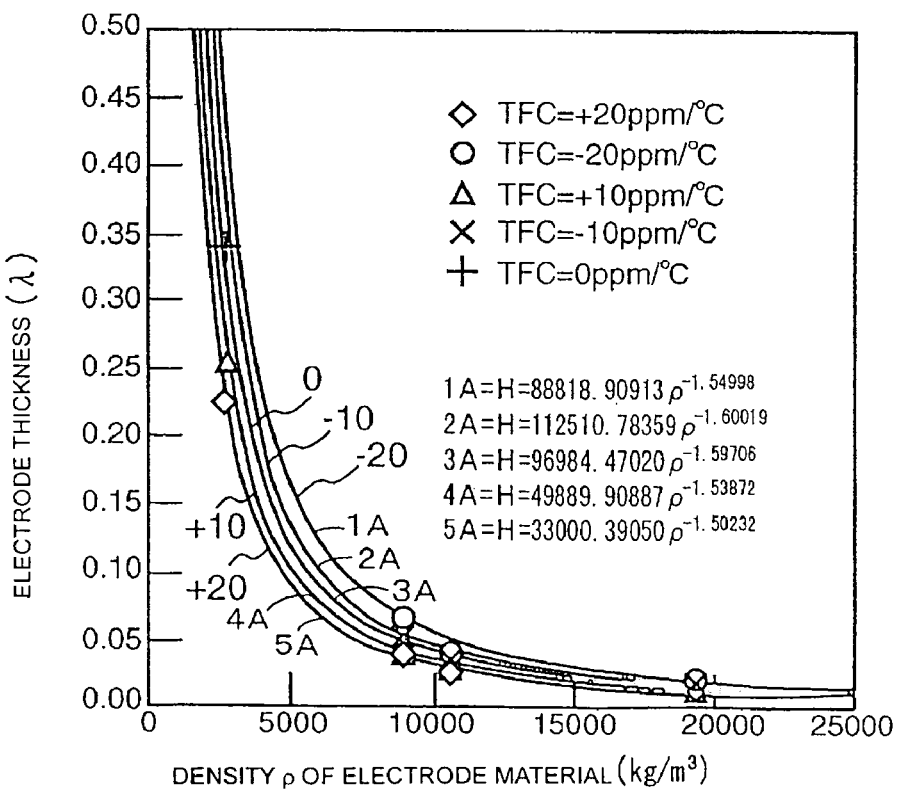
FIG. 8 is a graph showing the relationship between the density $\rho$ of an electrode material and the electrode thickness H ($\lambda$) at which TCF is −20, −10, 0, +10, and +20 ppm/° C.

FIG. 8 is a view showing the relationship between the density ρ of the electrode material and the electrode thicknesses H at which TCFs of about −20, about −10, about 0, about −10 and about +20 ppm/° C. are obtained, the relationship is indicated by points and an approximation curve thereof. As shown in FIG. 8, an electrode thickness H having a preferable TCF in the range of about −20 to about +20 ppm/° C. is obtained when the following equation (6) is maintained, an electrode thickness H having a more preferable TCF in the range of about −10 to about +10 ppm/° C. is obtained when the following equation (7) is maintained, and an electrode thickness H having a most preferable TCF of about 0 ppm/° C. is obtained when the following equation (8) is maintained.

$$33{,}000.39050\rho^{-1.50232} < H < 88{,}818.90913\rho^{-1.54998} \quad \text{Equation (6)}$$

$$49{,}889.90887\rho^{-1.53872} < H < 112{,}510.78359\rho^{-1.60019} \quad \text{Equation (7)}$$

$$H = 96{,}984.47020\rho^{-1.59706} \quad \text{Equation (8)}$$

Figure 6:
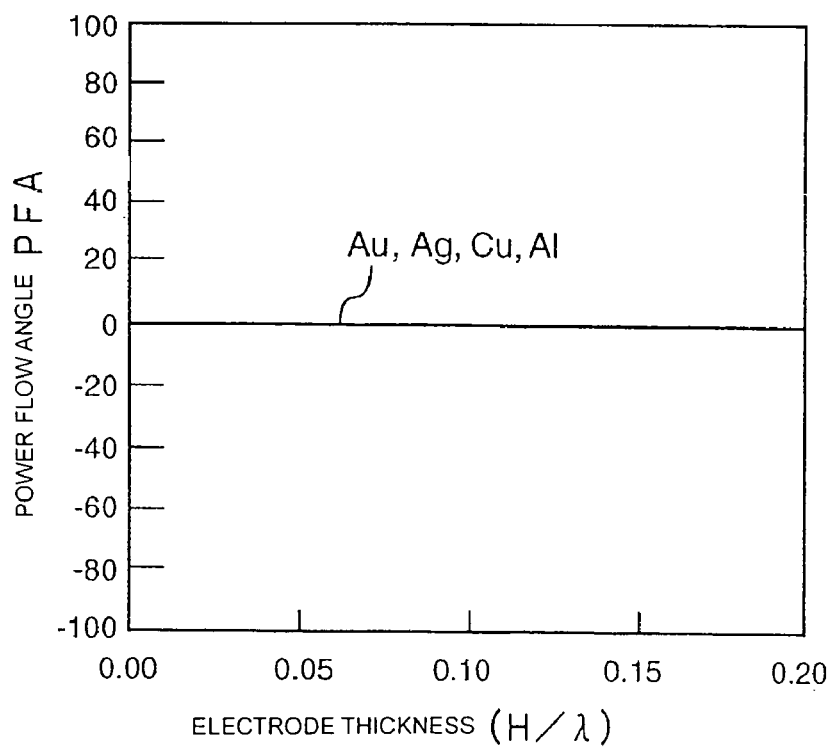
FIG. 6 is a graph showing the relationship between the power flow angle PFA and the thickness H/$\lambda$ of an electrode, which is obtained when electrodes are each formed between a piezoelectric substance and a dielectric substance using electrode materials having different densities.

In addition, as shown in FIG. 6, it is understood that the power flow angle PFA is advantageously about 0 at any film thickness H.

Example 2

Figure 9:
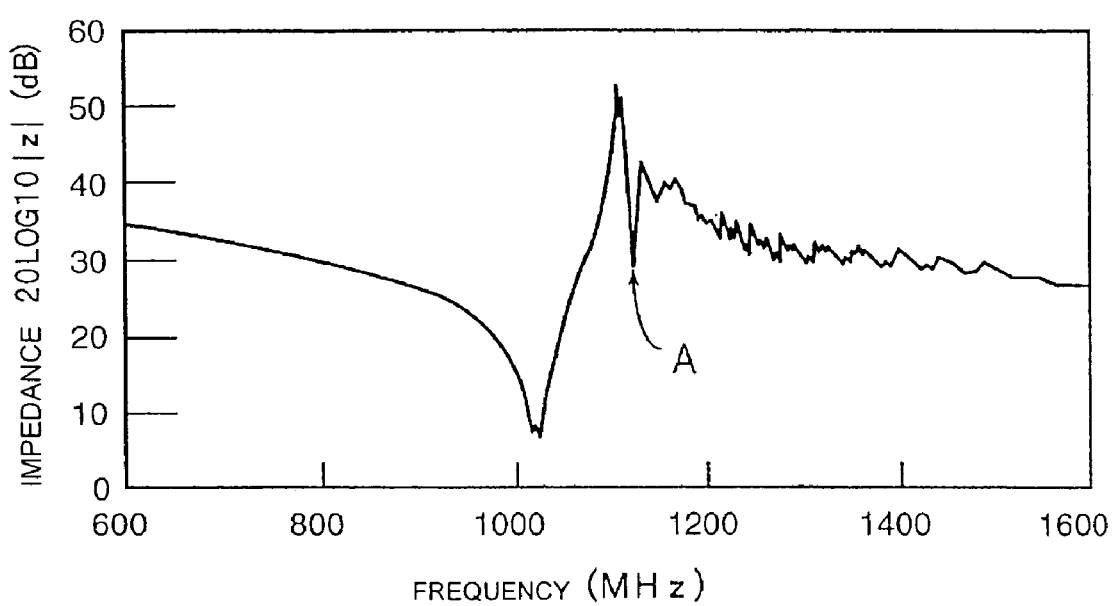
FIG. 9 is a graph showing the frequency properties of a boundary acoustic wave resonator experimentally formed in EXAMPLE 2.

Based on the results obtained in EXAMPLE 1 described above, a boundary acoustic wave resonator shown in FIG. 1 and having the structure shown in Table 3 below was experimentally formed. The frequency properties of the boundary acoustic wave resonator are shown in FIG. 9.

In order to increase the adhesion between Au and $LiNbO_3$, a Ti film having a thickness of about 0.006λ was formed between the Au and a piezoelectric substance made of the $LiNbO_3$.

TABLE 3

| ITEMS | DETAILS |
|---|---|
| STRUCTURE | $SiO_2$/Au/$LiNbO_3$ |
| $SiO_2$ THICKNESS | 7.5 λ |
| Au THICKNESS | 0.035 λ |
| IDT, REFLECTOR PERIOD λ | 3.2 μm |
| IDT CONFIGURATION | NORMAL TYPE SINGLE STRIP, 50 STRIPS, OPEN LENGTH OF 25 λ |
| REFLECTOR CONFIGURATION | NORMAL TYPE SINGLE STRIP, 40 STRIPS, OPEN LENGTH OF 25 λ |

In the boundary acoustic wave resonator described above, the impedance ratio, that is, the ratio of the impedance at an antiresonant point to that at a resonant point was about 45.6 dB, and the difference between the resonant frequency and the antiresonant frequency was about 8.1%. Thus, desirable results were obtained. In addition, the temperature coefficient of frequency TCF of the resonator was about 45 ppm/° C.

Accordingly, since desirable resonant properties are obtained with a small number of strips, such as 52 pairs of electrode fingers of the IDT and 40 strips of the reflectors, the reflection coefficient of the strips of the IDT and reflectors are high.

However, as shown in FIG. 9, a small spurious response indicated by an arrow A was observed around the antiresonant frequency. In an application in which propagation properties around the resonant frequency is used, for example, in a boundary acoustic wave trap circuit, the phenomenon described above may not cause any problem. However, for a ladder boundary acoustic wave filter or a longitudinal coupled resonator type boundary acoustic wave filter using propagation properties around the antiresonant frequency, the phenomenon described above may cause a problem in some cases. Accordingly, in order to increase the range of application of the SH type boundary acoustic wave device and to further improve the properties thereof, the above spurious response is preferably suppressed.

Example 3

The above spurious response generated around the antiresonant frequency in EXAMPLE 2 is a response of a Stoneley wave confined around the electrodes disposed at the boundary between $SiO_2$ and $LiNbO_3$ due to the increase in thickness of the electrodes as is the case with the SH type boundary acoustic wave. Since the acoustic velocity of the Stoneley wave is less than that of the SH type boundary acoustic wave, even when the electrode thickness is small as compared to that of the case of the SH type boundary acoustic wave, the Stoneley wave is present as a boundary acoustic wave.

For example, when a $SiO_2$ film having a sufficiently large thickness is formed on a Y-cut X propagating (represented by Euler angles (0°, 90°, 0°)) $LiNbO_3$ substrate such that the surface acoustic wave such as a Rayleigh wave or a first leaky wave is not excited, and Au electrodes are disposed between the $LiNbO_3$ substrate and the $SiO_2$ film, the SH type boundary acoustic wave has large attenuation and does not propagate unless the thickness of the Au electrode is at least about 0.0105λ. However, even when the thickness of the Au electrode approaches 0, although the attenuation thereof is not 0, the Stoneley wave may propagate.

Accordingly, in order to suppress the spurious response caused by the Stoneley wave, by using the calculation method of EXAMPLE 1, the relationship of the Euler angles of the $LiNbO_3$ substrate with the acoustic velocities V, the electromechanical coefficients $k^2$, the propagation losses α, the temperature coefficients of frequency TCF, and the power flow angles PFA of the Stoneley wave and the SH type boundary acoustic wave were measured, respectively.

As the structure used for this measurement, on a $LiNbO_3$ substrate, Au electrodes were formed, and a $SiO_2$ film was also formed. The thickness of the Au electrodes was set to about 0.07λ, and the Euler angles were set to (0°, 0°, ψ), (0°, 90°, ψ), (90°, 0°, ψ), (90°, 90°, ψ), (0°, θ, 0°), (0°, θ, 90°), (90°, θ, 0°), (90°, θ, 90°), (φ, 0°, 0°), (φ, 0°, 90°), (φ, 90°, 0°), and (φ, 90°, 90°), in which ψ, θ, φ were each in the range of 0° to 180°.

Figure 10:
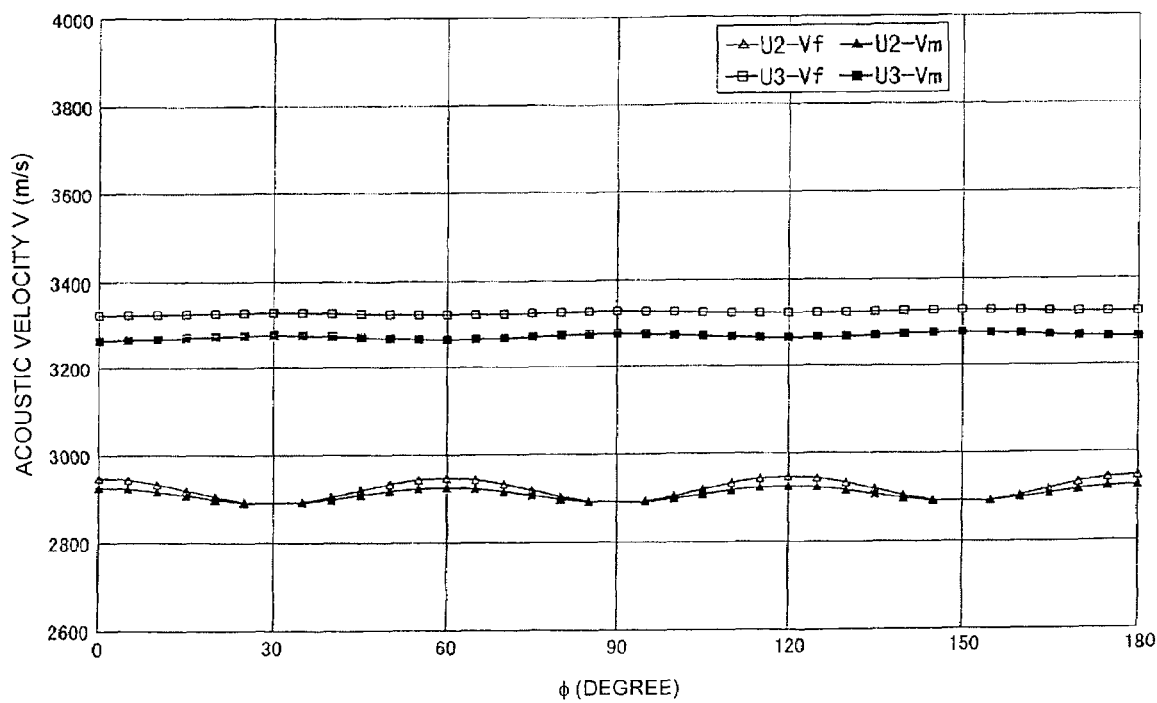
FIG. 10 is a graph showing the relationship between Euler angle $\phi$ and the acoustic velocity V in the structure in which Au electrodes are formed on a $LiNbO_3$ substrate having Euler angles ($\phi$, 0°, 0°) and a SiO2 film is formed.
Figure 11:
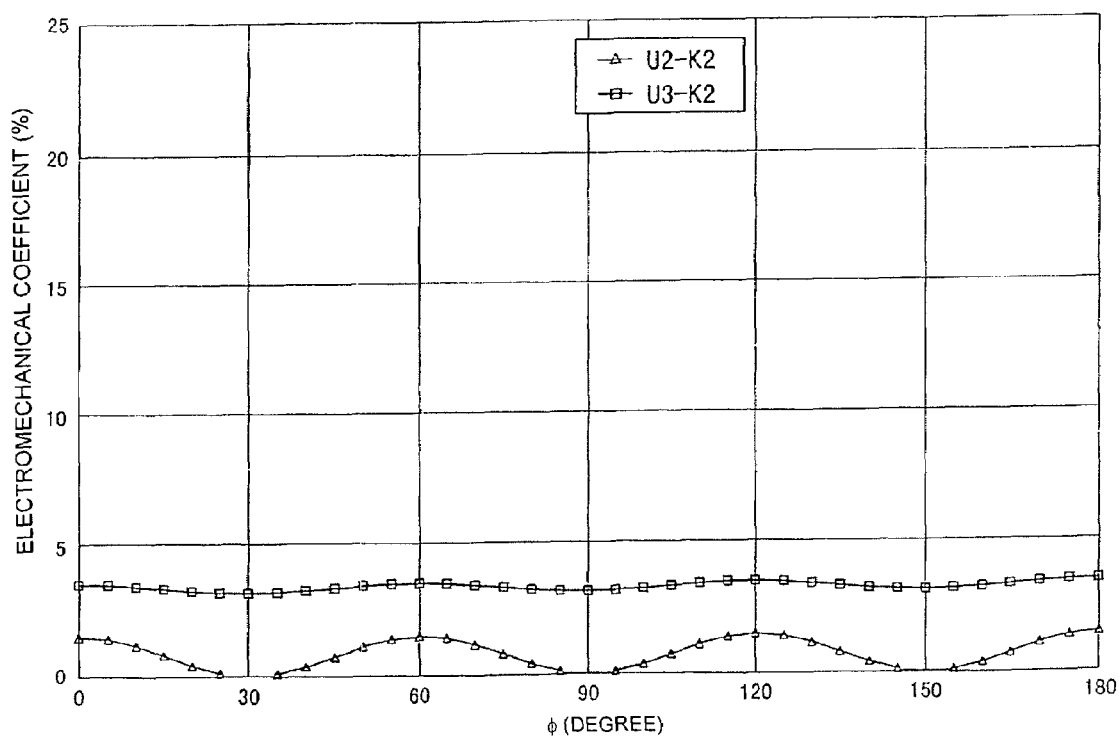
FIG. 11 is a graph showing the relationship between Euler angle $\phi$ and the electromechanical coefficient $k^2$ in the structure in which Au electrodes are formed on a $LiNbO_3$ substrate having Euler angles ($\phi$, 0°, 0°) and a SiO2 film is formed.
Figure 12:
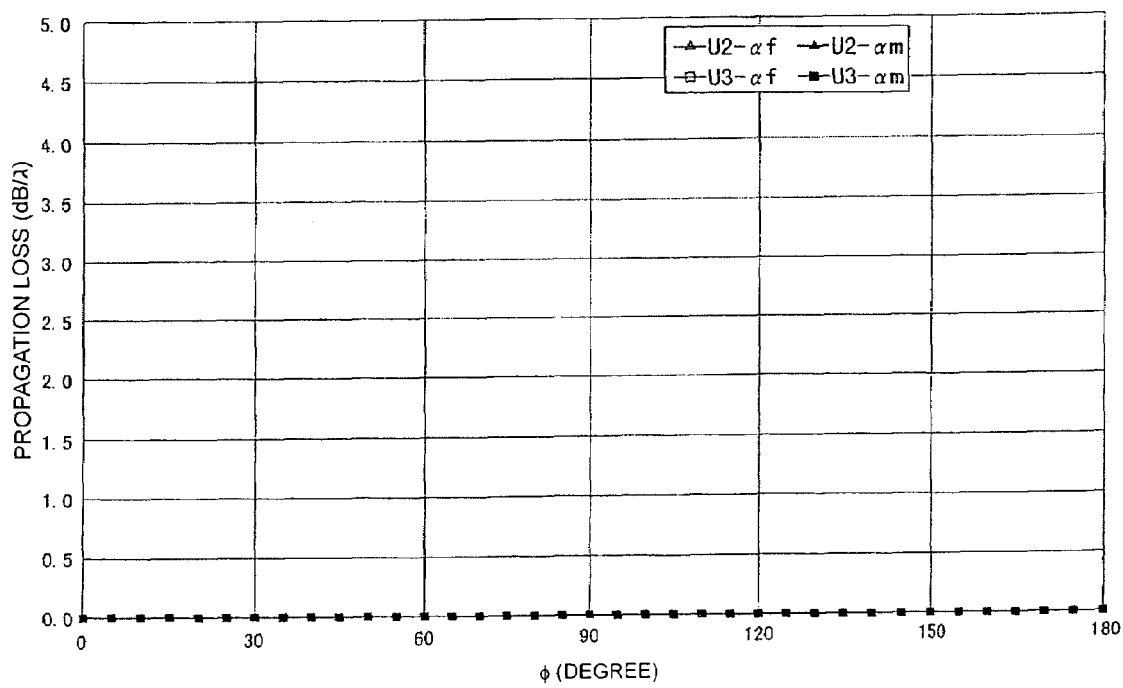
FIG. 12 is a graph showing the relationship between Euler angle $\phi$ and the propagation loss $\alpha$ in the structure in which Au electrodes are formed on a $LiNbO_3$ substrate having Euler angles ($\phi$, 0°, 0°) and a SiO2 film is formed.
Figure 13:
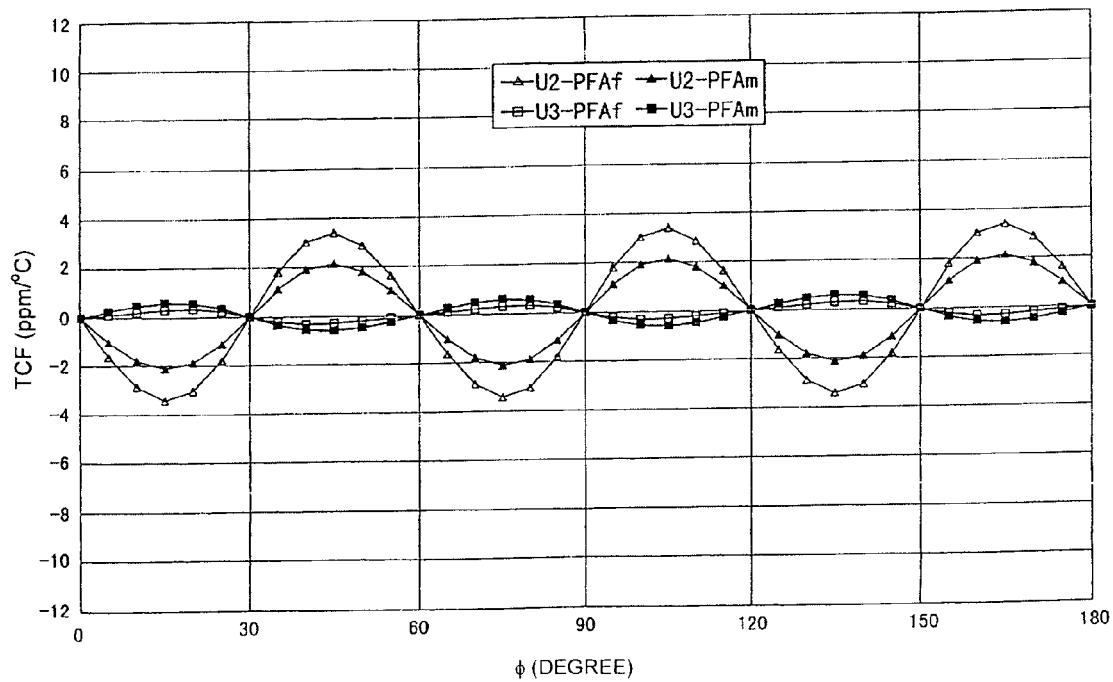
FIG. 13 is a graph showing the relationship between Euler angle $\phi$ and the temperature coefficient of frequency TCF in the structure in which Au electrodes are formed on a $LiNbO_3$ substrate having Euler angles ($\phi$, 0°, 0°) and a SiO2 film is formed.
Figure 14:
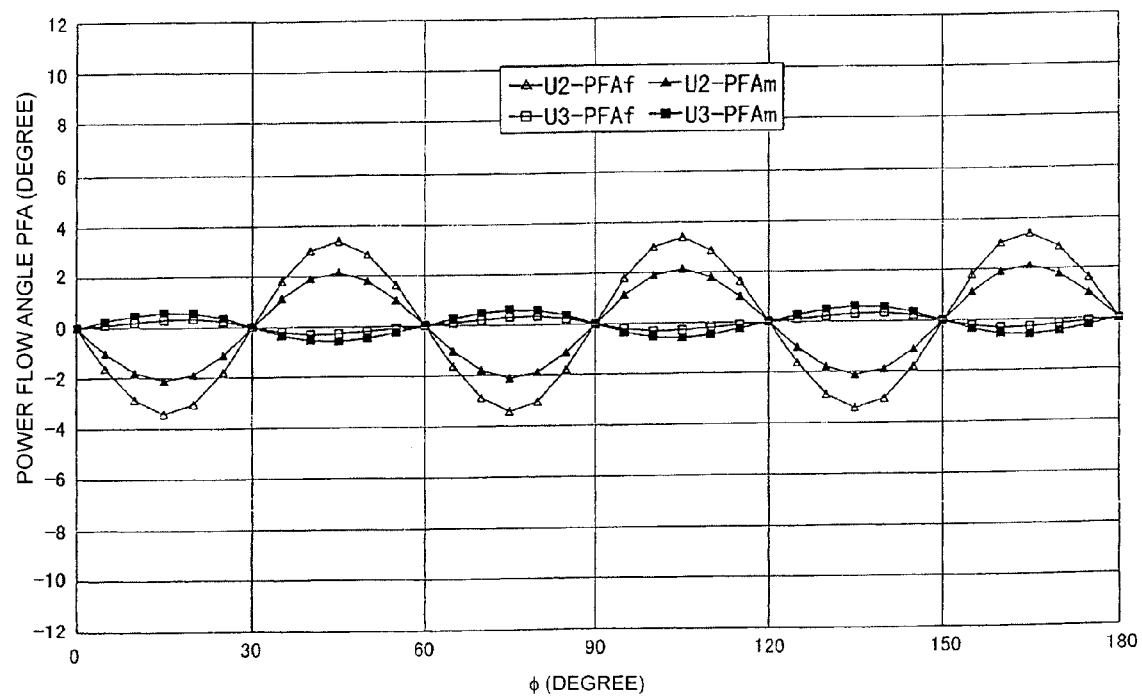
FIG. 14 is a graph showing the relationship between Euler angle $\phi$ and the power flow angle PFA in the structure in which Au electrodes are formed on a $LiNbO_3$ substrate having Euler angles ($\phi$, 0°, 0°) and a SiO2 film is formed.
Figure 15:
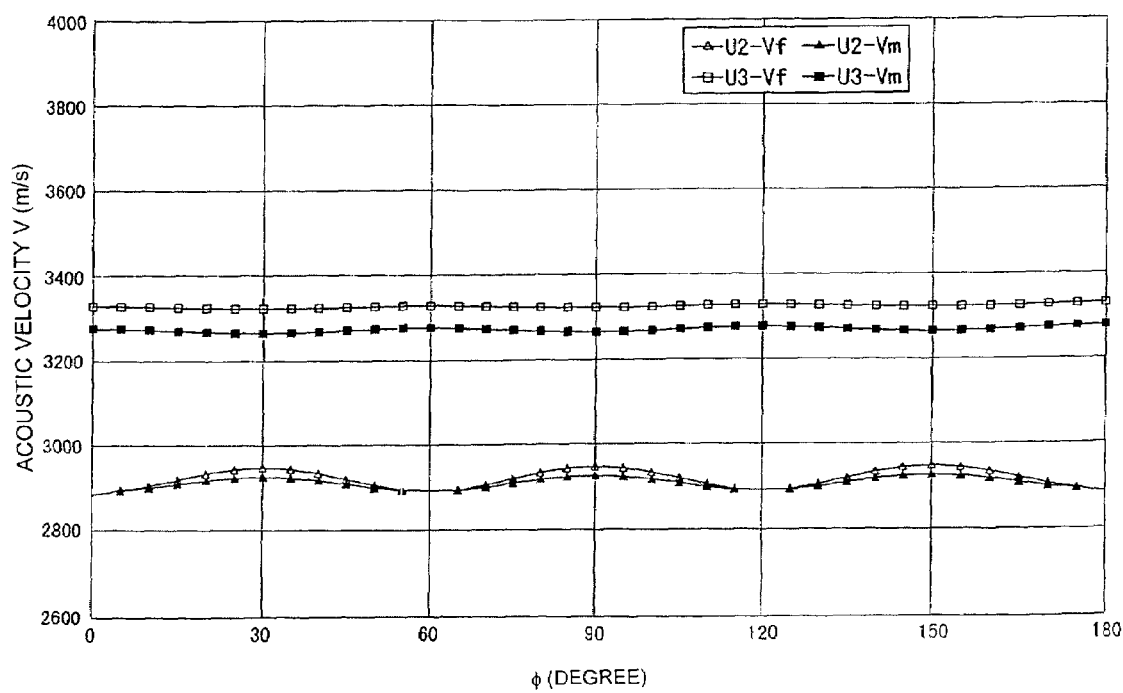
FIG. 15 is a graph showing the relationship between Euler angle $\phi$ and the acoustic velocity V in the structure in which Au electrodes are formed on a $LiNbO_3$ substrate having Euler angles ($\phi$, 0°, 90°) and a SiO2 film is formed.
Figure 16:
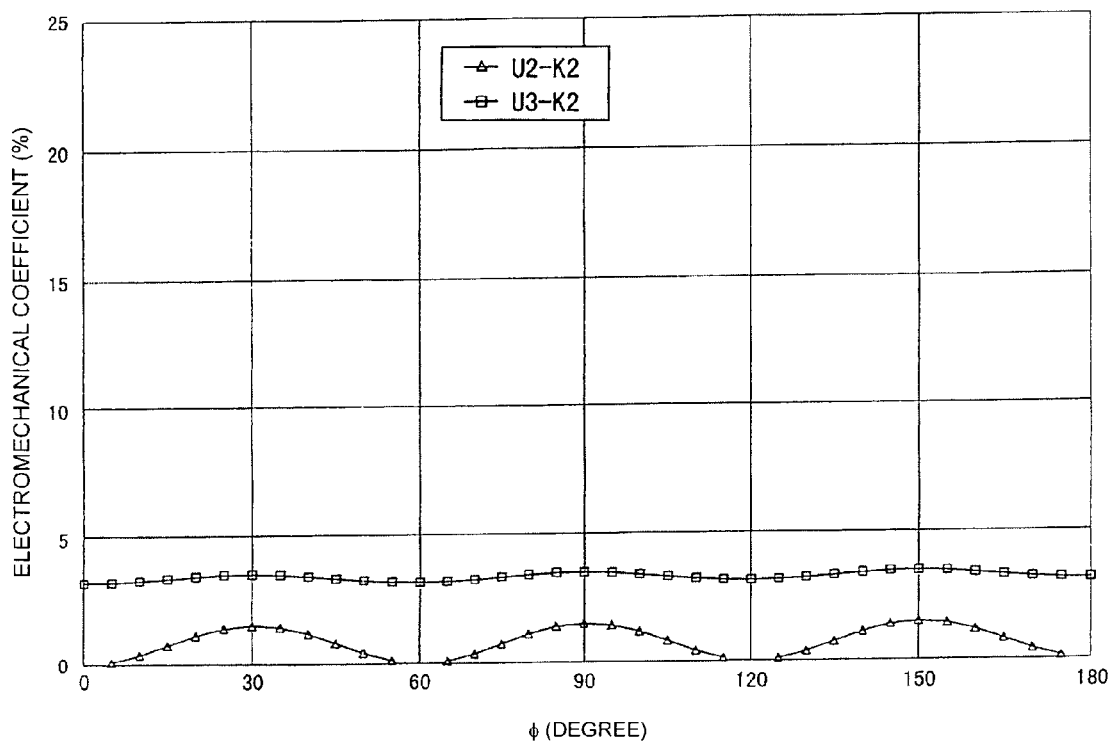
FIG. 16 is a graph showing the relationship between Euler angle $\phi$ and the electromechanical coefficient $k^2$ in the structure in which Au electrodes are formed on a $LiNbO_3$ substrate having Euler angles ($\phi$, 0°, 90°) and a SiO2 film is formed.
Figure 17:
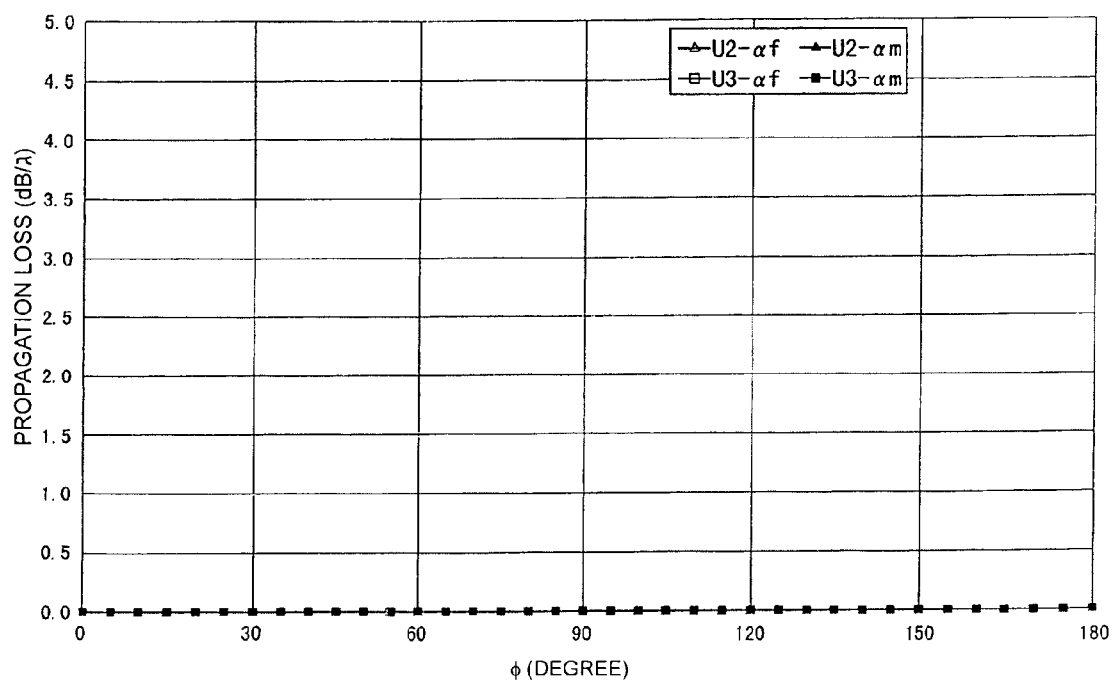
FIG. 17 is a graph showing the relationship between Euler angle $\phi$ and the propagation loss $\alpha$ in the structure in which Au electrodes are formed on a $LiNbO_3$ substrate having Euler angles ($\phi$, 0°, 90°) and a SiO2 film is formed.
Figure 18:
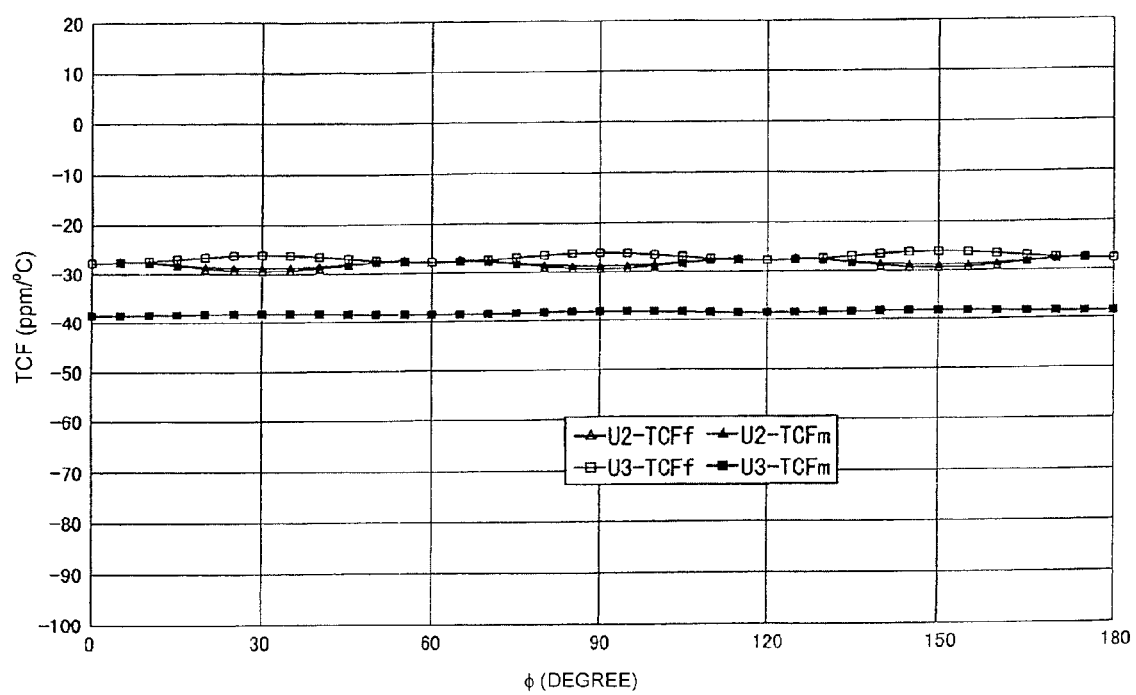
FIG. 18 is a graph showing the relationship between Euler angle φ and the temperature coefficient of frequency TCF in the structure in which Au electrodes are formed on a LiNbO$_3$ substrate having Euler angles (φ, 0°, 90°) and a SiO2 film is formed.
Figure 19:
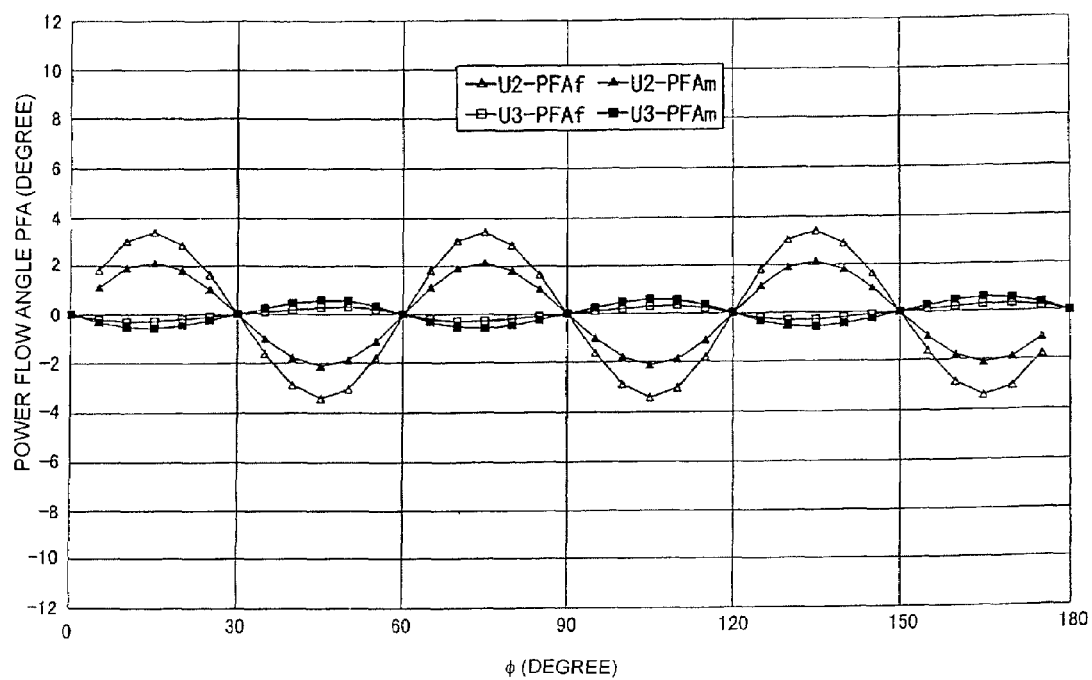
FIG. 19 is a graph showing the relationship between Euler angle φ and the power flow angle PFA in the structure in which Au electrodes are formed on a LiNbO$_3$ substrate having Euler angles (φ, 0°, 90°) and a SiO2 film is formed.
Figure 20:
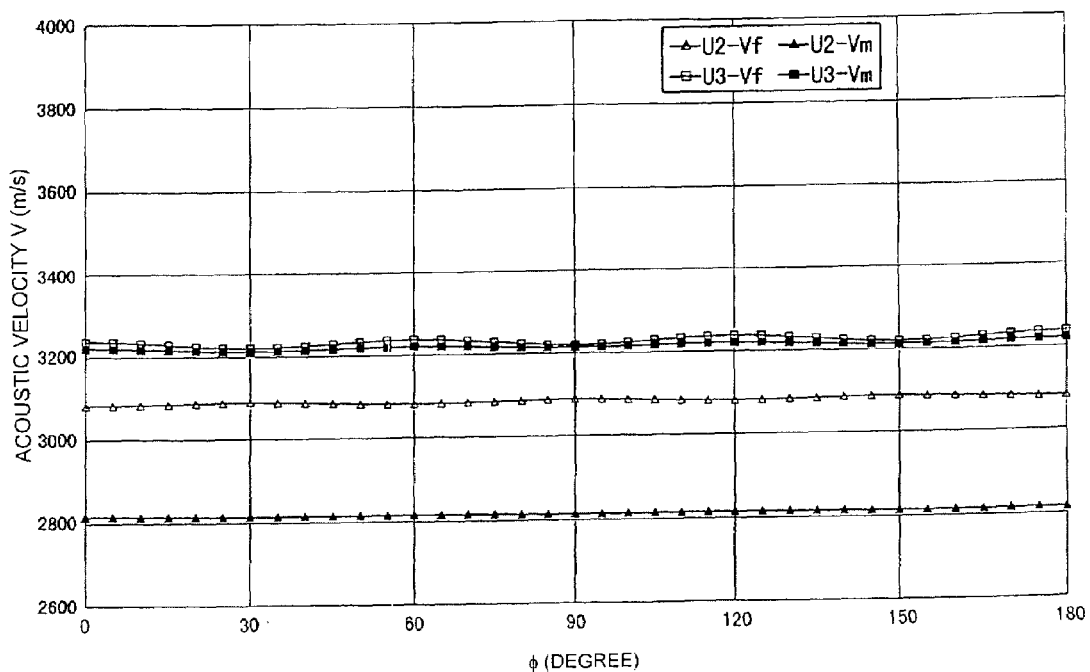
FIG. 20 is a graph showing the relationship between Euler angle φ and the acoustic velocity V in the structure in which Au electrodes are formed on a LiNbO$_3$ substrate having Euler angles (®, 90°, 0°) and a SiO2 film is formed.
Figure 21:
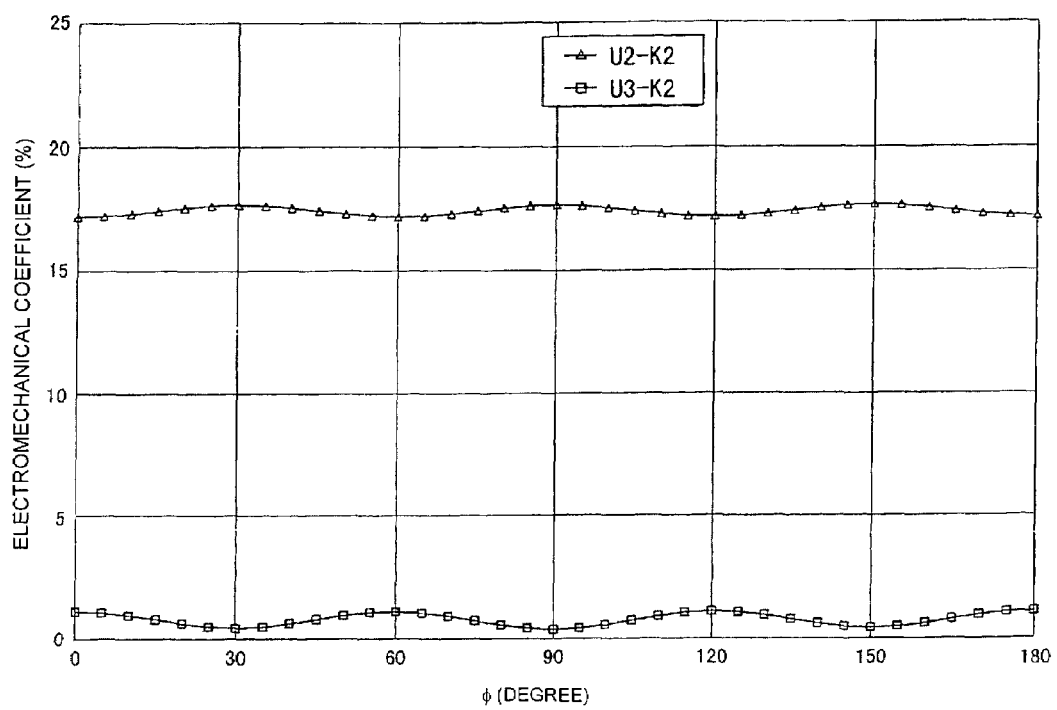
FIG. 21 is a graph showing the relationship between Euler angle φ and the electromechanical coefficient k$^2$ in the structure in which Au electrodes are formed on a LiNbO$_3$ substrate having Euler angles (φ, 90°, 0°) and a SiO2 film is formed.
Figure 22:
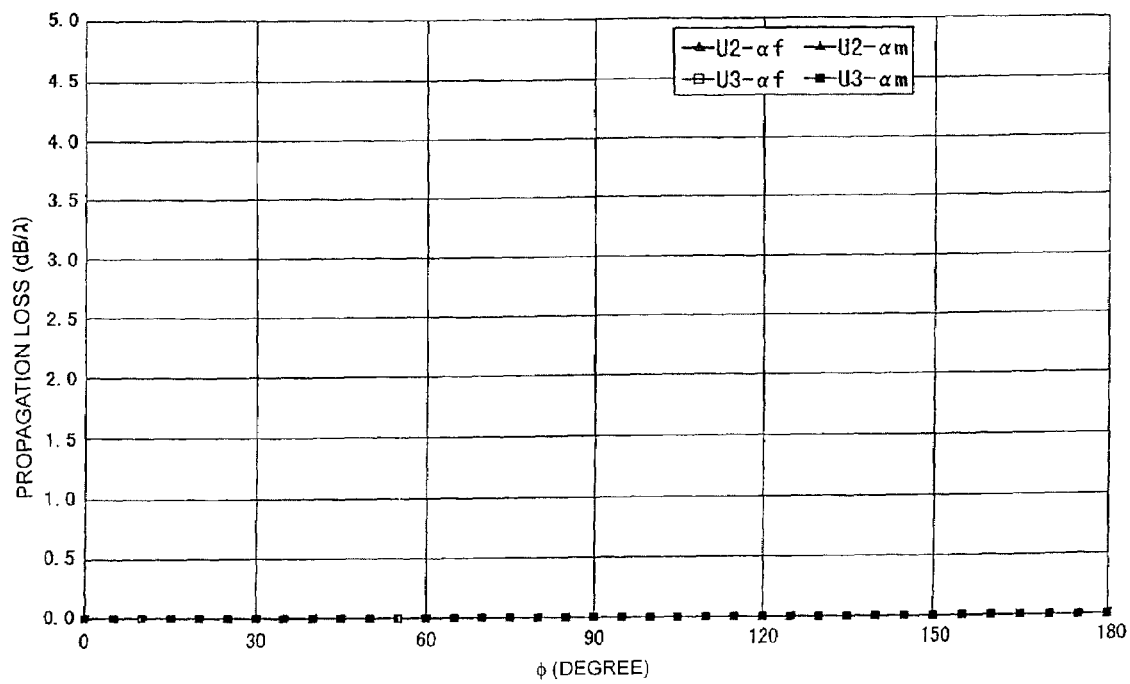
FIG. 22 is a graph showing the relationship between Euler angle φ and the propagation loss α in the structure in which Au electrodes are formed on a LiNbO$_3$ substrate having Euler angles (φ, 90°, 0°) and a SiO2 film is formed.
Figure 23:
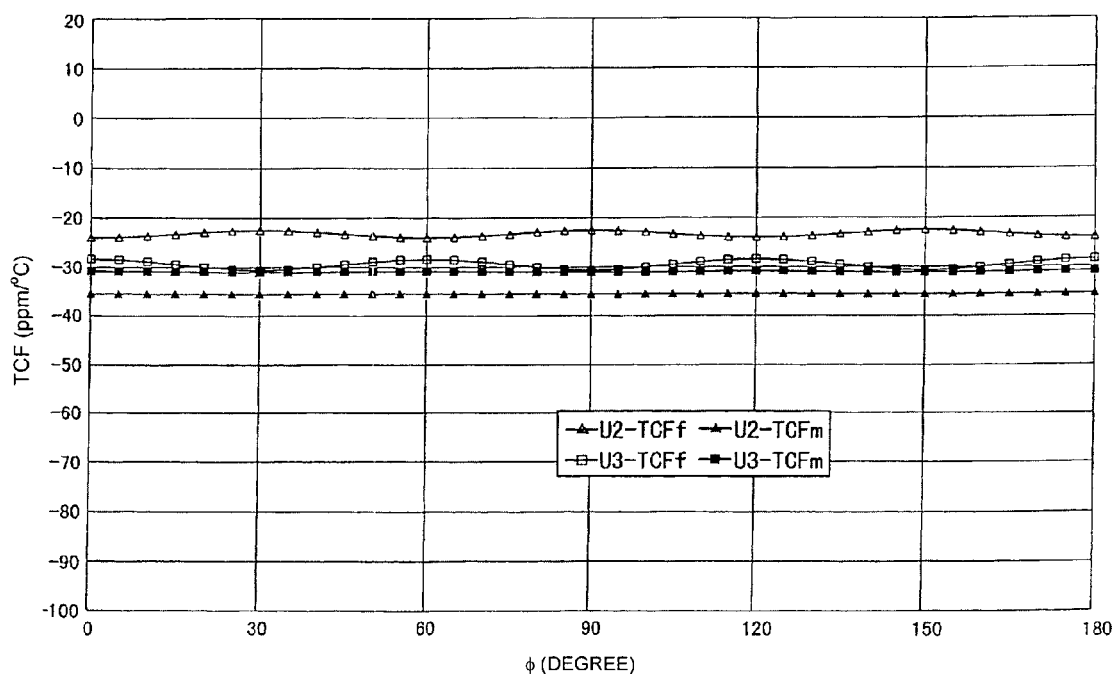
FIG. 23 is a graph showing the relationship between Euler angle φ and the temperature coefficient of frequency TCF in the structure in which Au electrodes are formed on a LiNbO$_3$ substrate having Euler angles (φ, 90°, 0°) and a SiO2 film is formed.
Figure 24:
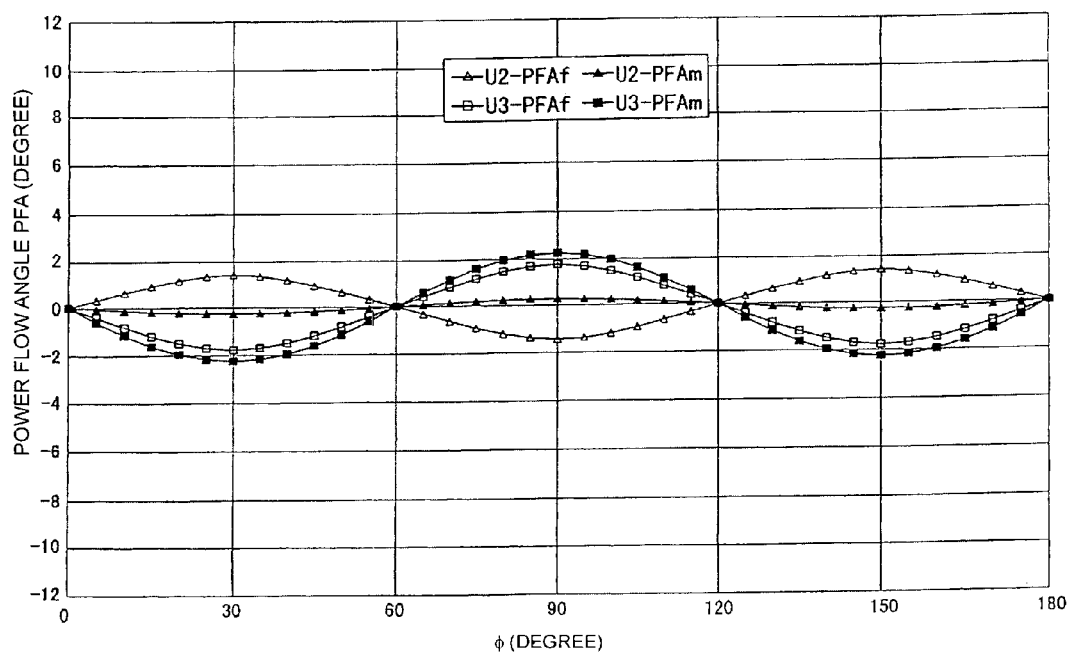
FIG. 24 is a graph showing the relationship between Euler angle φ and the power flow angle PFA in the structure in which Au electrodes are formed on a LiNbO$_3$ substrate having Euler angles (φ, 90°, 0°) and a SiO2 film is formed.
Figure 25:
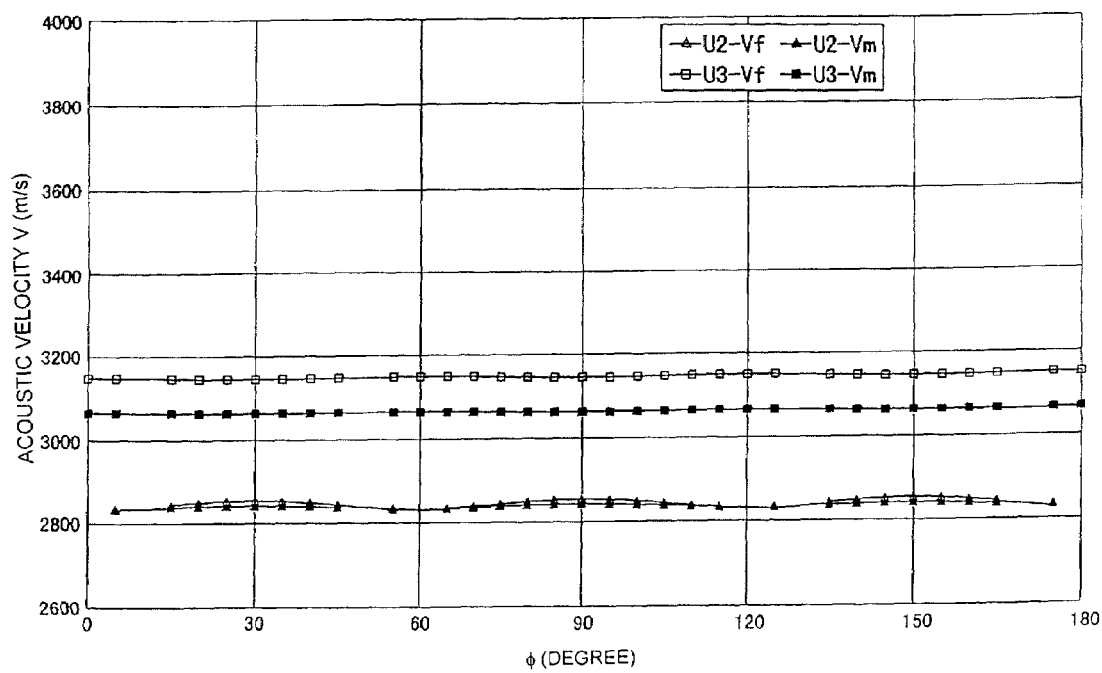
FIG. 25 is a graph showing the relationship between Euler angle φ and the acoustic velocity V in the structure in which Au electrodes are formed on a LiNbO$_3$ substrate having Euler angles (φ, 90°, 90°) and a SiO2 film is formed.
Figure 26:
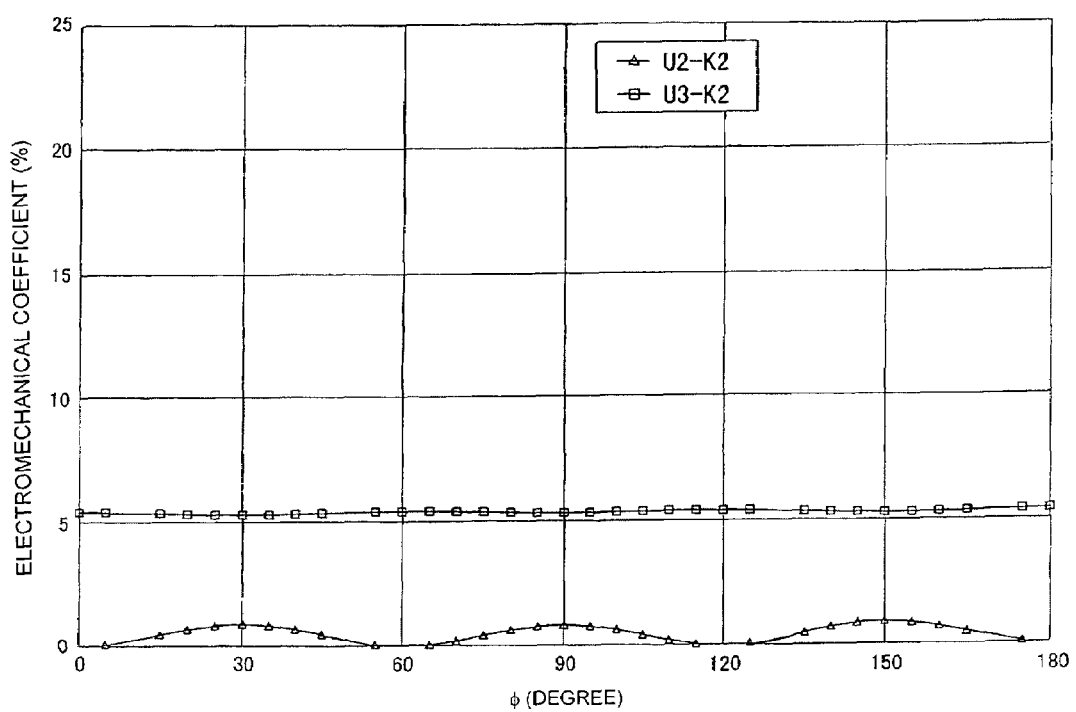
FIG. 26 is a graph showing the relationship between Euler angle φ and the electromechanical coefficient k$^2$ in the structure in which Au electrodes are formed on a LiNbO$_3$ substrate having Euler angles (φ, 90°, 90°) and a SiO2 film is formed.
Figure 27:
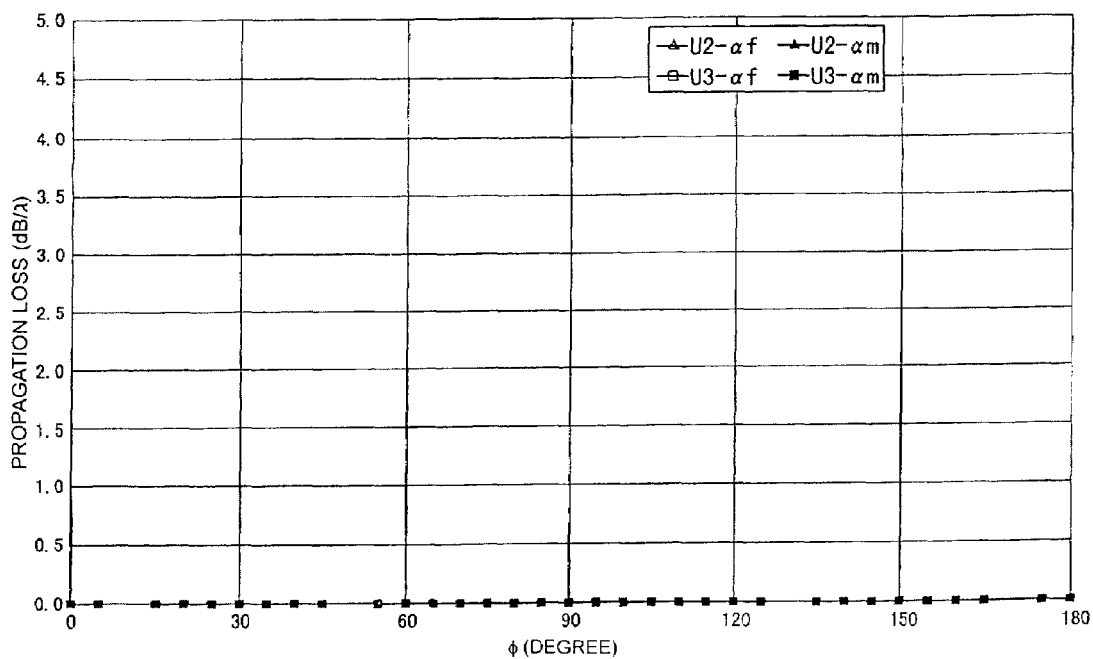
FIG. 27 is a graph showing the relationship between Euler angle φ and the propagation loss α in the structure in which Au electrodes are formed on a LiNbO$_3$ substrate having Euler angles (φ, 90°, 90°) and a SiO2 film is formed.
Figure 28:
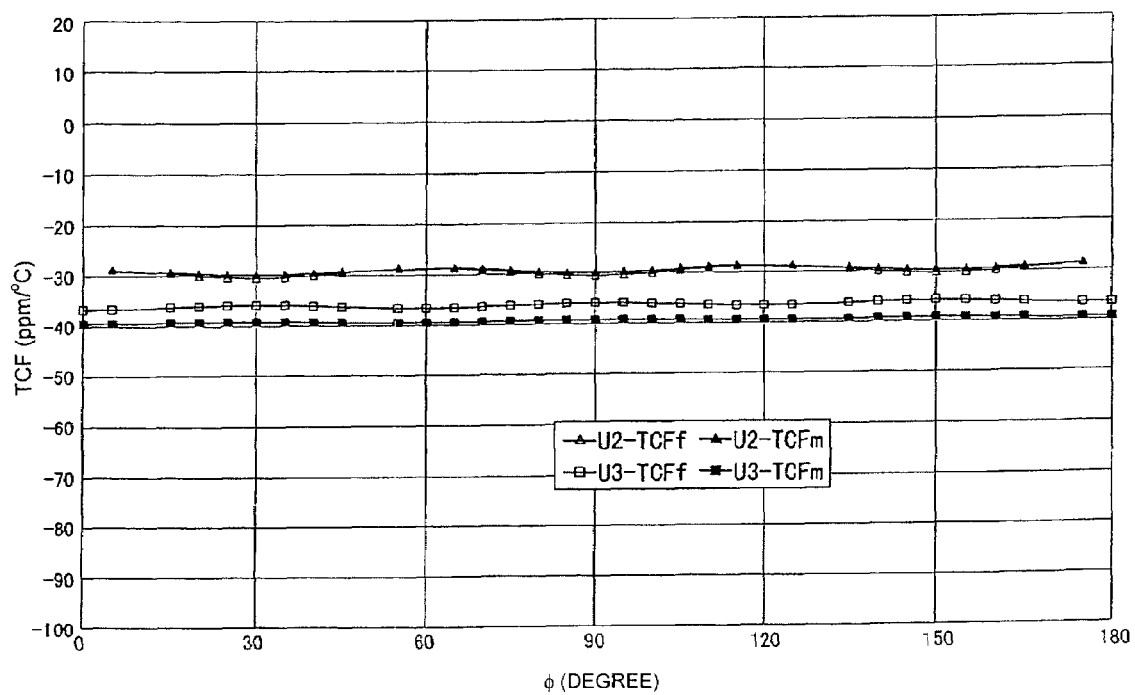
FIG. 28 is a graph showing the relationship between Euler angle φ and the temperature coefficient of frequency TCF in the structure in which Au electrodes are formed on a LiNbO$_3$ substrate having Euler angles (φ, 90°, 90°) and a SiO2 film is formed.
Figure 29:
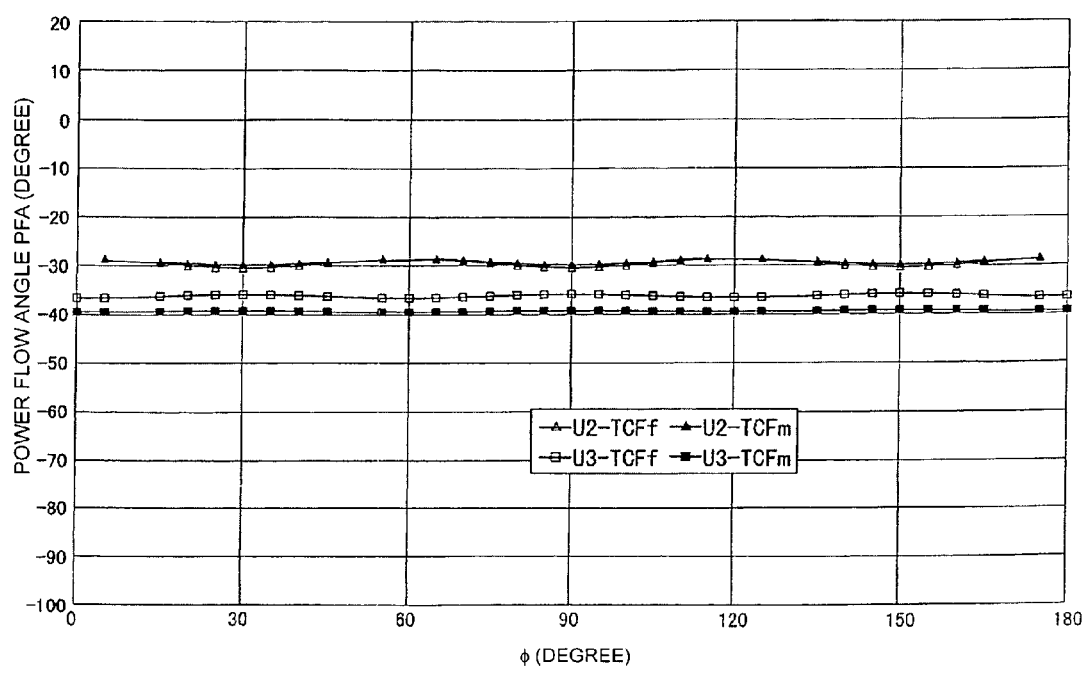
FIG. 29 is a graph showing the relationship between Euler angle φ and the power flow angle PFA in the structure in which Au electrodes are formed on a LiNbO$_3$ substrate having Euler angles (φ, 90°, 90°) and a SiO2 film is formed.
Figure 30:
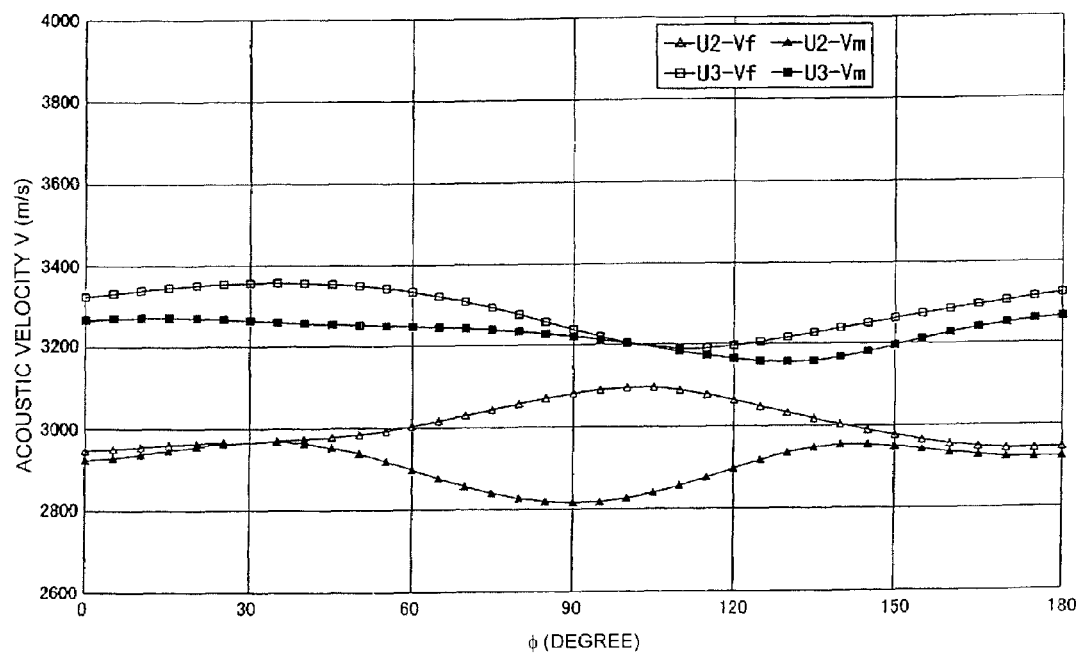
FIG. 30 is a graph showing the relationship between Euler angle θ and the acoustic velocity V in the structure in which Au electrodes are formed on a LiNbO$_3$ substrate having Euler angles (0°, θ, 0°) and a SiO2 film is formed.
Figure 31:
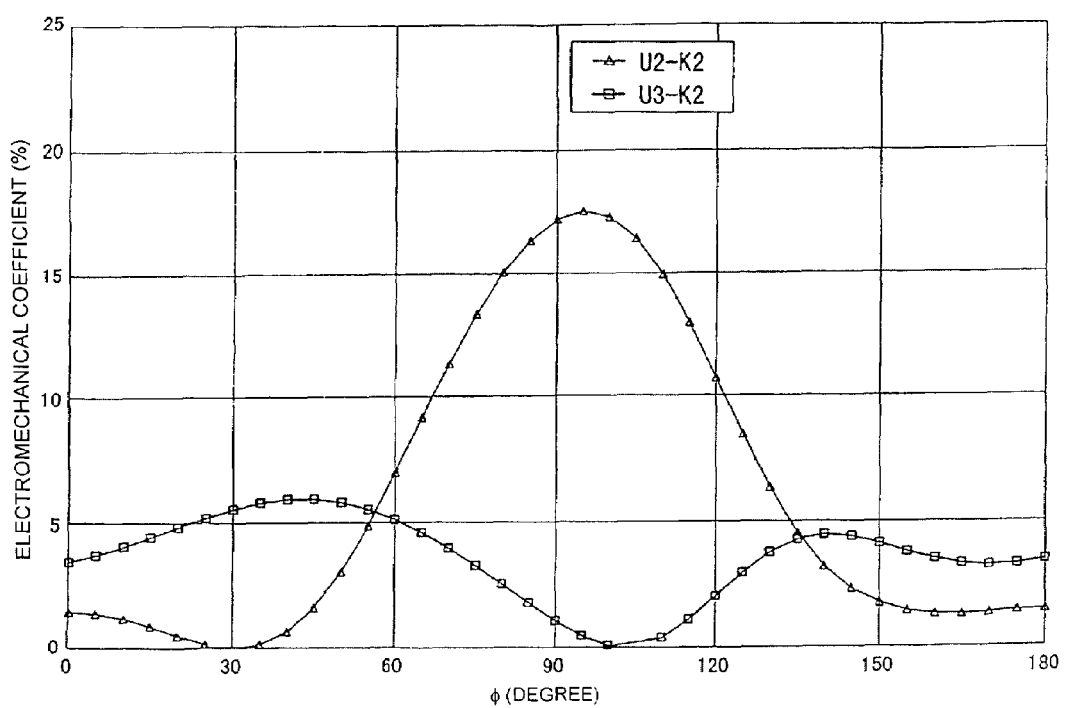
FIG. 31 is a graph showing the relationship between Euler angle θ and the electromechanical coefficient k$^2$ in the structure in which Au electrodes are formed on a LiNbO$_3$ substrate having Euler angles (0°, θ, 0°) and a SiO2 film is formed.
Figure 32:
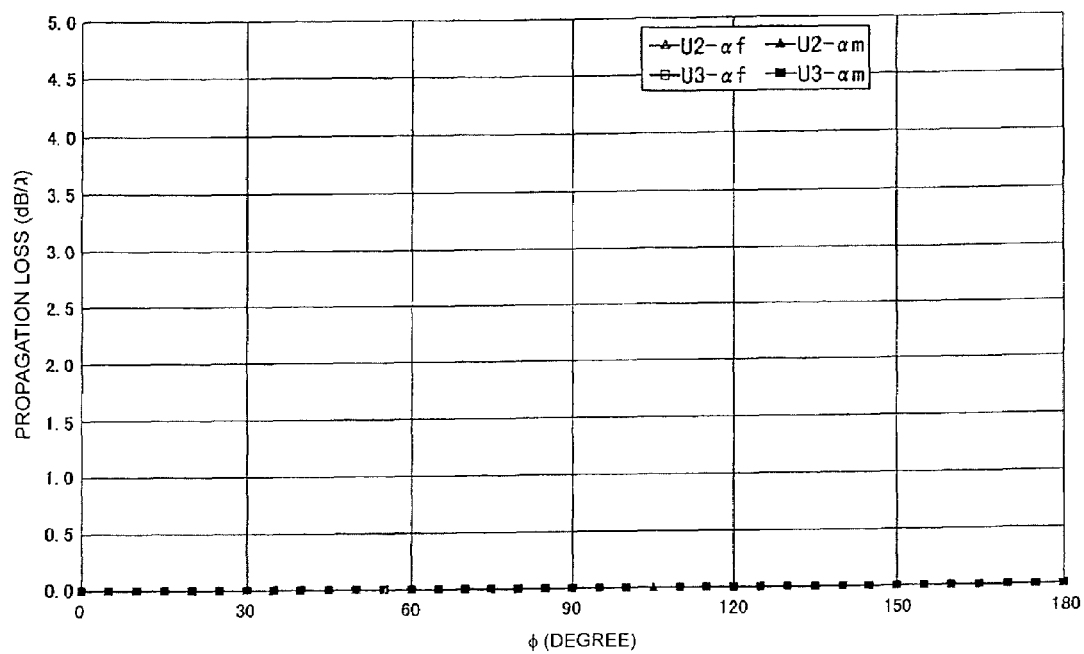
FIG. 32 is a graph showing the relationship between Euler angle θ and the propagation loss α in the structure in which Au electrodes are formed on a LiNbO$_3$ substrate having Euler angles (0°, θ, 0°) and a SiO2 film is formed.
Figure 33:
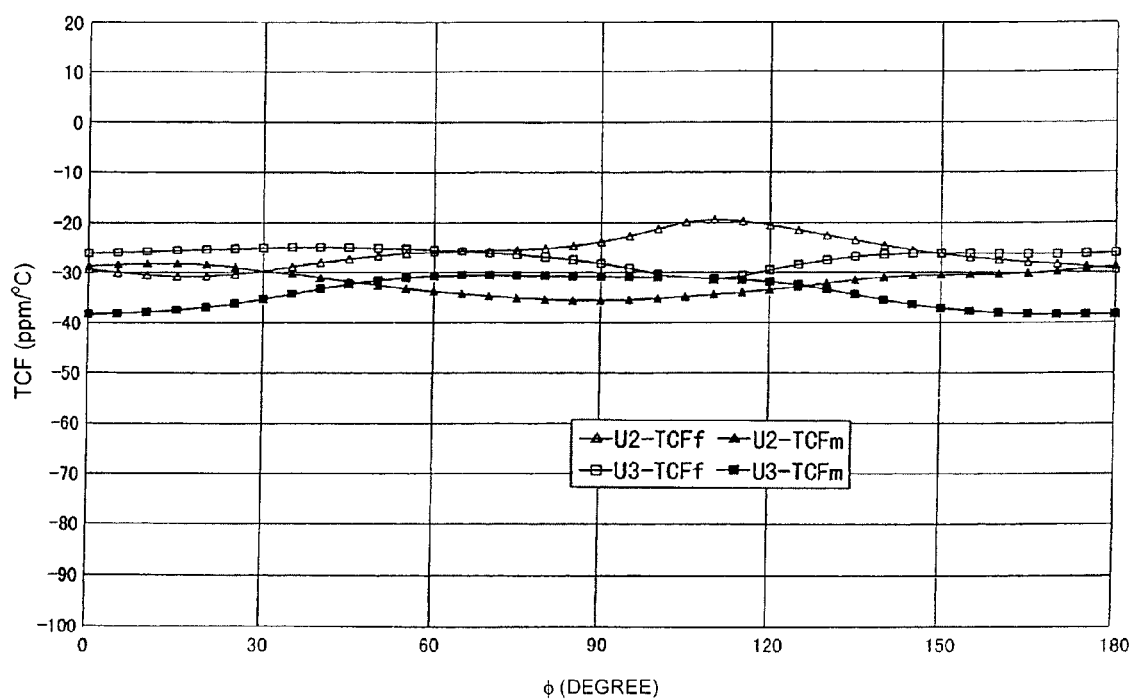
FIG. 33 is a graph showing the relationship between Euler angle θ and the temperature coefficient of frequency TCF in the structure in which Au electrodes are formed on a LiNbO$_3$ substrate having Euler angles (0°, θ, 0°) and a SiO2 film is formed.
Figure 34:
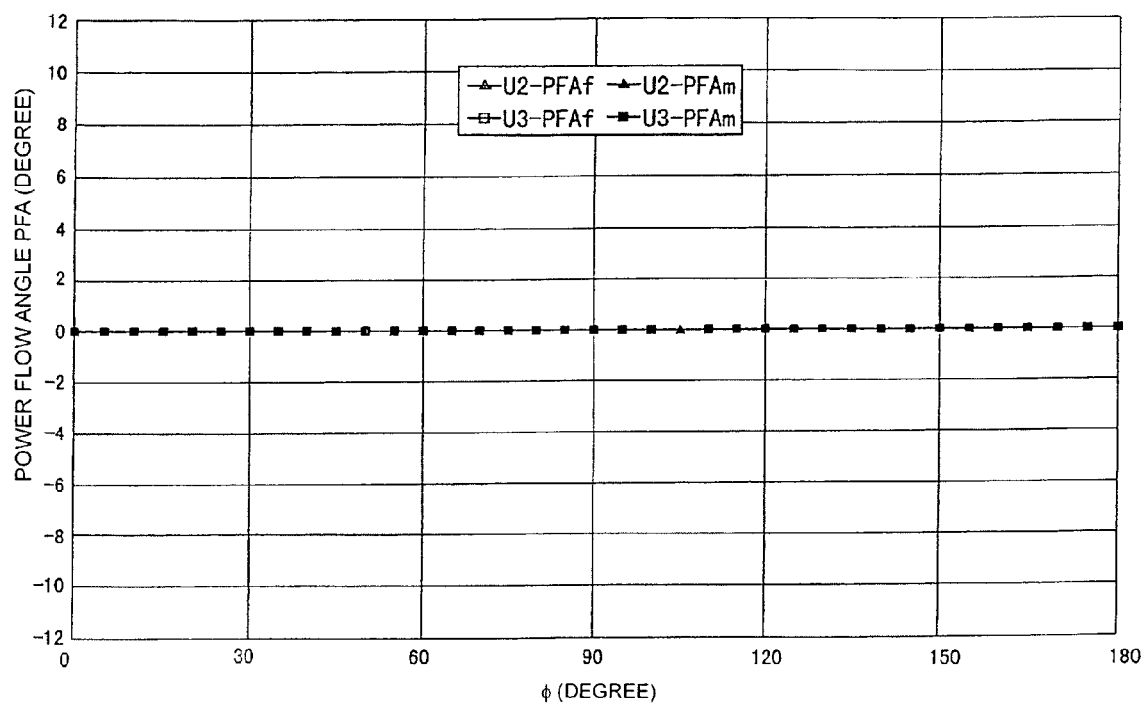
FIG. 34 is a graph showing the relationship between Euler angle θ and the power flow angle PFA in the structure in which Au electrodes are formed on a LiNbO$_3$ substrate having Euler angles (0°, θ, 0°) and a SiO2 film is formed.
Figure 35:
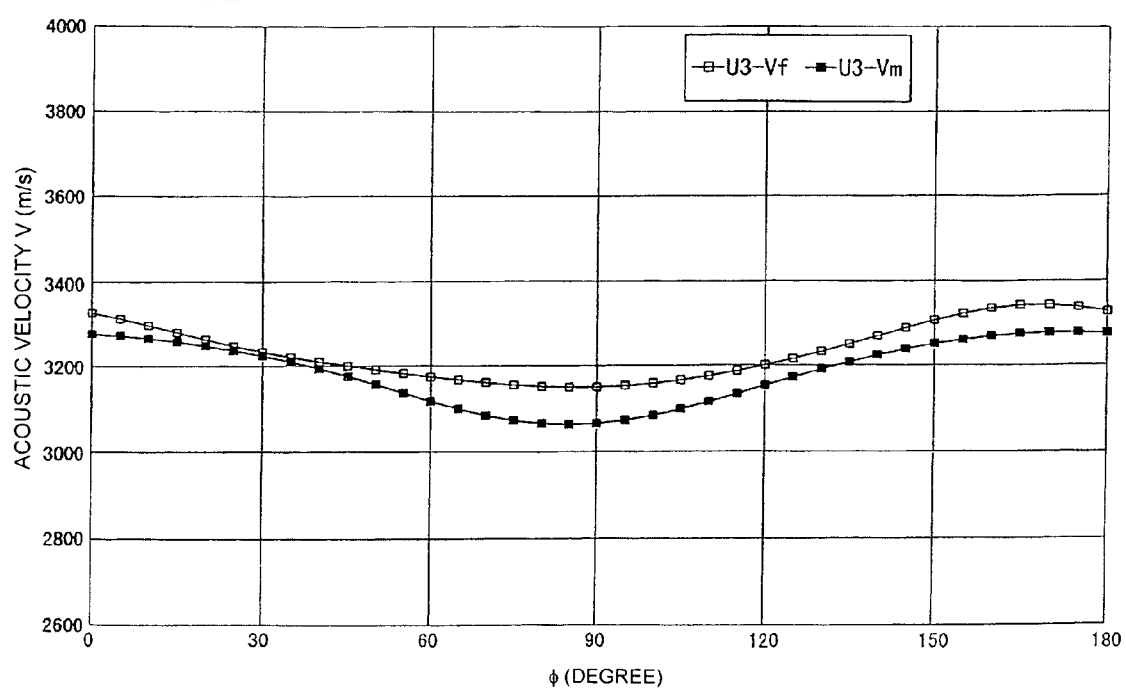
FIG. 35 is a graph showing the relationship between Euler angle θ and the acoustic velocity V in the structure in which Au electrodes are formed on a LiNbO$_3$ substrate having Euler angles (0°, θ, 90°) and a SiO2 film is formed.
Figure 36:
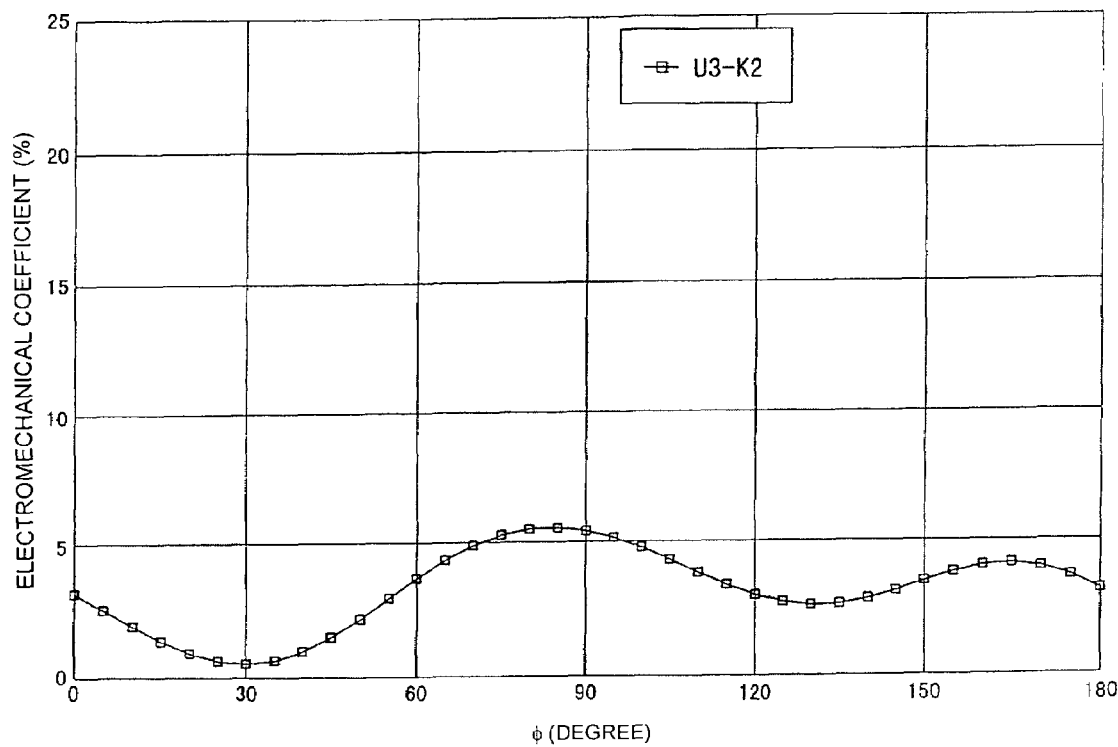
FIG. 36 is a graph showing the relationship between Euler angle θ and the electromechanical coefficient k$^2$ in the structure in which Au electrodes are formed on a LiNbO$_3$ substrate having Euler angles (0°, θ, 90°) and a SiO2 film is formed.
Figure 37:
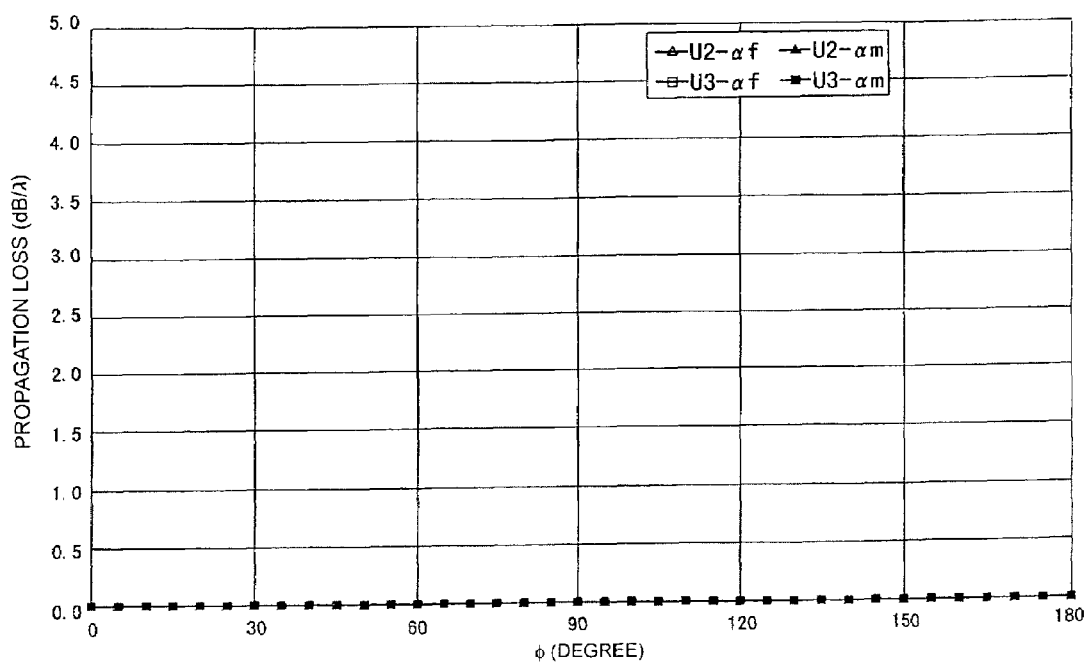
FIG. 37 is a graph showing the relationship between Euler angle θ and the propagation loss α in the structure in which Au electrodes are formed on a LiNbO$_3$ substrate having Euler angles (0°, θ, 90°) and a SiO2 film is formed.
Figure 38:
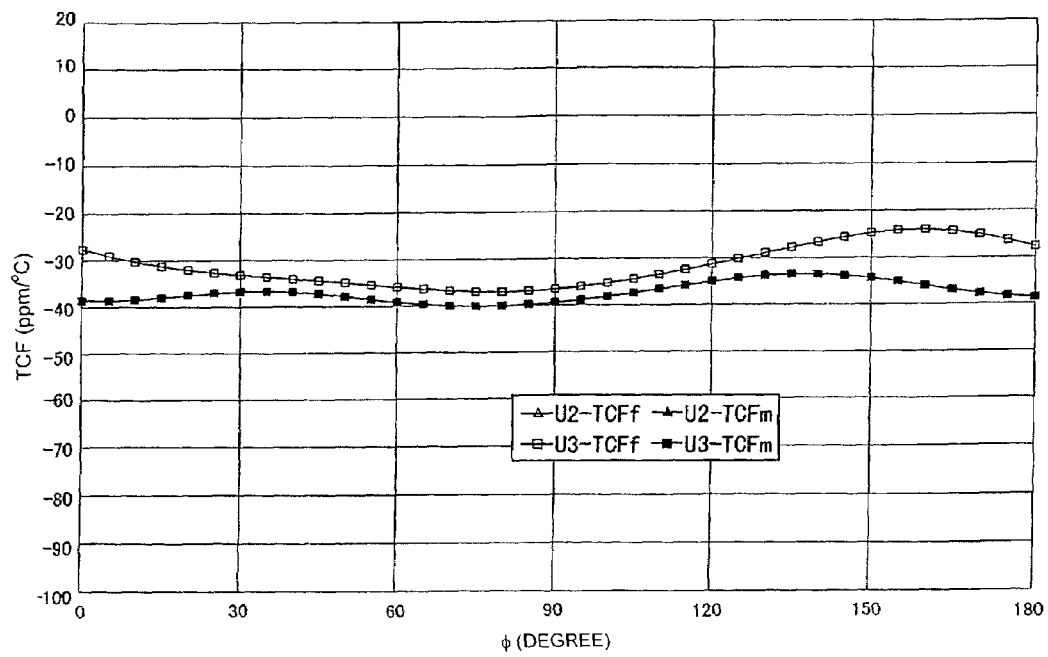
FIG. 38 is a graph showing the relationship between Euler angle θ and the temperature coefficient of frequency TCF in the structure in which Au electrodes are formed on a LiNbO$_3$ substrate having Euler angles (0°, θ, 90°) and a SiO2 film is formed.
Figure 39:
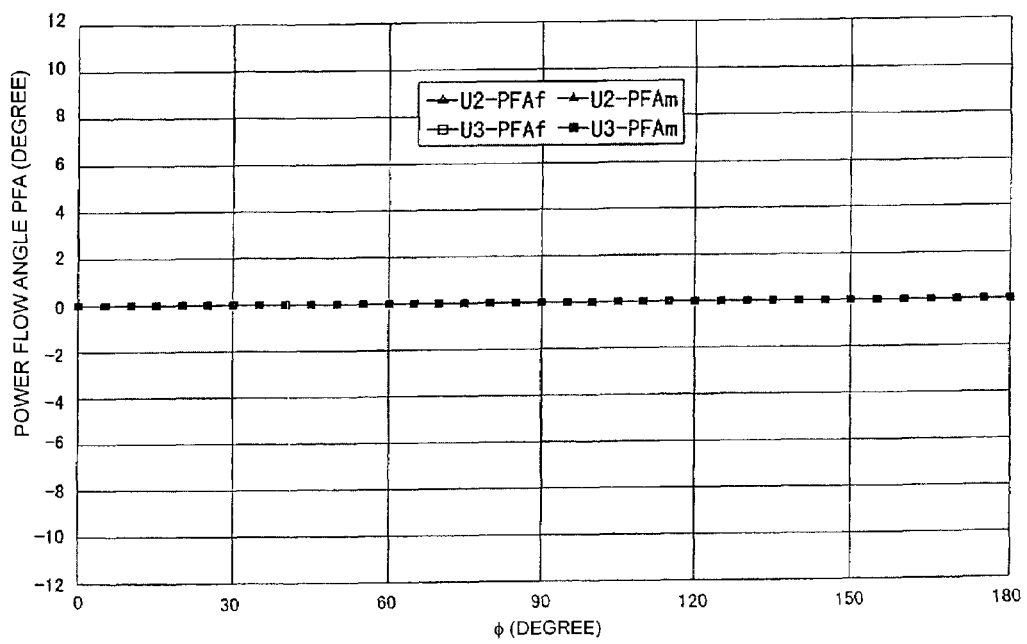
FIG. 39 is a graph showing the relationship between Euler angle θ and the power flow angle PFA in the structure in which Au electrodes are formed on a LiNbO$_3$ substrate having Euler angles (0°, θ, 90°) and a SiO2 film is formed.
Figure 40:
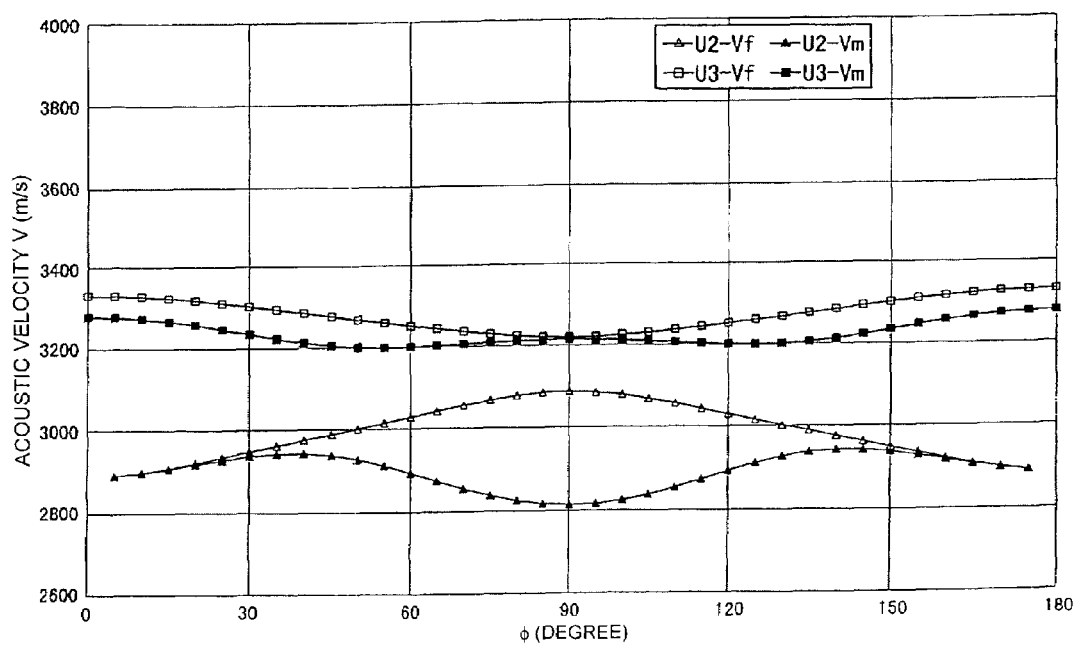
FIG. 40 is a graph showing the relationship between Euler angle θ and the acoustic velocity V in the structure in which Au electrodes are formed on a LiNbO$_3$ substrate having Euler angles (90°, θ, 0°) and a SiO2 film is formed.
Figure 41:
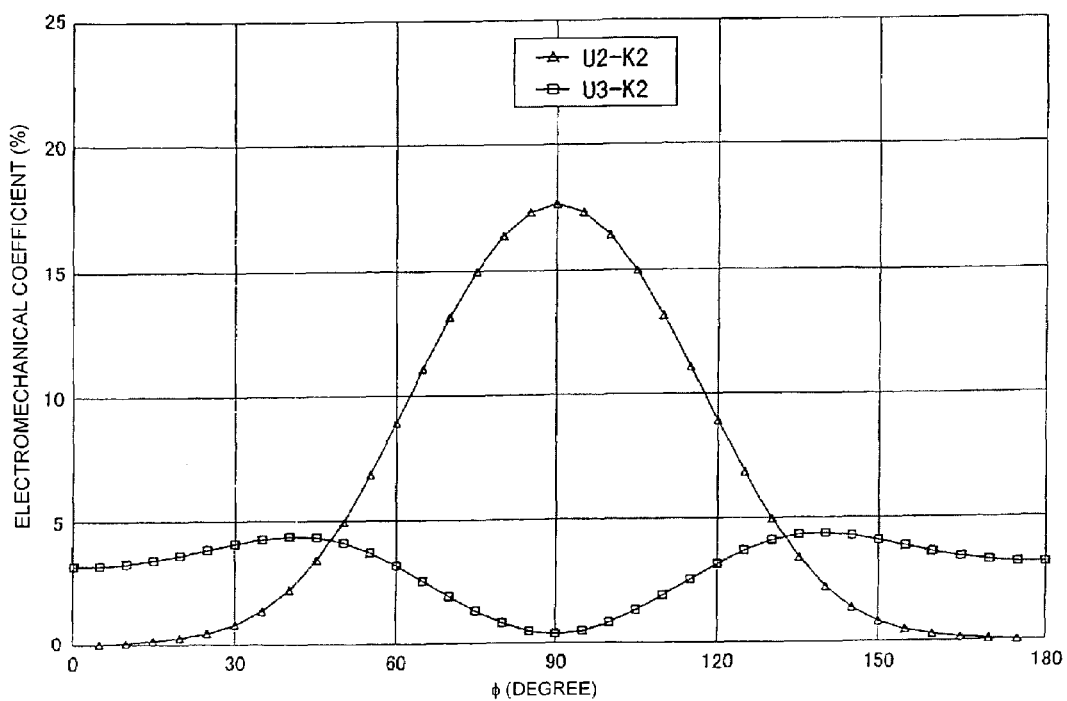
FIG. 41 is a graph showing the relationship between Euler angle θ and the electromechanical coefficient k$^2$ in the structure in which Au electrodes are formed on a LiNbO$_3$ substrate having Euler angles (90°, θ, 0°) and a SiO2 film is formed.
Figure 42:
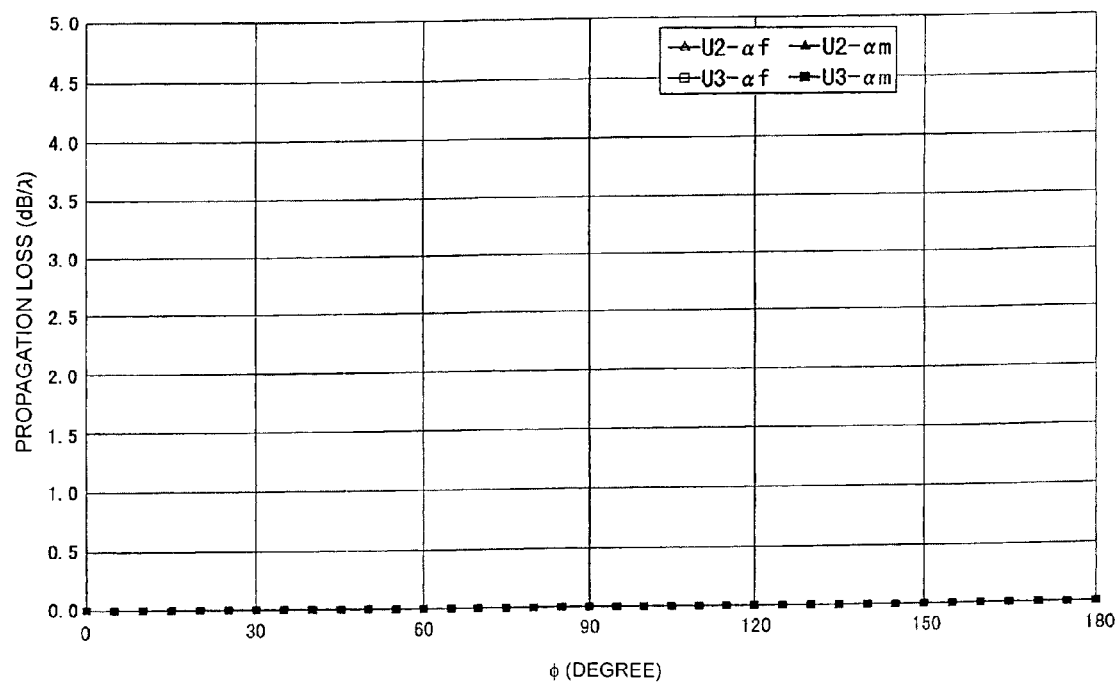
FIG. 42 is a graph showing the relationship between Euler angle θ and the propagation loss α in the structure in which Au electrodes are formed on a LiNbO$_3$ substrate having Euler angles (90°, θ, 0°) and a SiO2 film is formed.
Figure 43:
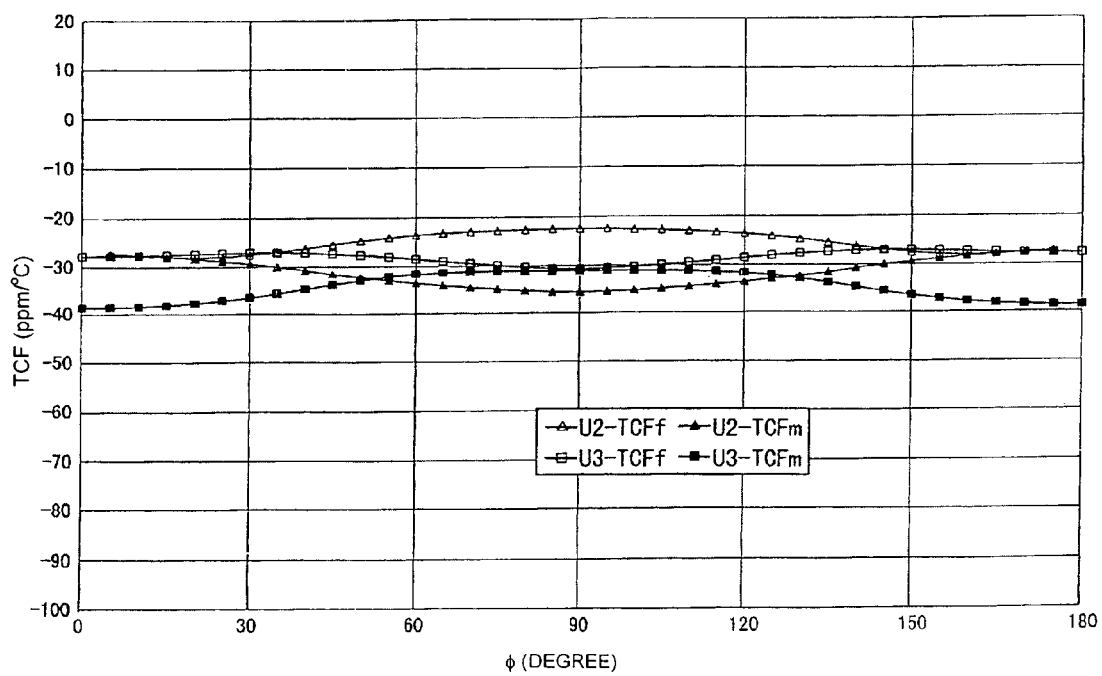
FIG. 43 is a graph showing the relationship between Euler angle θ and the temperature coefficient of frequency TCF in the structure in which Au electrodes are formed on a LiNbO$_3$ substrate having Euler angles (90°, θ, 0°) and a SiO2 film is formed.
Figure 44:
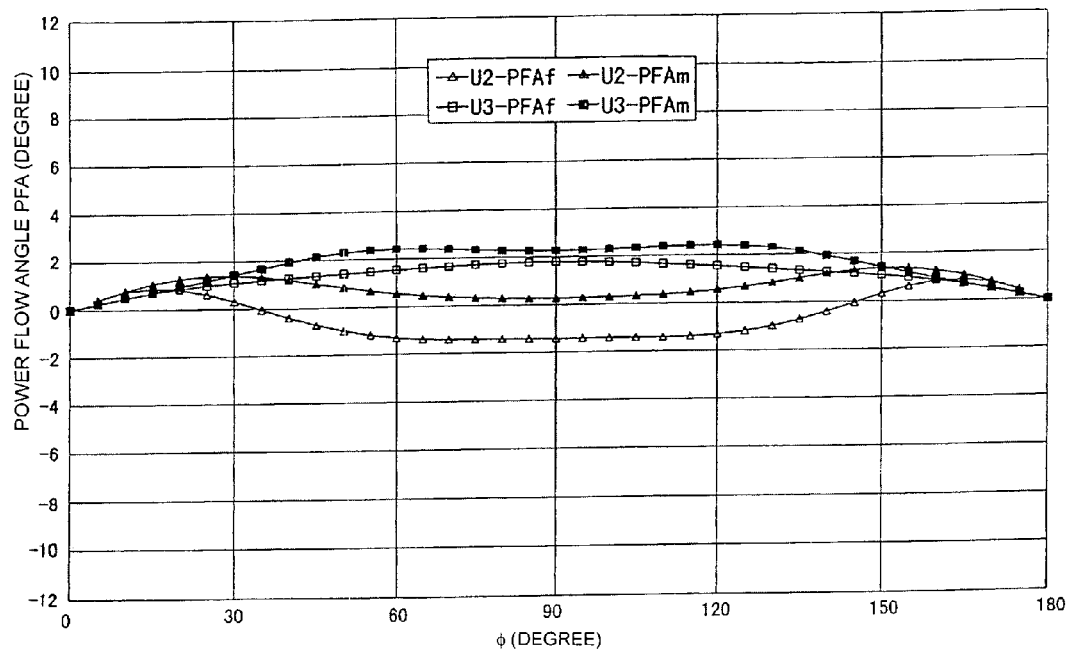
FIG. 44 is a graph showing the relationship between Euler angle θ and the power flow angle PFA in the structure in which Au electrodes are formed on a LiNbO$_3$ substrate having Euler angles (90°, θ, 0°) and a SiO2 film is formed.
Figure 45:
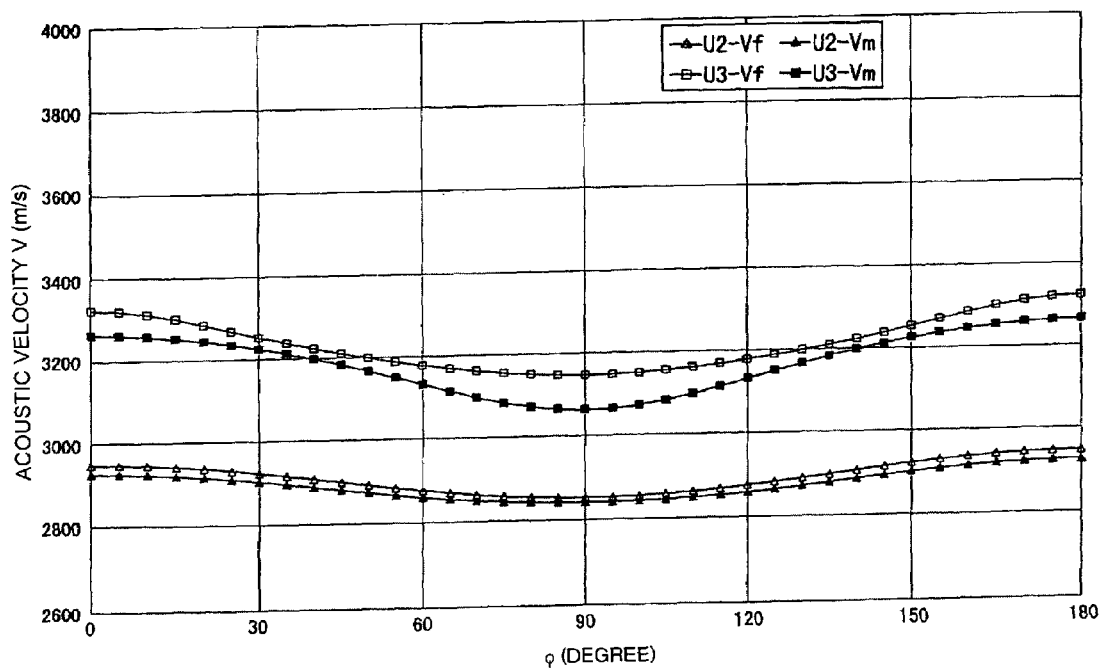
FIG. 45 is a graph showing the relationship between Euler angle θ and the acoustic velocity V in the structure in which Au electrodes are formed on a LiNbO$_3$ substrate having Euler angles (90°, θ, 90) and a SiO2 film is formed.
Figure 46:
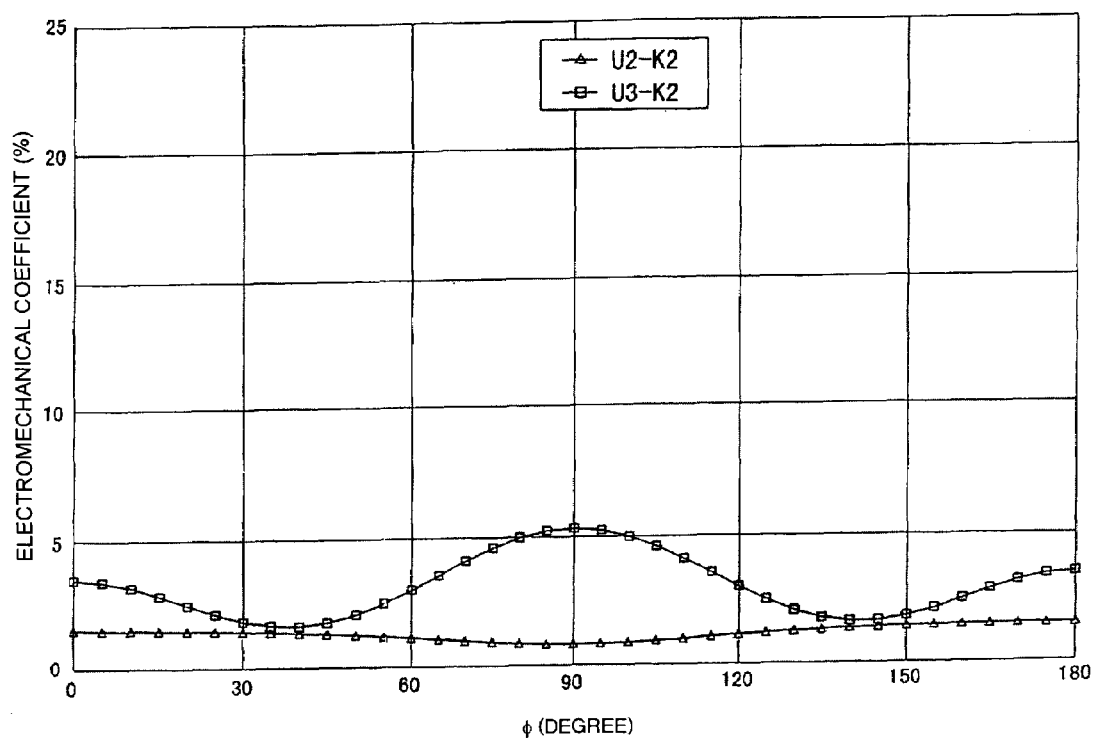
FIG. 46 is a graph showing the relationship between Euler angle θ and the electromechanical coefficient k$^2$ in the structure in which Au electrodes are formed on a LiNbO$_3$ substrate having Euler angles (90°, θ, 90°) and a SiO2 film is formed.
Figure 47:
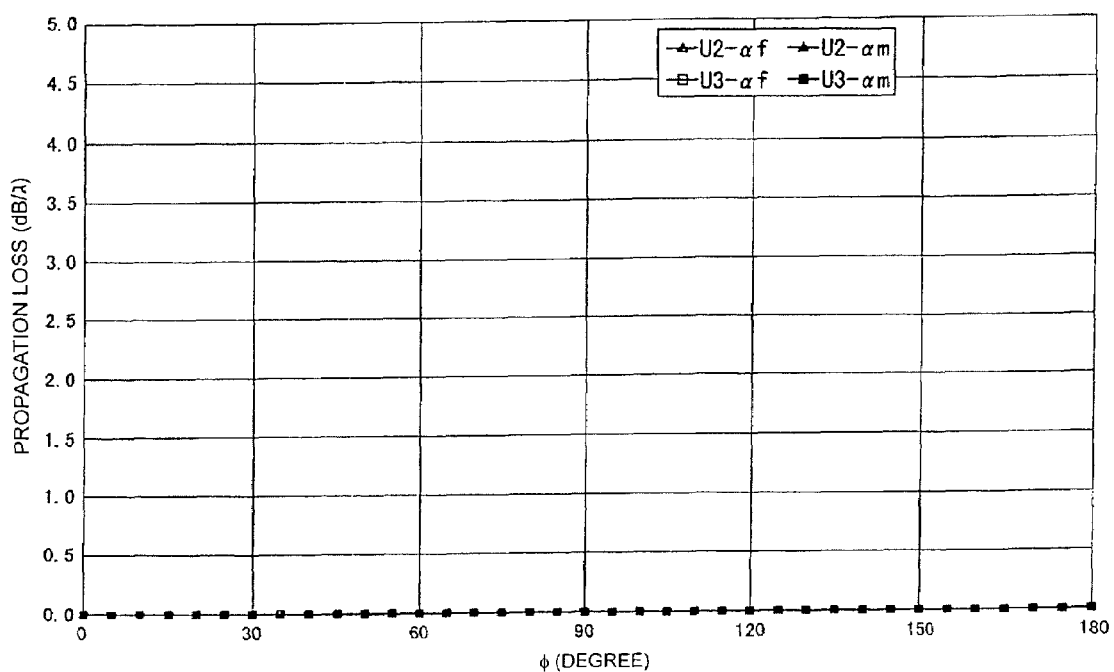
FIG. 47 is a graph showing the relationship between Euler angle θ and the propagation loss α in the structure in which Au electrodes are formed on a LiNbO$_3$ substrate having Euler angles (90°, θ, 90°) and a SiO2 film is formed.
Figure 48:
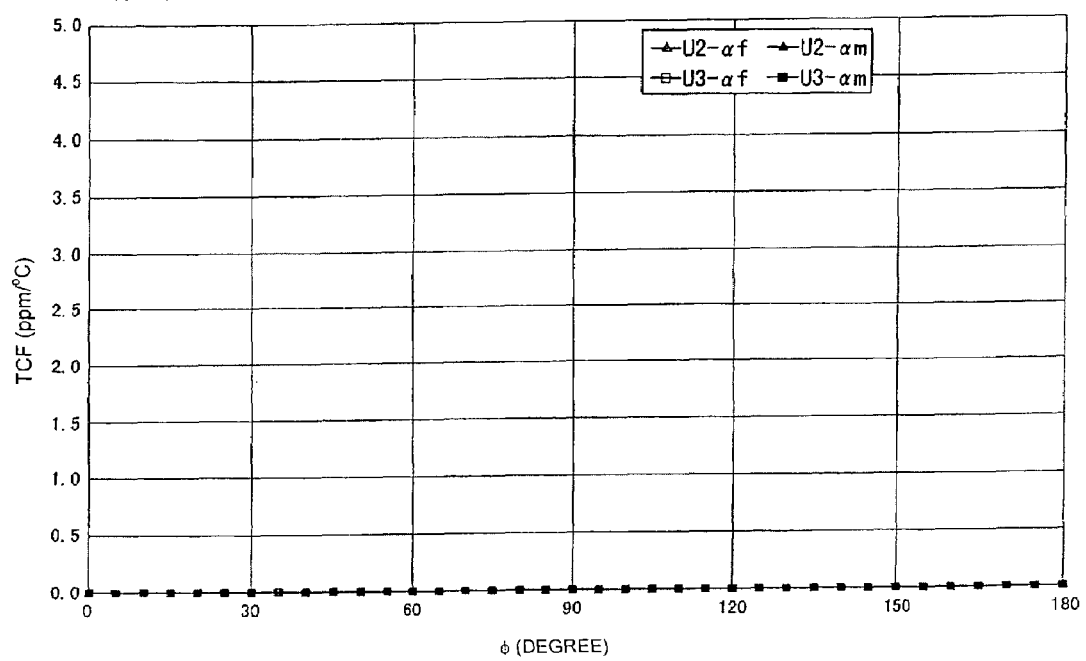
FIG. 48 is a graph showing the relationship between Euler angle θ and the temperature coefficient of frequency TCF in the structure in which Au electrodes are formed on a LiNbO$_3$ substrate having Euler angles (90°, θ, 90°) and a SiO2 film is formed.
Figure 49:
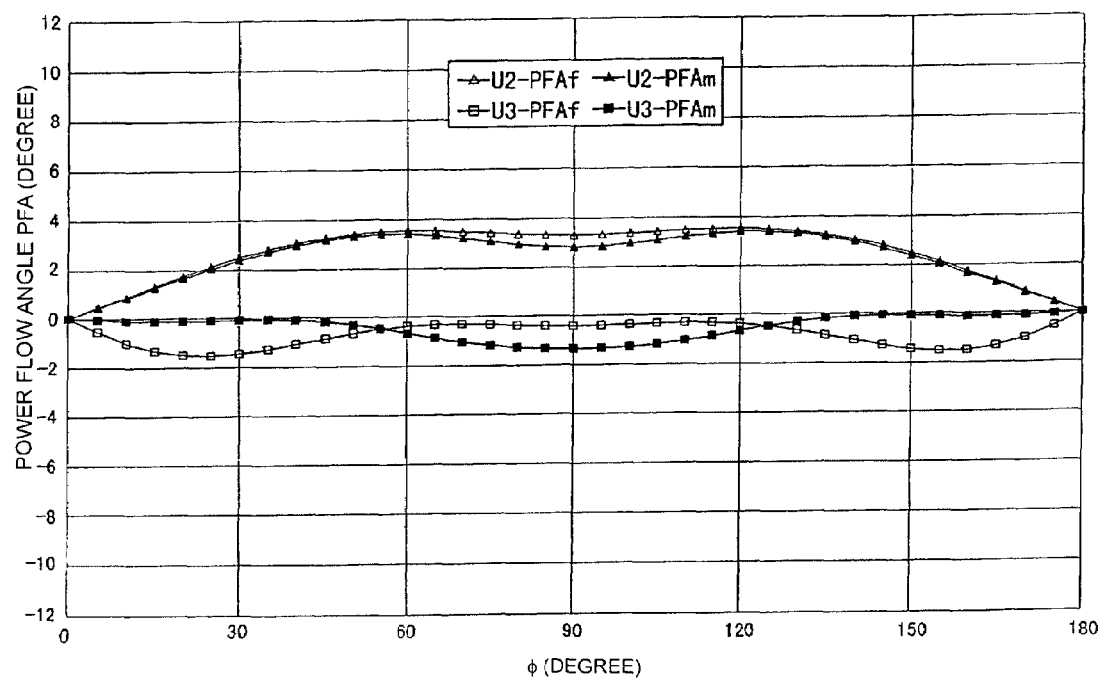
FIG. 49 is a graph showing the relationship between Euler angle θ and the power flow angle PFA in the structure in which Au electrodes are formed on a LiNbO₃ substrate having Euler angles (90°, θ, 90°) and a SiO2 film is formed.
Figure 50:
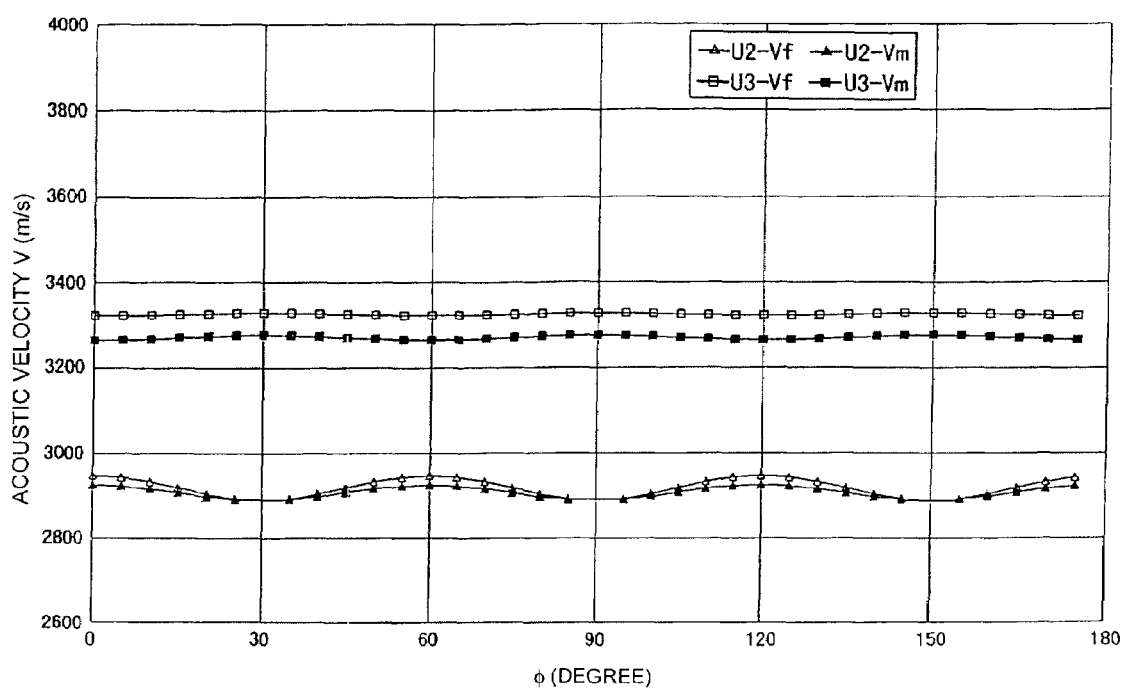
FIG. 50 is a graph showing the relationship between Euler angle ψ and the acoustic velocity V in the structure in which Au electrodes are formed on a LiNbO₃ substrate having Euler angles (0°, 0°, ψ) and a SiO2 film is formed.
Figure 51:
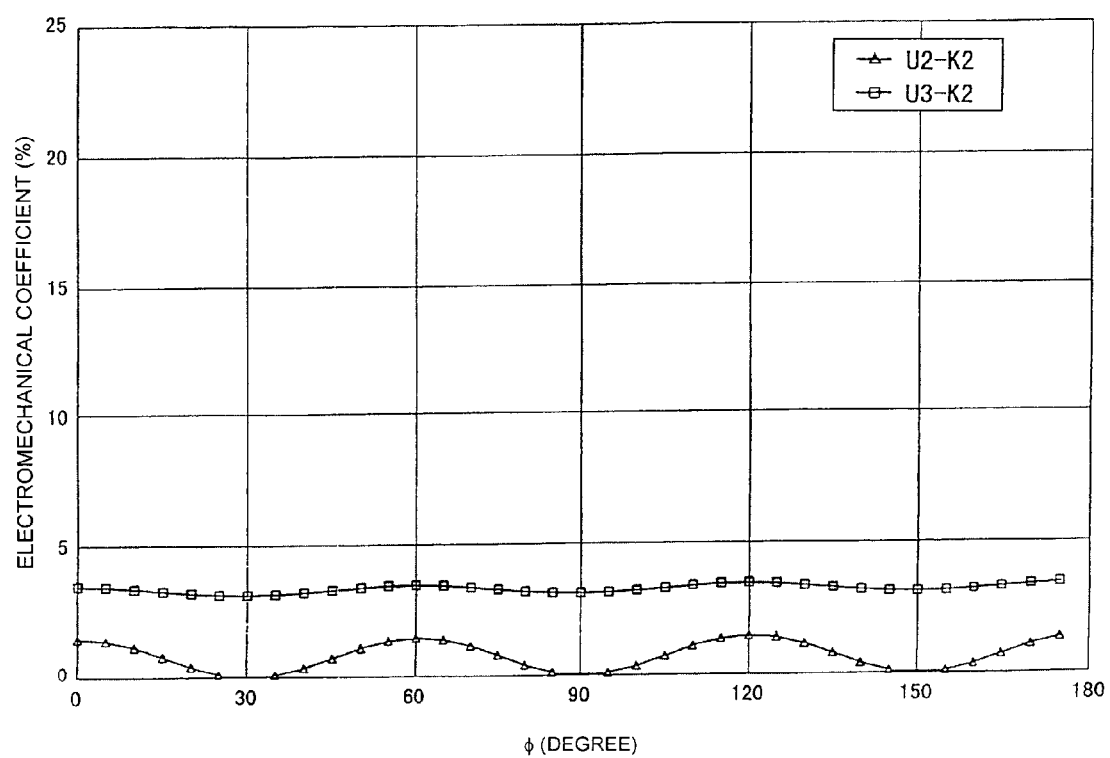
FIG. 51 is a graph showing the relationship between Euler angle ψ and the electromechanical coefficient $k^2$ in the structure in which Au electrodes are formed on a LiNbO₃ substrate having Euler angles (0°, 0°, ψ) and a SiO2 film is formed.
Figure 52:
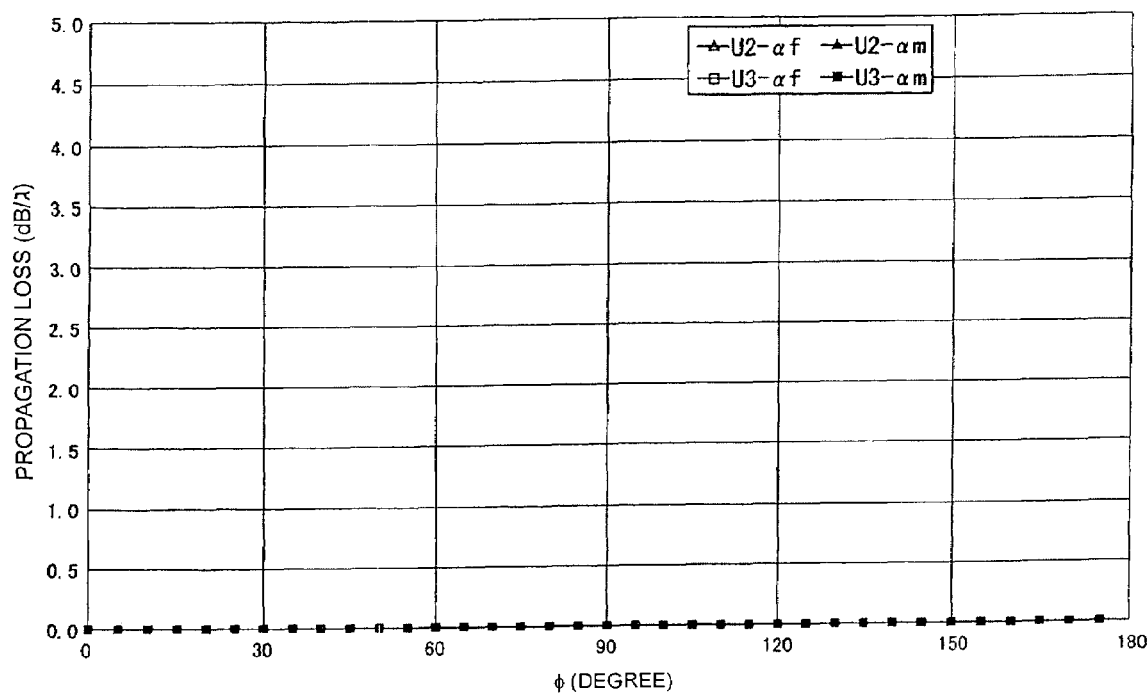
FIG. 52 is a graph showing the relationship between Euler angle ψ and the propagation loss α in the structure in which Au electrodes are formed on a LiNbO₃ substrate having Euler angles (0°, 0°, ψ) and a SiO2 film is formed.
Figure 53:
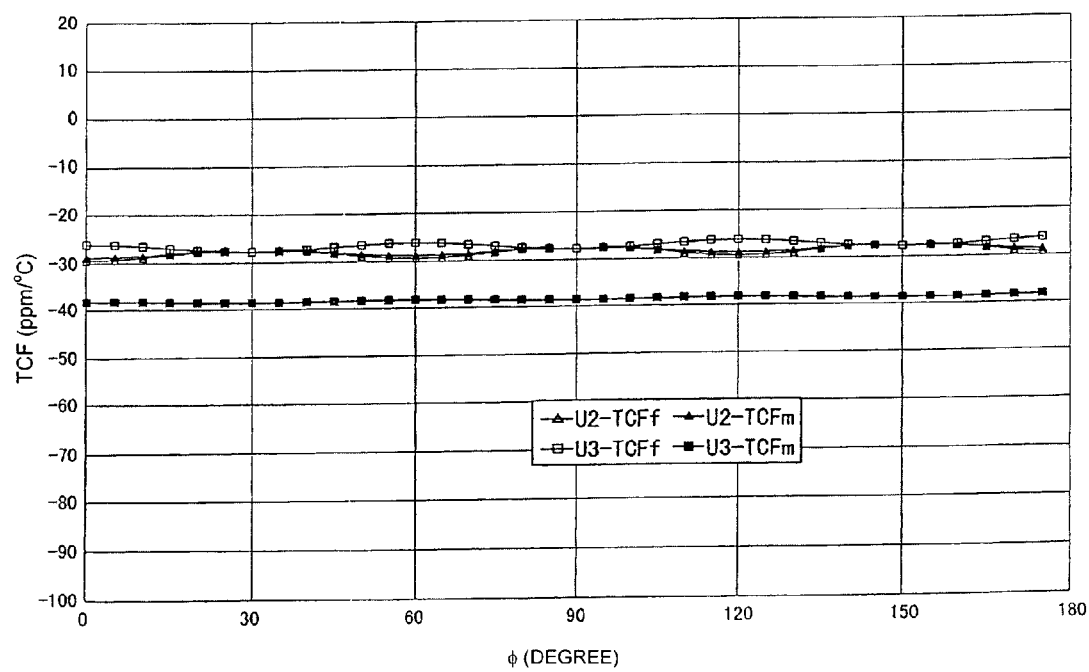
FIG. 53 is a graph showing the relationship between Euler angle ψ and the temperature coefficient of frequency TCF in the structure in which Au electrodes are formed on a LiNbO₃ substrate having Euler angles (0°, 0°, ψ) and a SiO2 film is formed.
Figure 54:
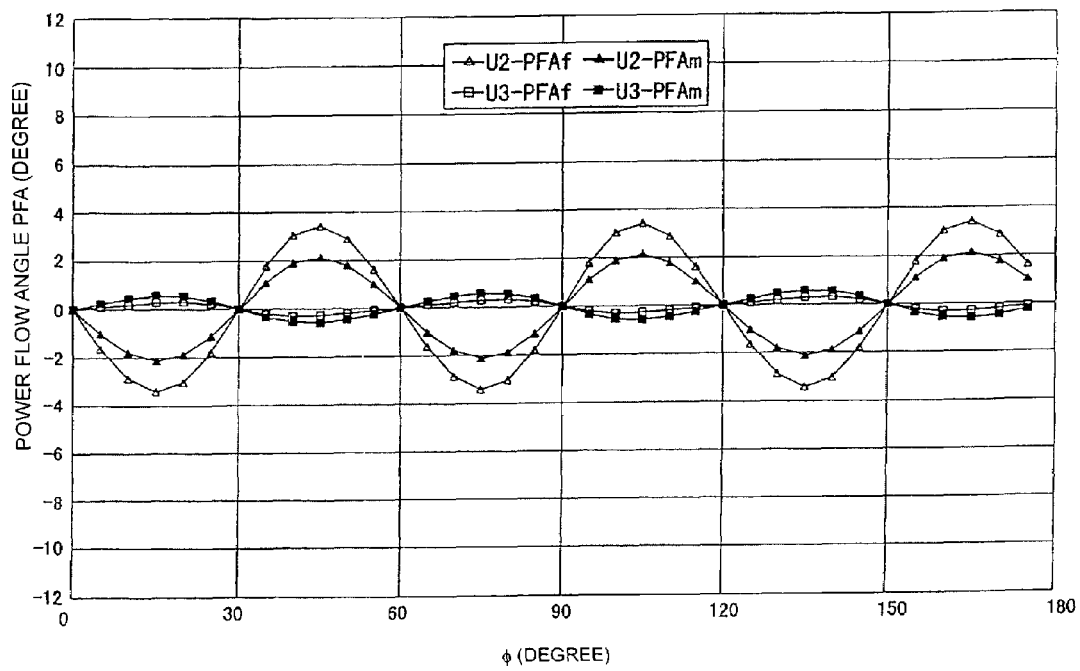
FIG. 54 is a graph showing the relationship between Euler angle ψ and the power flow angle PFA in the structure in which Au electrodes are formed on a LiNbO₃ substrate having Euler angles (0°, 0°, ψ) and a SiO2 film is formed.
Figure 55:
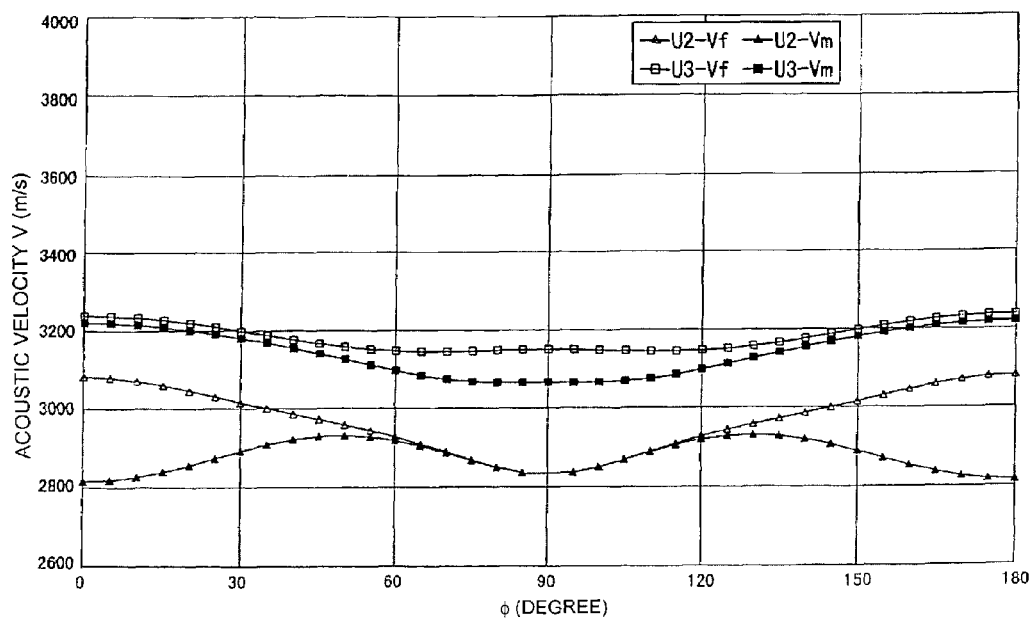
FIG. 55 is a graph showing the relationship between Euler angle ψ and the acoustic velocity V in the structure in which Au electrodes are formed on a LiNbO₃ substrate having Euler angles (0°, 90°, ψ) and a SiO2 film is formed.
Figure 56:
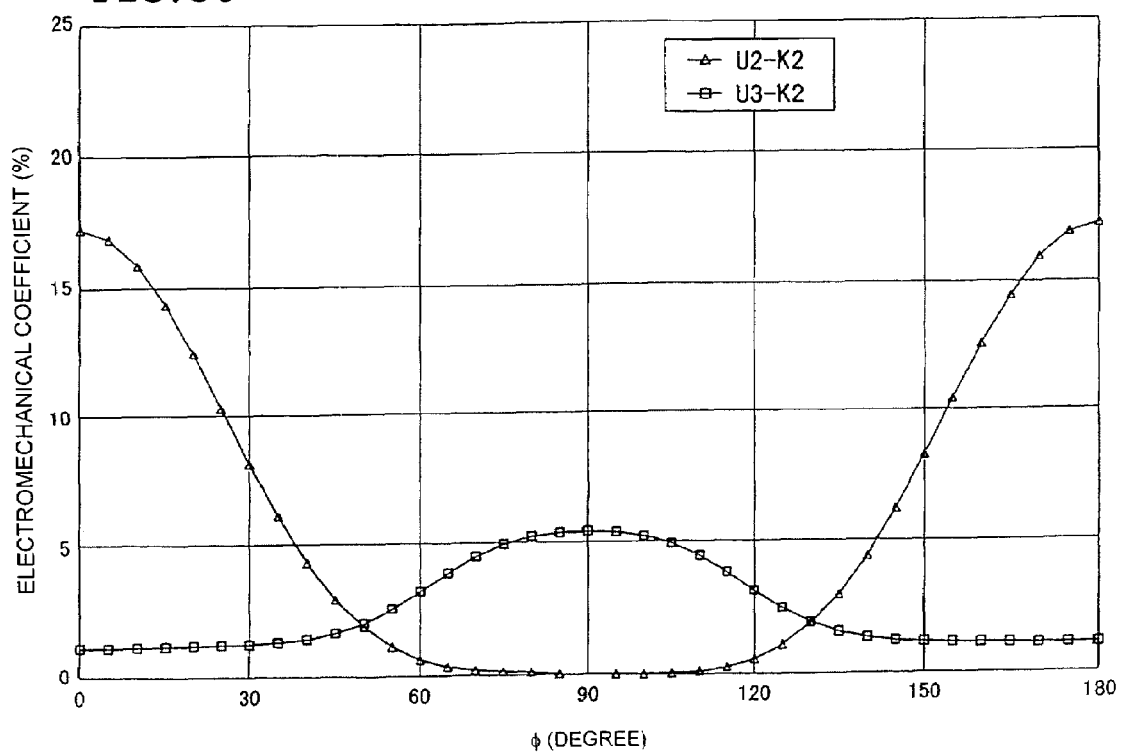
FIG. 56 is a graph showing the relationship between Euler angle ψ and the electromechanical coefficient $k^2$ in the structure in which Au electrodes are formed on a LiNbO₃ substrate having Euler angles (0°, 90°, ψ) and a SiO2 film is formed.
Figure 57:
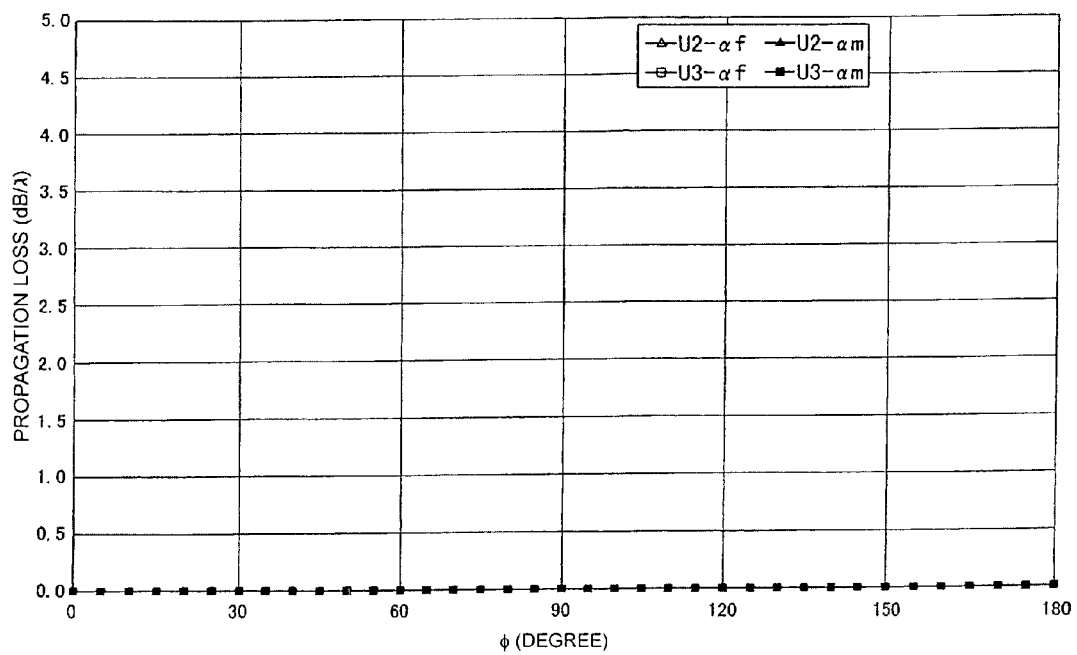
FIG. 57 is a graph showing the relationship between Euler angle ψ and the propagation loss α in the structure in which Au electrodes are formed on a LiNbO₃ substrate having Euler angles (0°, 90°, ψ) and a SiO2 film is formed.
Figure 58:
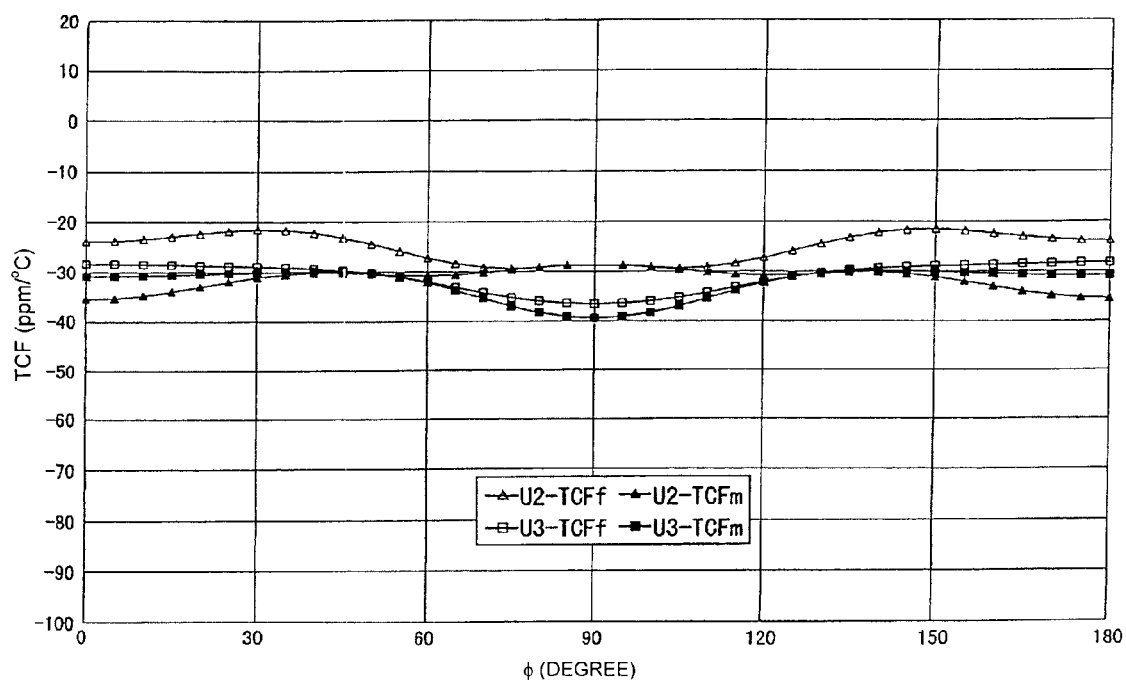
FIG. 58 is a graph showing the relationship between Euler angle ψ and the temperature coefficient of frequency TCF in the structure in which Au electrodes are formed on a LiNbO₃ substrate having Euler angles (0°, 90°, ψ) and a SiO2 film is formed.
Figure 59:
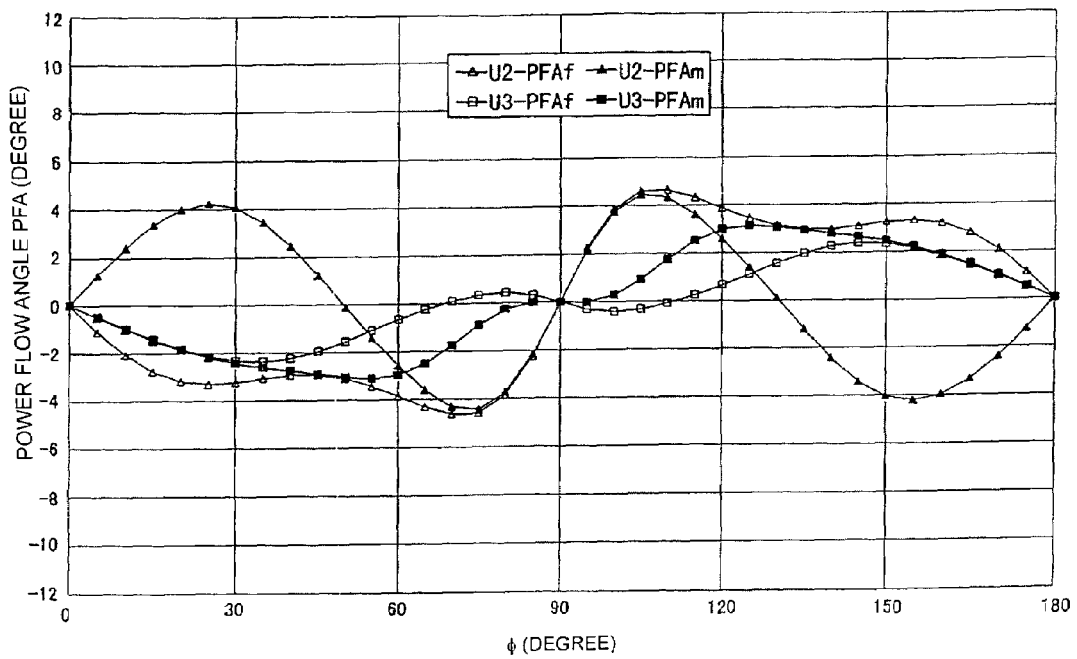
FIG. 59 is a graph showing the relationship between Euler angle ψ and the power flow angle PFA in the structure in which Au electrodes are formed on a LiNbO₃ substrate having Euler angles (0°, 90°, ψ) and a SiO2 film is formed.
Figure 60:
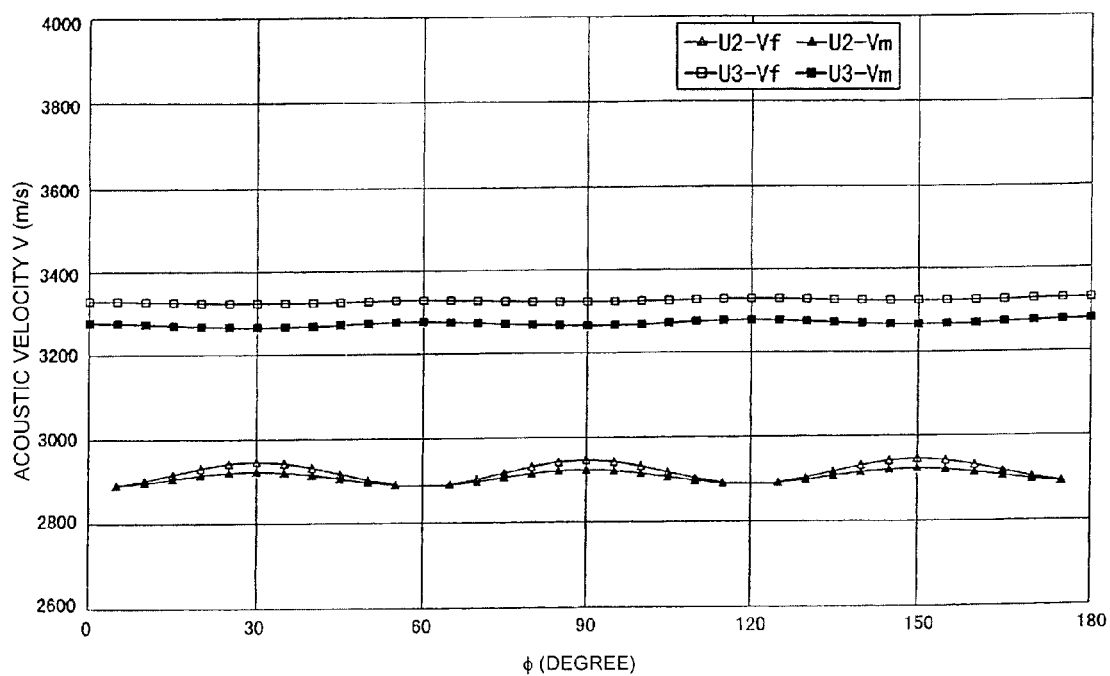
FIG. 60 is a graph showing the relationship between Euler angle ψ and the acoustic velocity V in the structure in which Au electrodes are formed on a LiNbO₃ substrate having Euler angles (90°, 0°, ψ) and a SiO2 film is formed.
Figure 61:
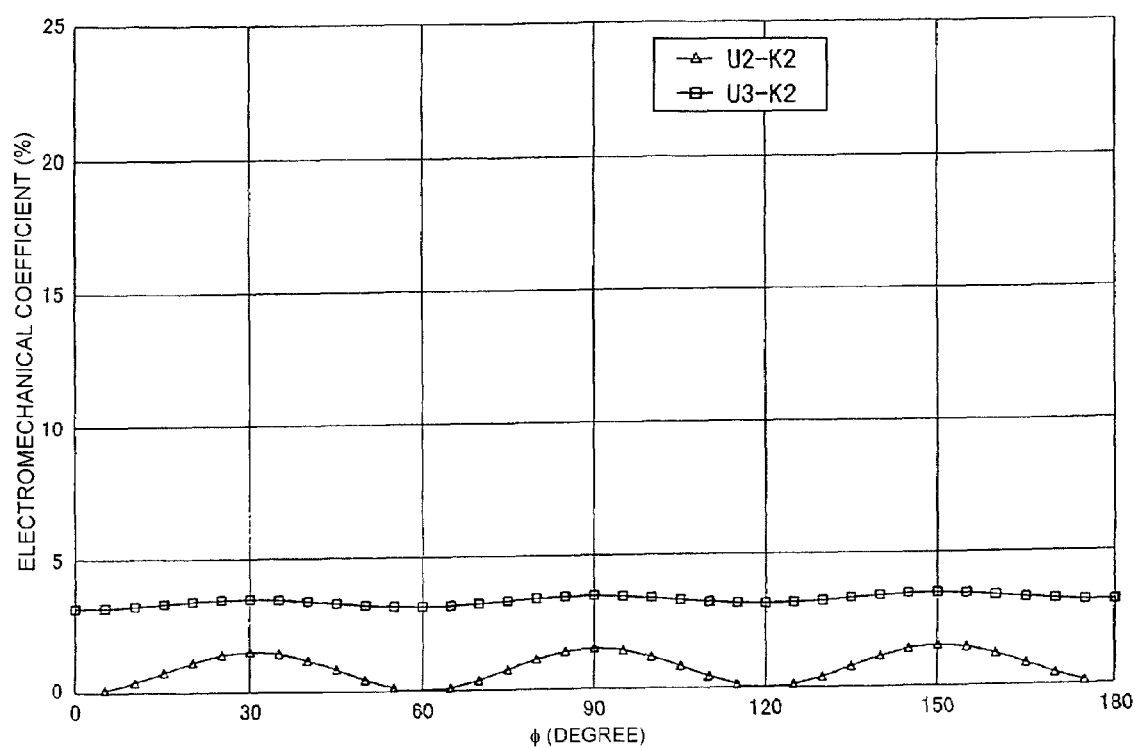
FIG. 61 is a graph showing the relationship between Euler angle ψ and the electromechanical coefficient $k^2$ in the structure in which Au electrodes are formed on a LiNbO₃ substrate having Euler angles (90°, 0°, ψ) and a SiO2 film is formed.
Figure 62:
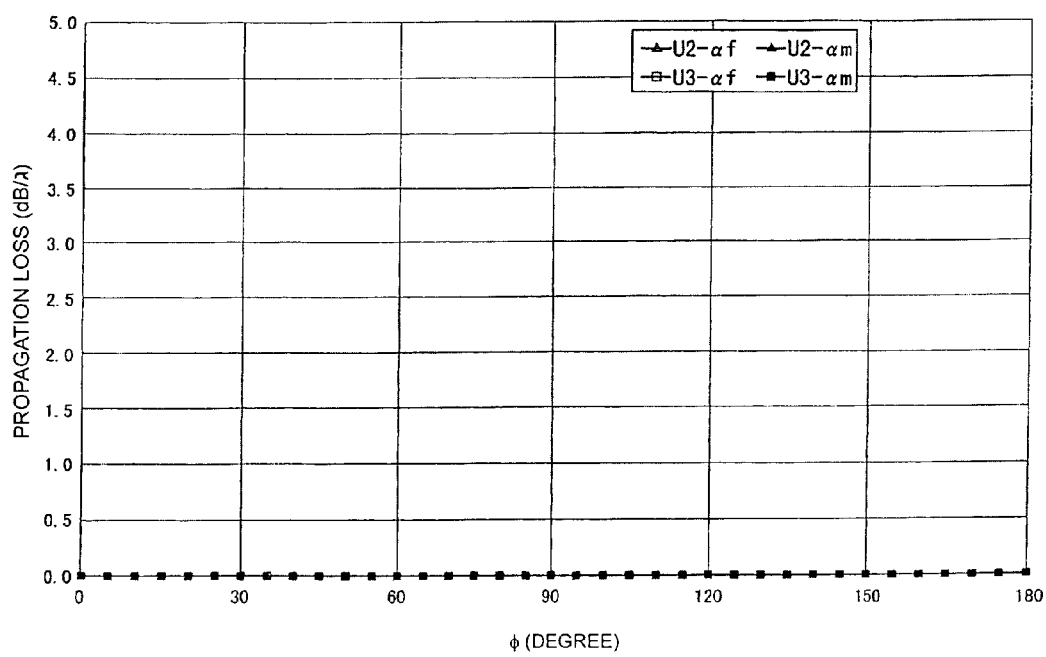
FIG. 62 is a graph showing the relationship between Euler angle ψ and the propagation loss α in the structure in which Au electrodes are formed on a LiNbO₃ substrate having Euler angles (90°, 0°, ψ) and a SiO2 film is formed.
Figure 63:
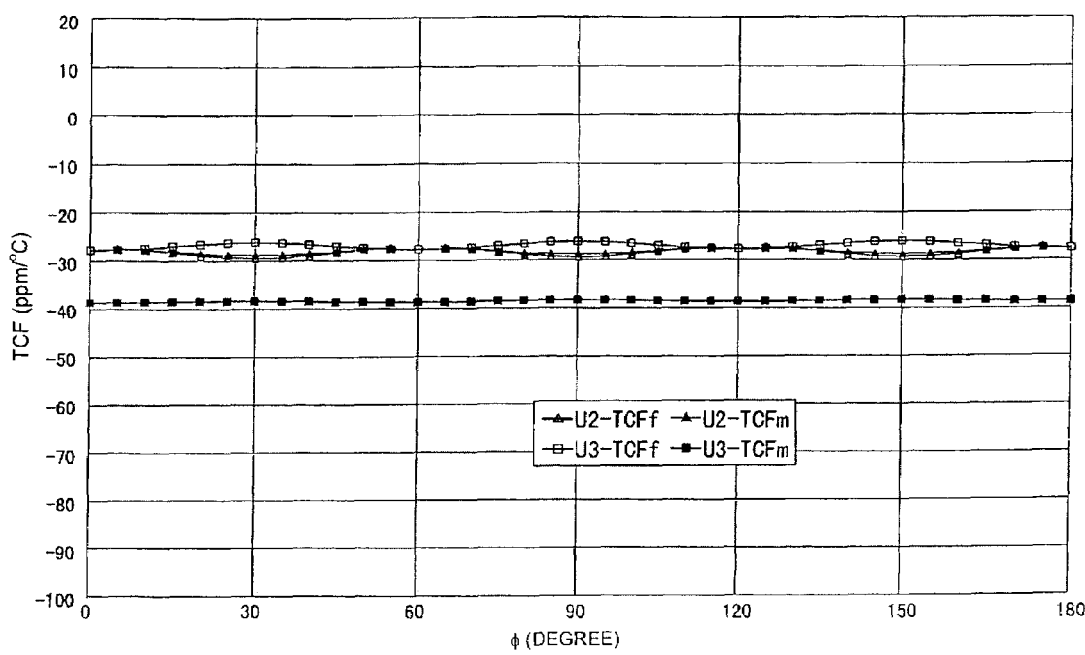
FIG. 63 is a graph showing the relationship between Euler angle ψ and the temperature coefficient of frequency TCF in the structure in which Au electrodes are formed on a LiNbO₃ substrate having Euler angles (90°, 0°, ψ) and a SiO2 film is formed.
Figure 64:
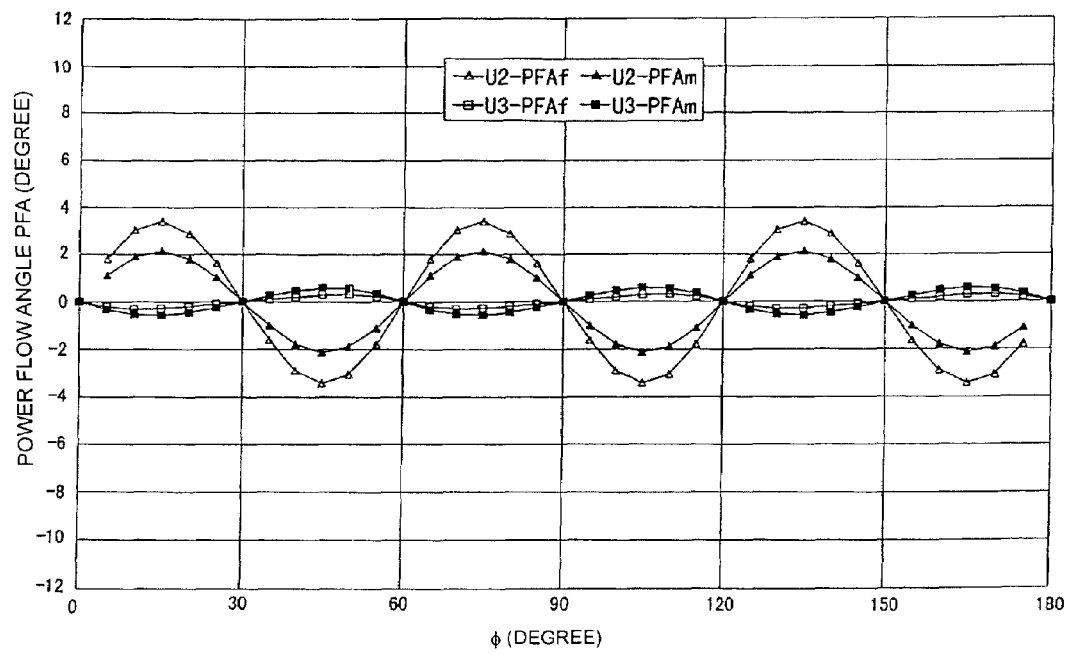
FIG. 64 is a graph showing the relationship between Euler angle ψ and the power flow angle PFA in the structure in which Au electrodes are formed on a LiNbO₃ substrate having Euler angles (90°, 0°, ψ) and a SiO2 film is formed.
Figure 65:
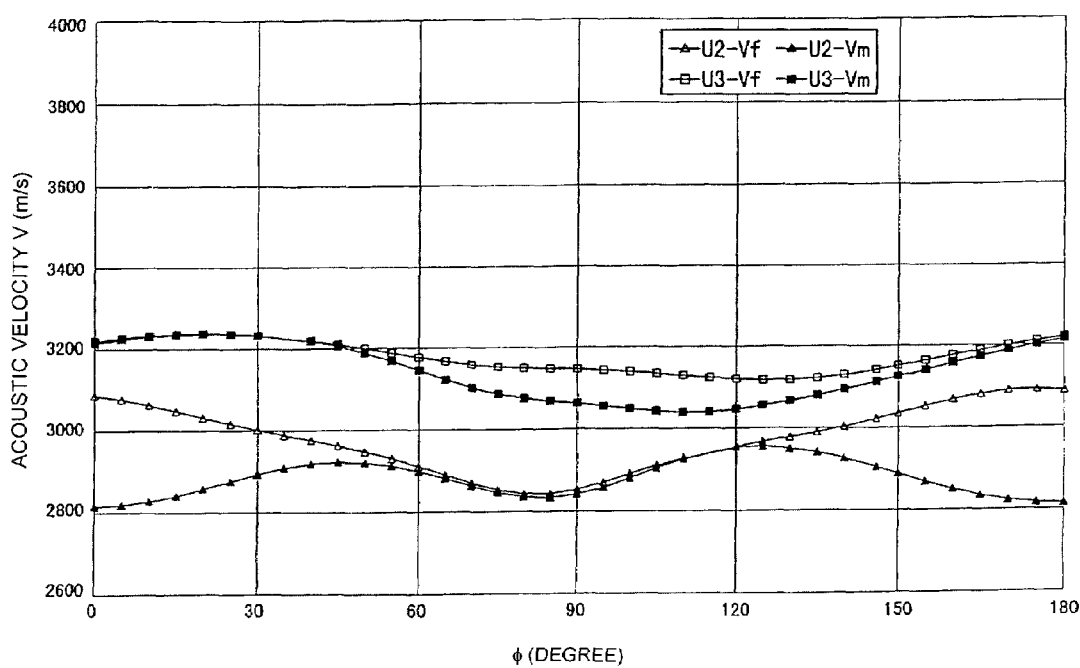
FIG. 65 is a graph showing the relationship between Euler angle ψ and the acoustic velocity V in the structure in which Au electrodes are formed on a LiNbO₃ substrate having Euler angles (90°, 90°, ψ) and a SiO2 film is formed.
Figure 69:
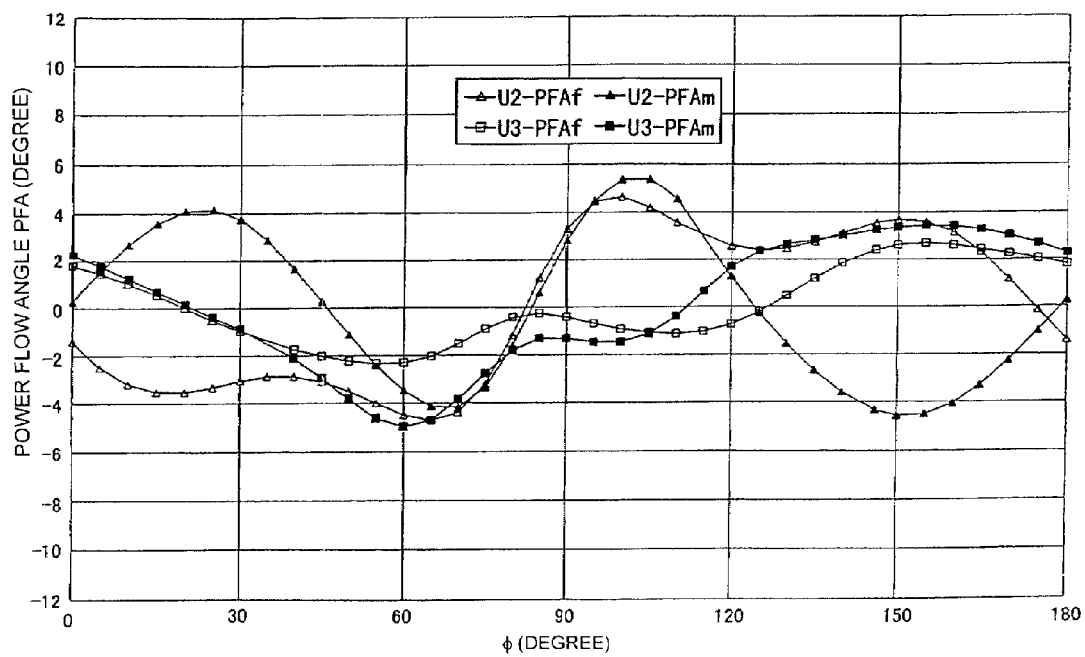
FIG. 69 is a graph showing the relationship between Euler, angle ψ and the power flow angle PFA in the structure in which Au electrodes are formed on a LiNbO₃ substrate having Euler angles (90°, 90°, ψ) and a SiO2 film is formed.

In FIGS. 10 to 69, the results are shown.

In FIGS. 10 to 69, the value provided with a subscript of m indicates the calculated value in a short circuit boundary in which a metal film is disposed between the $SiO_2$ film and the $LiNbO_3$ substrate, and the value provided with a subscript f indicates the calculated value in a virtual free boundary obtained by assuming that the relative dielectric constant of a metal film is 1. The value provided with a prefix U2 indicates the calculated value of the SH type boundary acoustic wave, and the value provided with a prefix U3 indicates the calculated value of the Stoneley wave.

When the electromechanical coefficient $k^2$ of the Stoneley wave is about 2% or less, since the degradation in properties based on the spurious response caused by the Stoneley wave is small, a boundary acoustic wave device using the SH type boundary acoustic wave can be used for relatively limited application. The electromechanical coefficient $k^2$ is more preferably about 1% or less, and in this case, the boundary acoustic wave device can be more widely used. In addition, the electromechanical coefficient $k^2$ of the Stoneley wave is even more preferably about 0.1% or less, and in this case, since influences of the spurious response of the Stoneley wave can be substantially ignored, the boundary acoustic wave device may be used for a filter required to have a large attenuation or a highly precise resonator in which a minute spurious resonant response is not acceptable.

In FIGS. 10 to 69, the Euler angles at which the electromechanical coefficient $k^2$ of the Stoneley wave is about 2% or less are in the range of (0°, 90°, 0°) to (0°, 90°, 50°), (0°, 90°, 130°) to (0°, 90°, 180°), (90°, 90°, 0°) to (90°, 90°, 60°), (90°, 90°, 143°) to (90°, 90°, 180°), (0°, 84°, 0°) to (0°, 120°, 0°), (90°, 68°, 90°) to (90°, 112°, 90°), and (0°, 90°, 0°) to (180°, 90°, 0°); the Euler angles at which $k^2$ of the Stoneley wave is about 1% or less are in the range of (90°, 90°, 0°) to (90°, 90°, 52°), (90°, 90°, 164°) to (90°, 90°, 180°), (0°, 91°, 0°) to (0°, 114°, 0°), (90°, 78°, 90°) to (90°, 102°, 90°), (70, 90°, 0°) to (53°, 90°, 0°), (67°, 90°, 0°) to (113°, 90°, 0°), and (127°, 90°, 0°) to (173°, 90°, 0°); and the Euler angles at which $k^2$ of the Stoneley wave is about 0.1% or less are in the range of (90°, 90°, 200) to (90°, 90°, 40°), and (0°, 100°, 0°) to (0°, 106°, 0°).

By using a $LiNbO_3$ substrate having the Euler angles in one of the ranges described above, a boundary acoustic wave device using the SH type boundary acoustic wave is provided in which the spurious response is very small or the spurious response is not generated at all.

Under all the conditions of the calculated results in FIGS. 10 to 69, the propagation losses U2-αm and U2-αf of the SH type boundary acoustic wave were 0, and superior propagation properties were obtained.

In addition, it is understood that the acoustic velocities U2-Vm of the SH type boundary acoustic wave are primarily in the range of about 3,000 m/second to about 3,400 m/second, and that the change caused by the cut angle is minimal.

Accordingly, with the equation (5) described above, even when the cut angle is changed, an electrode thickness H at which the propagation loss is 0 can be obtained.

In addition, the temperature coefficients of frequency U2-TCFm of the SH type boundary acoustic wave are primarily in the range of about −30 ppm/° C. to about −39 ppm/° C., and that the change caused by the cut angle is minimal. Hence, even when the cut angle is changed in accordance with the above equations (6) to (8), the electrode thickness H can be determined so as to decrease the temperature coefficient of frequency TCF.

In particular, when the Euler angles are in the range of (0°, 90°, 0°) to (0°, 90°, 68°), (0°, 90°, 112°) to (0°, 90°, 180°), (90°, 90°, 0°) to (90°, 90°, 77°), (90°, 90°, 120°) to (90°, 90°, 180°), (0°, 32°, 0°) to (0°, 137°, 0°), (0°, 120°, 90°) to (0°, 154°, 90°), (90°, 38°, 0°) to (90°, 142°, 0°), (90°, 30°, 90°) to (90°, 48°, 90°), (90°, 132°, 90°) to (90°, 149°, 90°), and (0°, 90°, 0°) to (180°, 90°, 0°), U2-TCFm is at least about −35 ppm/° C. and are superior to that obtained by different Euler angles.

In addition, a superior power flow angle U2-PFAm, such as an absolute value of about 1° or less, of the SH type boundary acoustic wave can be obtained when the Euler angles are in the range of (0°, 0°, 0°) to (0°, 0°, 180°), (0°, 90°, 0°) to (0°, 90°, 10°), (0°, 90°, 74°) to (0°, 90°, 106°), (0°, 90°, 170°) to (0°, 90°, 180°), (90°, 0°, 0°) to (90°, 0°, 180°), (90°, 90°, 12°) to (90°, 90°, 31°), (90°, 90°, 106°) to (90°, 90°, 117°), (0°, 0°, 0°) to (0°, 180°, 0°), (0°, 0°, 90°) to (0°, 180°, 90°), (90°, 0≧, 0°) to (90°, 22°, 0°), (90°, 158°, 0°) to (90°, 180°, 0°), (90°, 68°, 90°) to (90°, 112°, 90°), (0°, 0°, 0°) to (180°, 0°, 0°), (0°, 0°, 90°) to (180°, 0°, 90°), (0°, 90°, 00) to (80, 90°, 0°), (52°, 90°, 0°) to (68°, 90°, 0°), (112°, 90°, 0°) to (128°, 90°, 0°), (172°, 90°, 0°) to (180°, 90°, 0°), (0°, 90°, 90°) to (16°, 90°, 90°), (44°, 90°, 90°) to (76°, 90°, 90°), (104°, 90°, 90°) to (136°, 90°, 90°), and (164°, 90°, 90°) to (180°, 90°, 90°).

In addition, when the Euler angles are in the range of (0°, 90°, 0°) to (0°, 90°, 38°), (0°, 90°, 142°) to (0°, 90°, 180°), (90°, 90°, 0°) to (90°, 90°, 36°), (90°, 90°, 140°) to (90°, 90°, 180°), (0°, 55°, 0°) to (0°, 134°, 0°), (90°, 51°, 0°) to (90°, 129°, 0°), and (0°, 90°, 0°) to (180°, 90°, 0°), the electromechanical coefficient $k^2$ of the SH type boundary acoustic wave is at least about 5% which is sufficiently large so as to form an RF filter; when the Euler angles are in the range of (0°, 90°, 0°) to (0°, 90°, 25°), (0°, 90°, 155°) to (0°, 90°, 180°), (90°, 90°, 0°) to (90°, 90°, 23°), (90°, 90°, 151°) to (90°, 90°, 180°), (0°, 67°, 0°) to (0°, 121°, 0°) (90°, 63°, 0°) to (90°, 117°, 0°), and (0°, 90°, 0°) to (180°, 90°, 0°), the electromechanical coefficient $k^2$ is more preferably increased to at least about 10%; and when the Euler angles are in the range of (0°, 90°, 0°) to (0°, 90°, 13°), (0°, 90°, 167°) to (0°, 90°, 180°), (90°, 90°, 0°) to (90°, 90°, 11°), (90°, 90°, 162°) to (90°, 90°, 180°), (0°, 80°, 0°) to (0°, 110°, 0°), (90°, 75°, 0°) to (90°, 105°, 0°), and (0°, 90°, 0°) to (180°, 90°, 0°), the electromechanical coefficient $k^2$ is more preferably increased to at least about 15%.

According to the knowledge of the inventor of the present invention, with superior Euler angles at which $K^2$ of the Stoneley wave is decreased, Euler angles at which U2-TCFm becomes at least about −35 ppm/° C., and Euler angles at which the power flow angle U2-PFAm becomes about 1% or less, even when $\phi$, $\theta$, and $\psi$ are deviated up to approximately 5° from the ranges, superior properties equivalent to those described above are obtained. In addition, the calculated values were obtained when the thickness of the Au electrode was about 0.07λ, and in the case of another electrode material, equivalent results to those described above are also obtained.

Example 4

Figure 87:
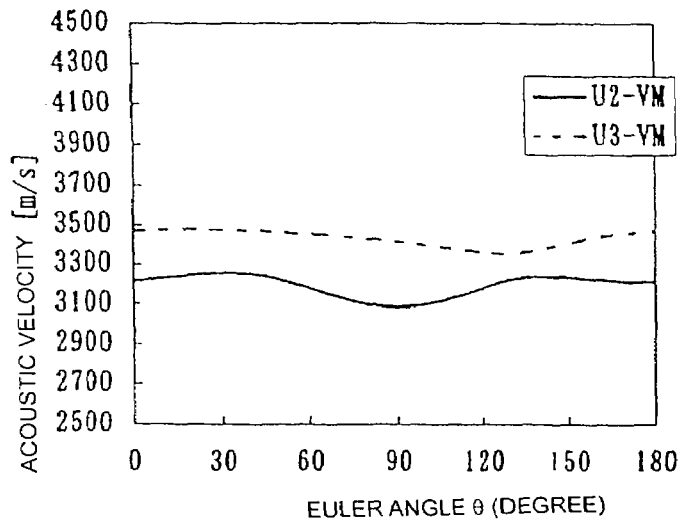
FIG. 87 is a graph showing the relationship of Euler angle θ and the acoustic velocity V in the structure in which an Au electrode 0.05λ thick is formed on a LiNbO₃ substrate having Euler angles (0°, θ, 0°), and a SiO₂ film is further formed in EXAMPLE 4.

A boundary acoustic wave device was formed by forming electrodes made of Au having a thickness of 0.05λ on a $LiNbO_3$ substrate having Euler angles (0°, θ, 0°), and then forming a $SiO_2$ film so as to cover the Au electrodes. In this boundary acoustic wave device, the relationship of the Euler angle θ of the $LiNbO_3$ substrate with the acoustic velocities V, the electromechanical coefficients $k^2$, and the temperature coefficients of frequency TCF of the SH type boundary acoustic wave and the Stoneley wave were measured. The results are shown in FIGS. 87 to 89.

In the entire region indicated by θ=0° to 180°, the propagation loss α was 0 dB/λ and the power flow angle PFA was 0.

Figure 88:
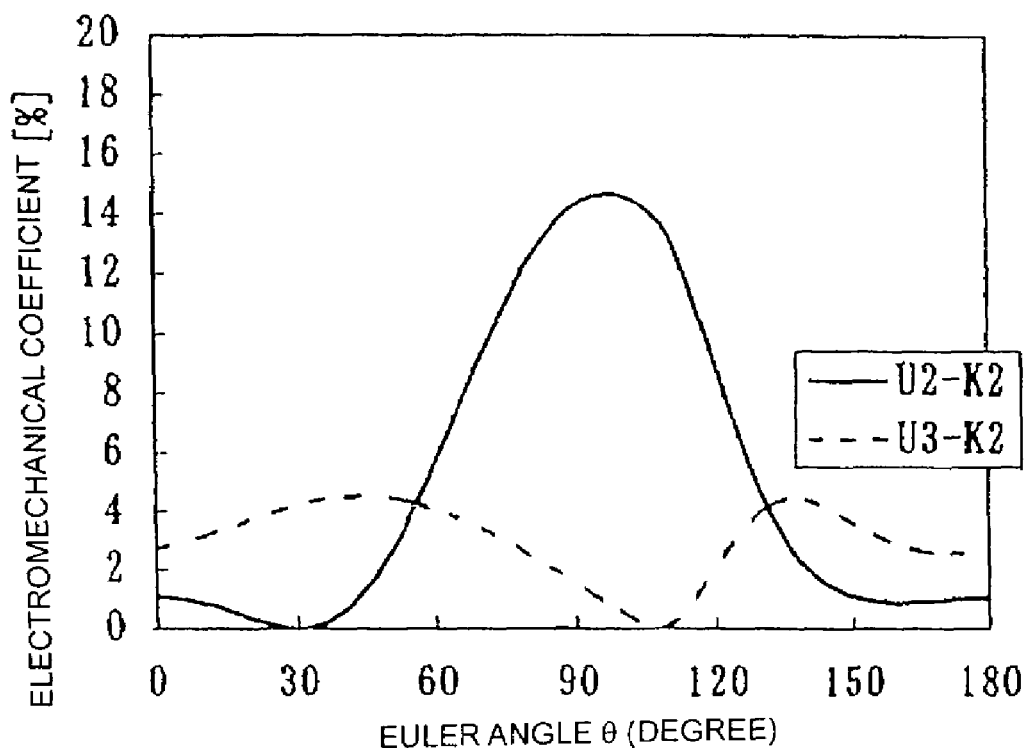
FIG. 88 is a graph showing the relationship of Euler angle θ and the electromechanical coefficient k² in the structure in which an Au electrode 0.05λ thick is formed on a LiNbO₃ substrate having Euler angles (0°, θ, 0°), and a SiO₂ film is further formed in EXAMPLE 4.
Figure 89:
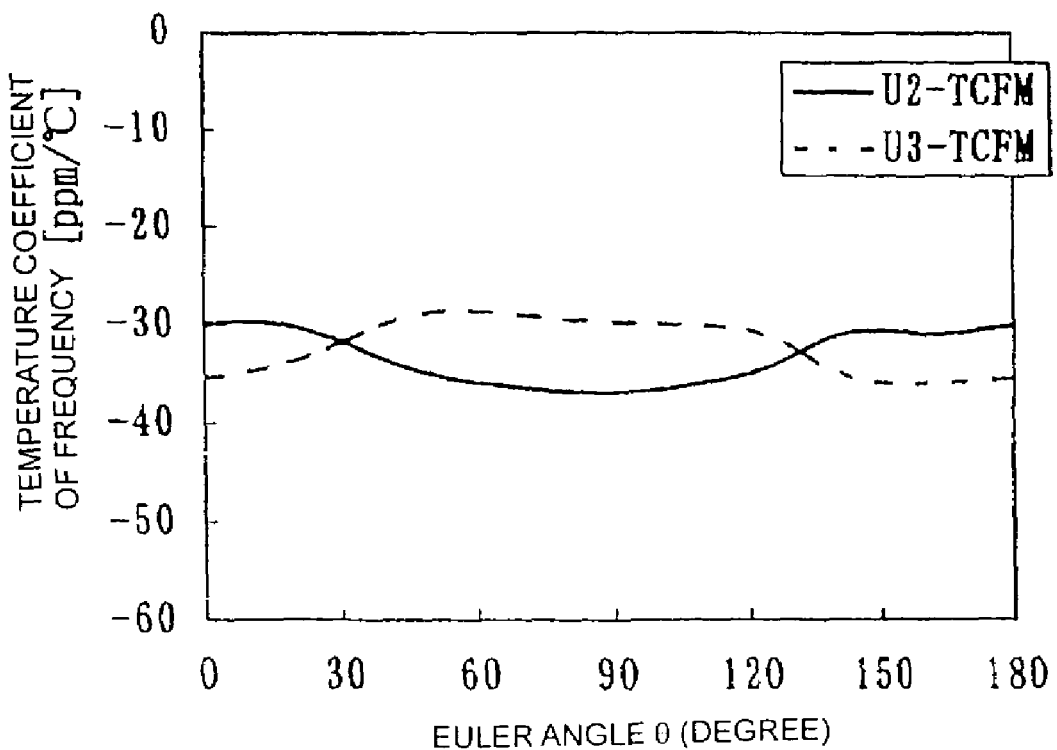
FIG. 89 is a graph showing the relationship of Euler angle θ and the temperature coefficient of frequency TCF in the structure in which an Au electrode 0.05λ thick is formed on a LiNbO₃ substrate having Euler angles (0°, θ, 0°), and a SiO₂ film is further formed in EXAMPLE 4.

As can be seen from FIG. 88, when the SH type boundary acoustic wave is used when θ is about 106°, the electromechanical coefficient $k^2$ of the Stoneley wave, which causes a spurious response, becomes approximately 0.

Next, a boundary acoustic wave device was formed by forming electrodes made of Au having a thickness of about 0.06λ on a $LiNbO_3$ substrate having Euler angles (0°, θ, ψ), and then forming a SiO$_2$ film on the electrodes made of Au. In this boundary acoustic wave device, the relationship of the Euler angles θ and ψ of the LiNbO$_3$ substrate with the acoustic velocities V, the electromechanical coefficients k$^2$, the propagation losses α, and the temperature coefficients of frequency TCF of the SH type boundary acoustic wave and the Stoneley wave were measured. The results of the SH type boundary acoustic wave are shown in FIG. 77, and the results of the Stoneley wave are shown in FIG. 78.

Figure 77:
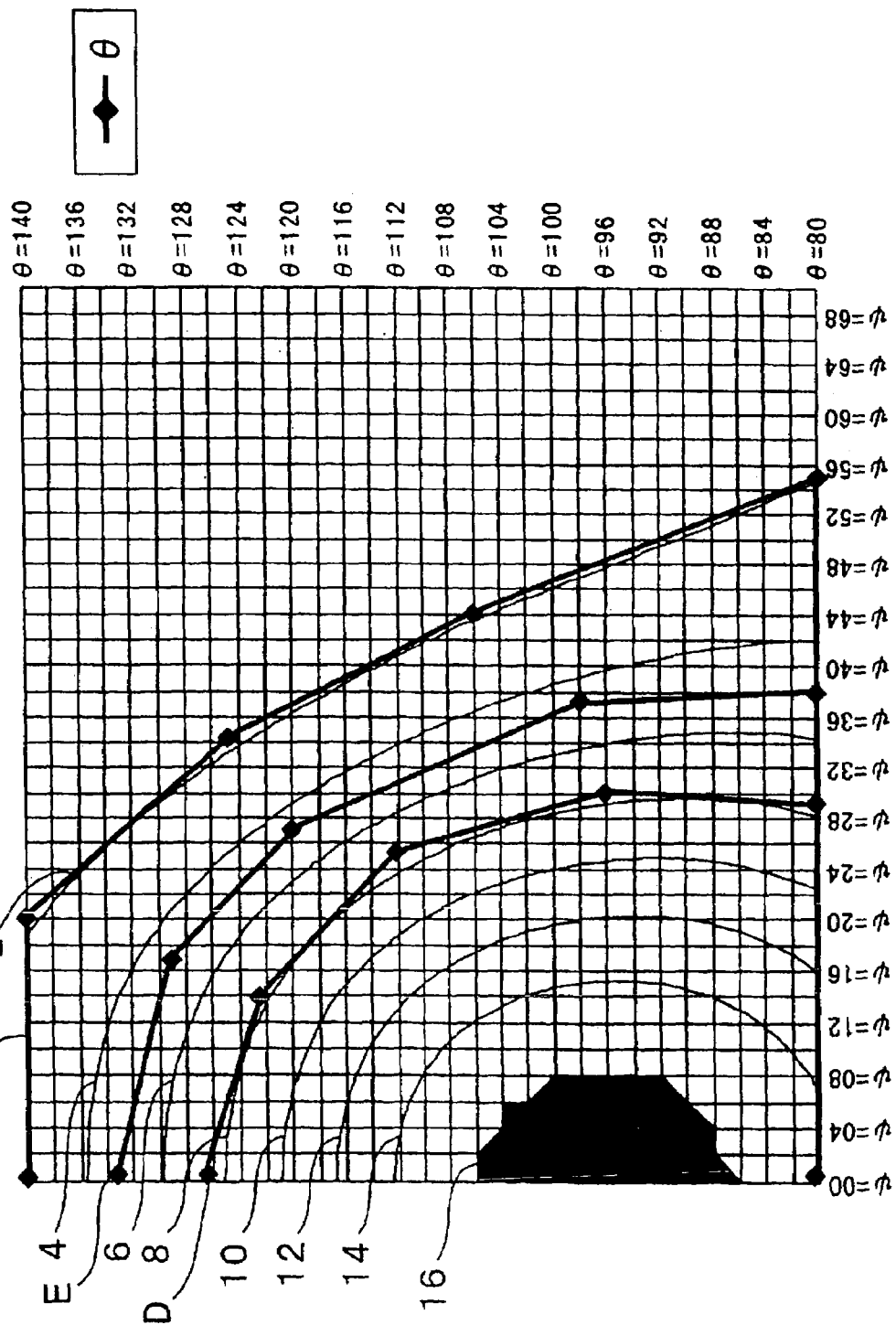
FIG. 77 is a graph showing the relationship of Euler angles θ and ψ and the electromechanical coefficient $k^2$ of an SH boundary acoustic wave in the structure in which an Au electrode 0.06λ thick is formed on a LiNbO₃ substrate having Euler angles (0°, θ, ψ), and a SiO₂ film is further formed in EXAMPLE 4.
Figure 78:
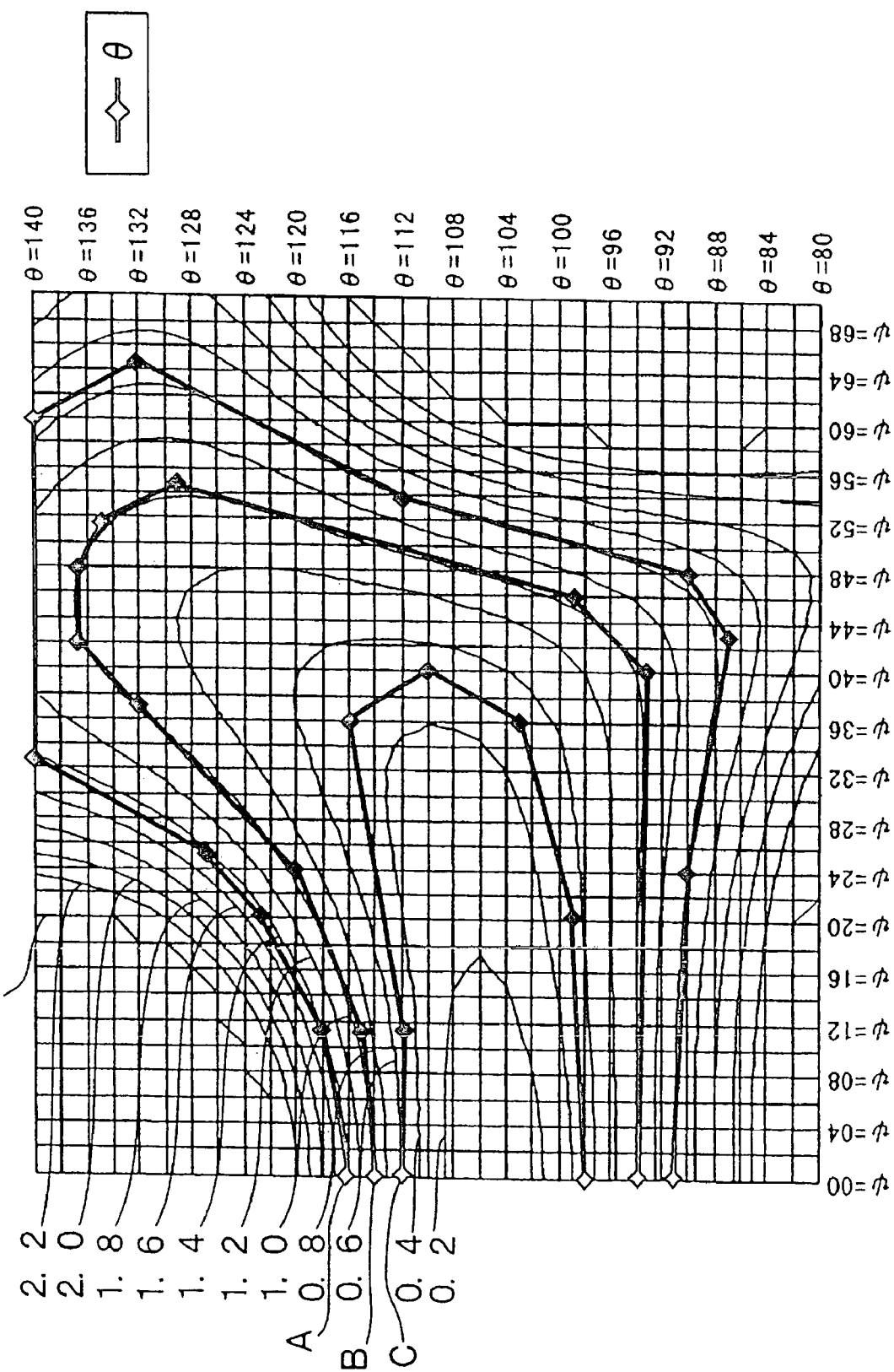
FIG. 78 is a graph showing the relationship of Euler angles θ and ψ and the electromechanical coefficient $k^2$ of a Stoneley wave in the structure in which an Au electrode 0.06λ thick is formed on a LiNbO₃ substrate having Euler angles (0°, θ, ψ), and a SiO₂ film is further formed in EXAMPLE 4.
Figure 79:
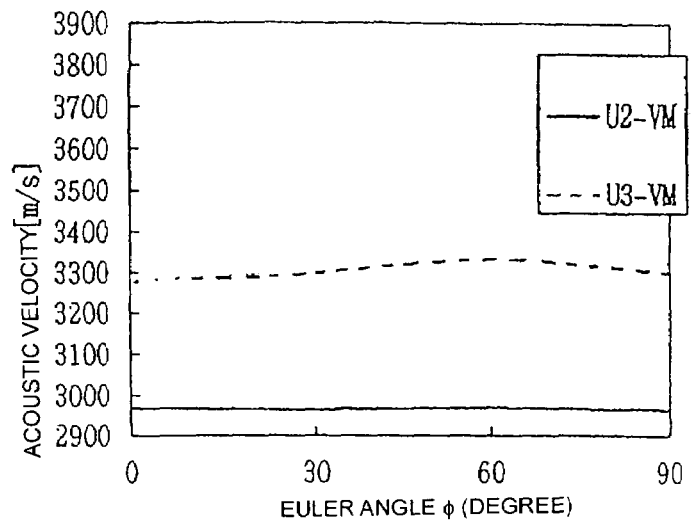
FIG. 79 is a graph showing the relationship between Euler angle φ and the acoustic velocities V of an SH boundary acoustic wave and a Stoneley wave obtained when a LiNbO₃ substrate having Euler angles (φ, 105°, 0°) is used in EXAMPLE 5.
Figure 80:
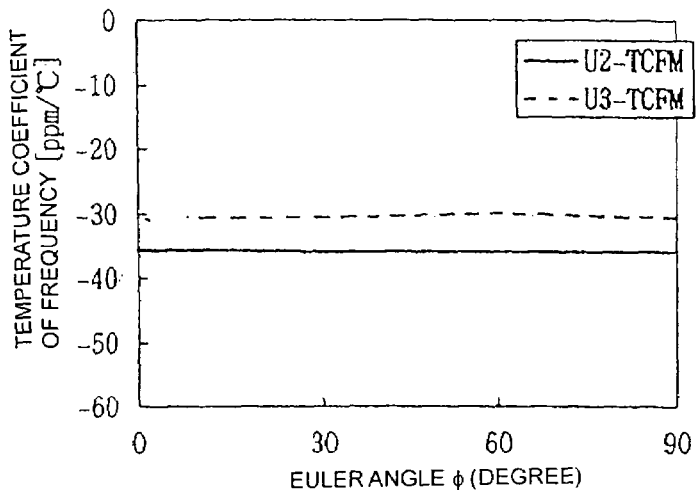
FIG. 80 is a graph showing the relationship between Euler angle φ and the temperature coefficient of frequency TCF obtained when a LiNbO₃ substrate having Euler angles (φ, 105°, 0°) is used in EXAMPLE 5.
Figure 81:
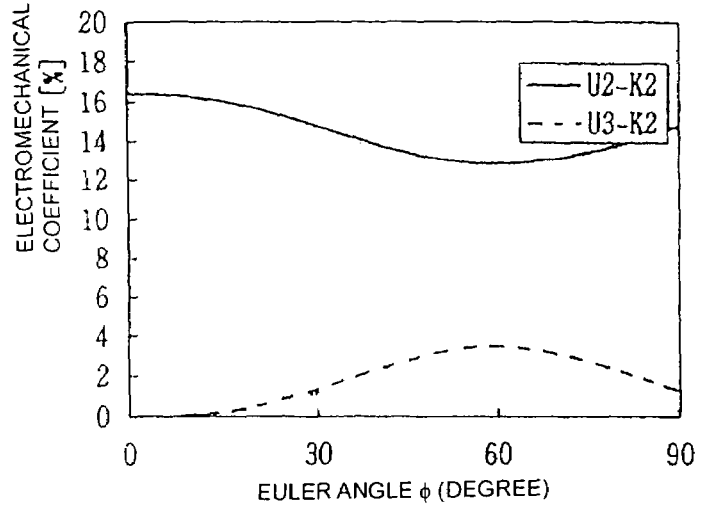
FIG. 81 is a graph showing the relationship between Euler angle φ and the electromechanical coefficient k² obtained when a LiNbO₃ substrate having Euler angles (φ, 105°, 0°) is used in EXAMPLE 5.
Figure 82:
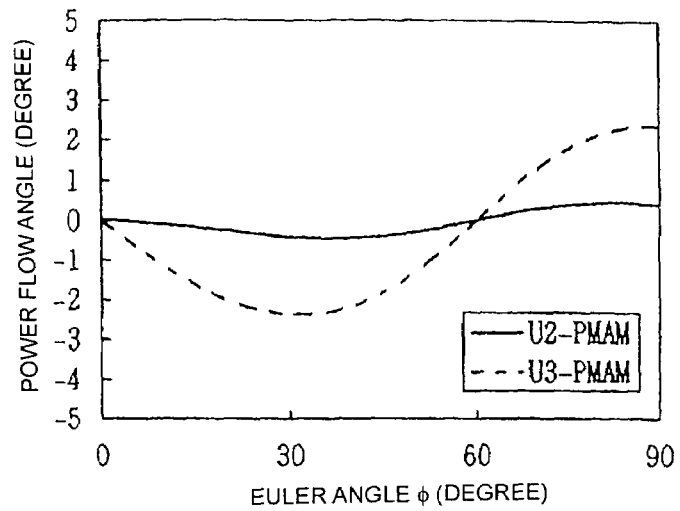
FIG. 82 is a graph showing the relationship between Euler angle φ and the power flow angle obtained when a LiNbO₃ substrate having Euler angles (φ, 105°, 0°) is used in EXAMPLE 5.
Figure 83:
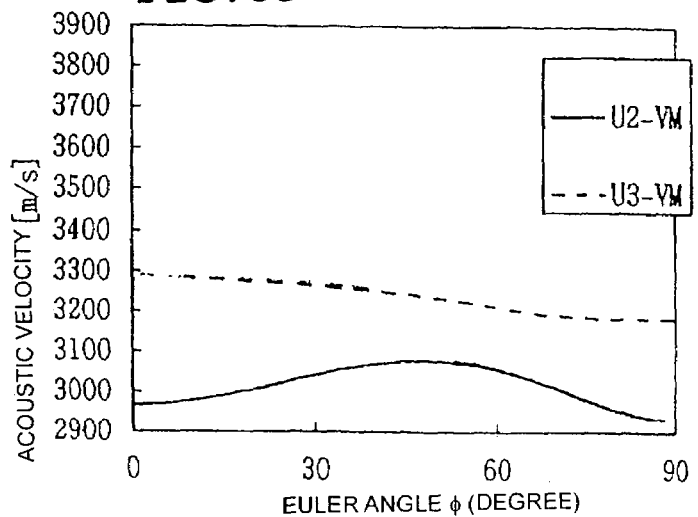
FIG. 83 is a graph showing the relationship between Euler angle φ and the acoustic velocities V of an SH boundary acoustic wave and a Stoneley wave obtained when a LiNbO₃ substrate having Euler angles (0°, 105°, ψ) is used in EXAMPLE 5.
Figure 84:
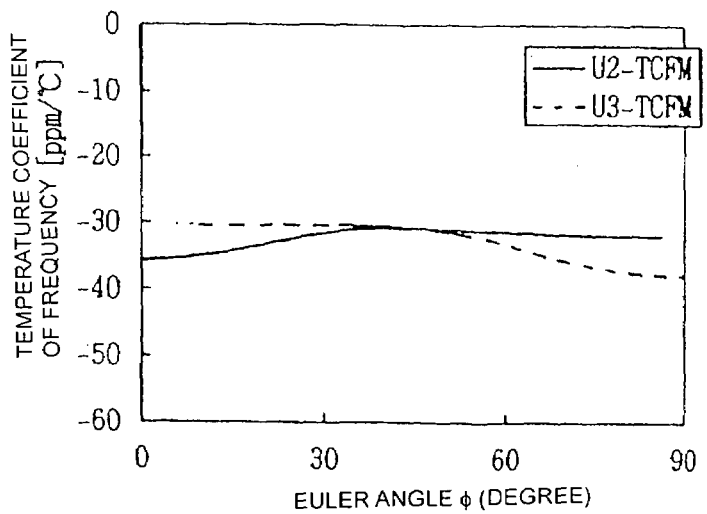
FIG. 84 is a graph showing the relationship between Euler angle φ and the temperature coefficient of frequency TCF obtained when a LiNbO₃ substrate having Euler angles (0°, 105°, ψ) is used in EXAMPLE 5.
Figure 85:
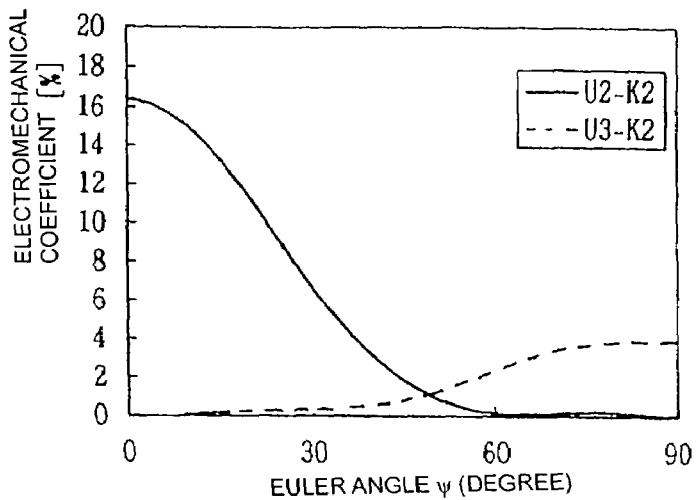
FIG. 85 is a graph showing the relationship between Euler angle φ and the electromechanical coefficient k² obtained when a LiNbO₃ substrate having Euler angles (0°, 105°, ψ) is used in EXAMPLE 5.
Figure 86:
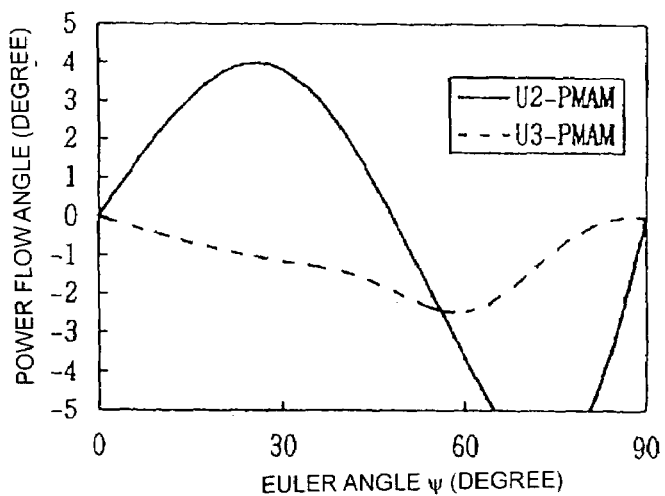
FIG. 86 is a graph showing the relationship between Euler angle φ and the power flow angle obtained when a LiNbO₃ substrate having Euler angles (0°, 105°, ψ) is used in EXAMPLE 5.

In the entire regions shown in FIGS. 77 and 78, the propagation loss α was 0 dB/λ. In addition, as for the acoustic velocities V and the temperature coefficients of frequency TCF, with respect to the condition at which φ is 0° shown in FIGS. 87 to 89, a significant change was not observed. Hence, in FIGS. 77 and 78, only the results of the electromechanical coefficient k$^2$ (%) are shown.

As shown in FIG. 78, the electromechanical coefficient k$^2$, which is the response of the Stoneley wave, is small, such as about 1.5% or less, in a region surrounded by points from A01 to A13 shown in Table 4 below. In addition, in a region surrounded by points from B01 to B12 shown in Table 5 below, the electromechanical coefficient k$^2$ is preferably decreased to about 1.0% or less, and in a region surrounded by points from C01 to C08 shown in Table 6 below, k$^2$ is more preferably decreased to about 0.5% or less. In addition, at Euler angles (0°, 106°, 0°), the electromechanical coefficient k$^2$, that is, the response of the Stoneley wave, is approximately 0%.

TABLE 4

| POINT | ψ(°) | θ(°) |
| --- | --- | --- |
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |
| A13 | 0 | 116 |

TABLE 5

| POINT | ψ(°) | θ(°) |
| --- | --- | --- |
| B01 | 0 | 114 |
| B02 | 11 | 115 |
| B03 | 24 | 120 |
| B04 | 37 | 132 |
| B05 | 42 | 137 |
| B06 | 48 | 137 |
| B07 | 52 | 135 |
| B08 | 55 | 129 |
| B09 | 46 | 99 |
| B10 | 40 | 93 |
| B11 | 0 | 94 |
| B12 | 0 | 114 |

TABLE 6

| POINT | ψ(°) | θ(°) |
| --- | --- | --- |
| C01 | 0 | 112 |
| C02 | 11 | 112 |

TABLE 6-continued

| POINT | ψ(°) | θ(°) |
| --- | --- | --- |
| C03 | 36 | 116 |
| C04 | 40 | 110 |
| C05 | 36 | 103 |
| C06 | 20 | 99 |
| C07 | 0 | 98 |
| C08 | 0 | 112 |

As shown in FIG. 77, the electromechanical coefficient k$^2$ of the SH type boundary acoustic wave is large, such as at least about 2%, in a region surrounded by points F01 to F06 in Table 9 below; the electromechanical coefficient k$^2$ is preferably increased to at least about 5% in a region surrounded by points E01 to E07 in Table 8 below; and the electromechanical coefficient k$^2$ is even more preferably increased to at least about 10% in a region surrounded by points D01 to D07 in Table 7 below and becomes maximum at Euler angles (0°, 97°, 0°).

TABLE 7

| POINT | ψ(°) | θ(°) |
| --- | --- | --- |
| D01 | 0 | 126 |
| D02 | 13 | 123 |
| D03 | 25 | 112 |
| D04 | 30 | 96 |
| D05 | 29 | 80 |
| D06 | 0 | 80 |
| D07 | 0 | 126 |

TABLE 8

| POINT | ψ(°) | θ(°) |
| --- | --- | --- |
| E01 | 0 | 133 |
| E02 | 16 | 129 |
| E03 | 27 | 120 |
| E04 | 37 | 98 |
| E05 | 38 | 80 |
| E06 | 0 | 80 |
| E07 | 0 | 133 |

TABLE 9

| POINT | ψ(°) | θ(°) |
| --- | --- | --- |
| F01 | 20 | 140 |
| F02 | 34 | 125 |
| F03 | 44 | 106 |
| F04 | 55 | 80 |
| F05 | 0 | 80 |
| F06 | 20 | 140 |

In addition, under the conditions shown in Tables 4 to 9, it was confirmed that even when Ag, Cu, Al, Fe, Ni, W, Ta, Pt, Mo, Cr, Ti, ZnO, or ITO is used as the electrode material, instead of Au, superior properties are also be obtained as described above.

In addition, in FIGS. 77 and 78 and Tables 4 to 9, it was confirmed that when −ψ is substituted for ψ, or θ+180° is substituted for θ, for example, a plus or a minus sign of the power flow angle is merely reversed, and superior properties are also be obtained as described above.

Example 5

Boundary acoustic wave devices were formed by forming electrodes made of Au having a thickness of about 0.06λ on respective LiNbO$_3$ substrates having Euler angles (φ, 105°, 0°) and (0°, 105°, ψ) and then forming SiO$_2$ films so as to cover the Au electrodes. In the case described above, the relationship of the Euler angles φ and ψ of the LiNbO$_3$ substrates with the acoustic velocities V, the electromechanical coefficients k$^2$, the propagation losses α, the temperature coefficients of frequency TCF, and the power flow PFAs of the SH type boundary acoustic wave and the Stoneley wave were measured. FIGS. 79 to 82 show the results obtained when the LiNbO$_3$ substrate having Euler angles (φ, 105°, 0°) was used, and FIGS. 83 to 86 show the results obtained when the LiNbO$_3$ substrate having Euler angles (0°, 105°, ψ) was used. In the entire region indicated by θ=0° to 90°, the propagation loss α is 0 dB/λ.

As shown in FIGS. 79 to 82, the electromechanical coefficient k$^2$ of the Stoneley wave is small, such as about 1.5% or less, in the range indicated by φ=0° to 31°; k$^2$ of the Stoneley wave is further decreased to about 1.0% or less in the range indicated by φ=0° to 26°; and k$^2$ of the Stoneley wave is decreased to about 0.5% or less in the range indicated by φ=0° to 19°.

In addition, the electromechanical coefficient k$^2$ of the Stoneley wave becomes approximately 0% when φ=0° is maintained, and thus, that the spurious response caused by the Stoneley wave is decreased. Furthermore, in the range indicated by φ=0° to 90°, TCF of the SH boundary acoustic wave is preferably in the range of about −37 to about −35 ppm/° C.

In addition, it was confirmed that in both cases in which the Euler angles are (φ, 105°, 0°) and (−φ, 105°, 0°), results equivalent to each other are obtained.

In addition, as shown in FIGS. 83 to 86, the electromechanical coefficient k$^2$ of the Stoneley wave is small, such as about 1.5% or less, in the range in which ψ is 0° to 53°; the electromechanical coefficient k$^2$ of the Stoneley wave is further decreased to about 1.0% or less in the range in which ψ is 0° to 47°; and the electromechanical coefficient k$^2$ of the Stoneley wave is decreased to about 0.5% or less in the range in which ψ is 0° to 38°. When ψ is 0°, the electromechanical coefficient k$^2$ of the Stoneley wave is decreased to approximately 0%, and thus, the spurious response caused by the Stoneley wave is decreased. In addition, in the range in which ψ is 0° to 90°, a superior TCF of the SH boundary acoustic wave having about −35 to about −31 ppm/° C. is obtained.

In addition, it was confirmed that when the Euler angles are (0°, 105°, ψ) and (0°, 105°, −ψ), for example, a plus or a minus sign of the power flow angle is merely reversed, and that properties equivalent to each other are obtained.

Example 6

Figure 70:
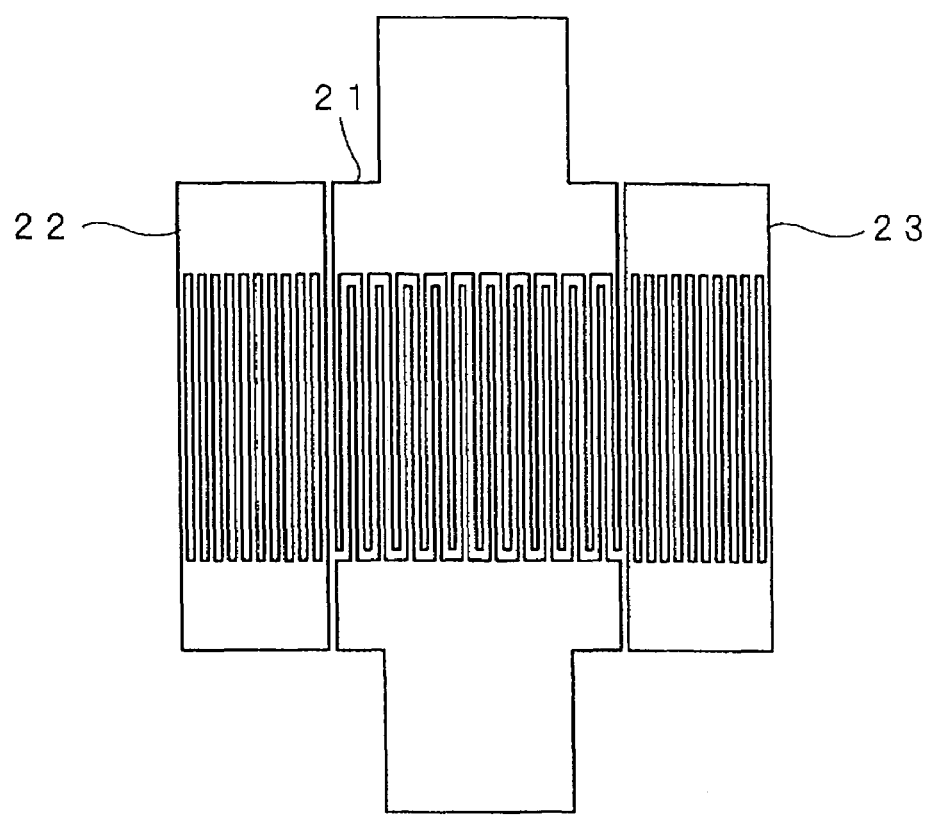
FIG. 70 is a schematic plan view of an electrode structure of an SH type boundary acoustic wave resonator prepared in EXAMPLE 6.
Figure 71:
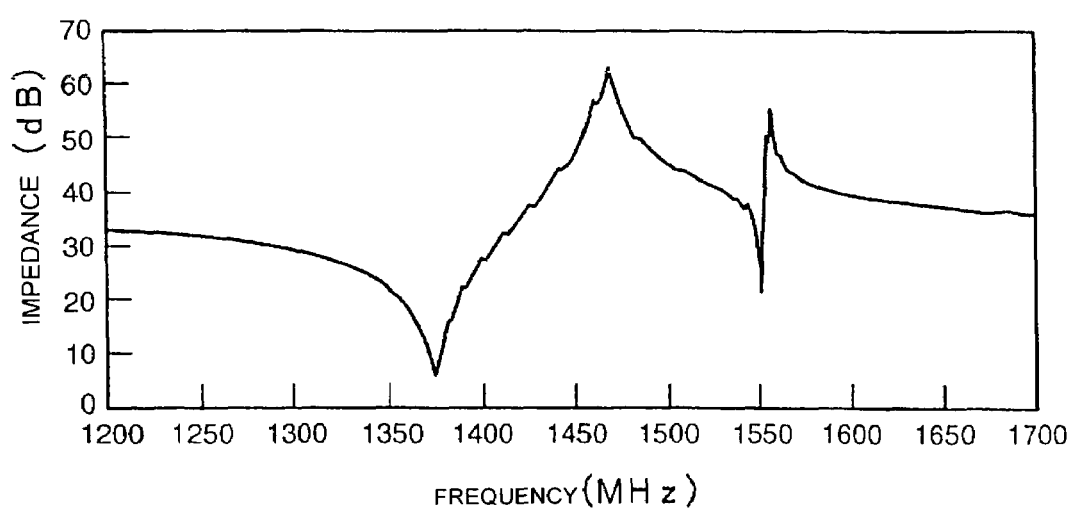
FIG. 71 is a graph showing the impedance properties obtained in the case in which LiNbO₃ having Euler angle (0°, 90°, 0°) is used in EXAMPLE 6.

Under the conditions shown in Table 10 below, an SH type boundary acoustic wave resonator was formed. FIG. 70 is a schematic plan view showing an electrode structure of the SH type boundary acoustic wave resonator of this preferred embodiment. In this structure, on both sides of an IDT 21, reflectors 22 and 23 were provided. The impedance properties obtained when a LiNbO$_3$ having Euler angles (0°, 90°, 0°) was used are as shown in FIG. 71. The impedance ratio (ratio between the maximum and the minimum absolute values of impedances of the resonator) is about 56.8 dB, and the difference between resonance frequency and antiresonance frequency (value obtained by dividing the absolute value of the difference between the resonant frequency and the antiresonant frequency by the resonant frequency) is about 6.9%.

Figure 72:
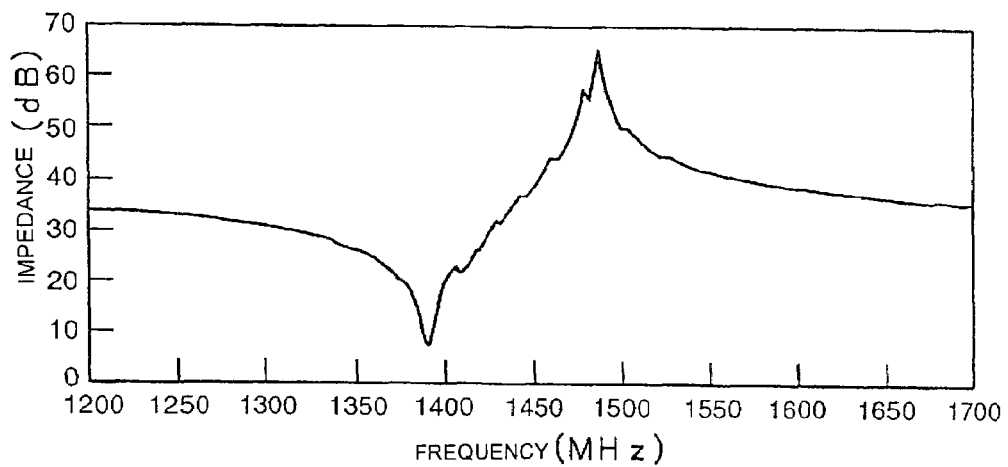
FIG. 72 is a graph showing the impedance properties obtained in the case in which LiNbO₃ having Euler angles (0°, 105°, 0°) is used in EXAMPLE 6.

The impedance properties obtained when a LiNbO$_3$ having Euler angles (0°, 105°, 0°) was used are as shown in FIG. 72. The impedance ratio is about 59.4 dB, the difference between resonance frequency and antiresonance frequency is about 6.8%, and the TCF is about 31 ppm/° C.

When a LiNbO$_3$ is used having Euler angles in the range in which the electromechanical coefficient of the SH type boundary acoustic wave is increased, Euler angles in the range in which the electromechanical coefficient of the Stoneley wave is decreased, Euler angles in the range in which temperature coefficient of frequency TCF of the SH type boundary acoustic wave is decreased, and Euler angles in the range in which the power flow angle of the SH type boundary acoustic wave is decreased, an SH boundary acoustic wave resonator having superior resonant properties is provided in which the Stoneley spurious response is not generated.

Figure 73:
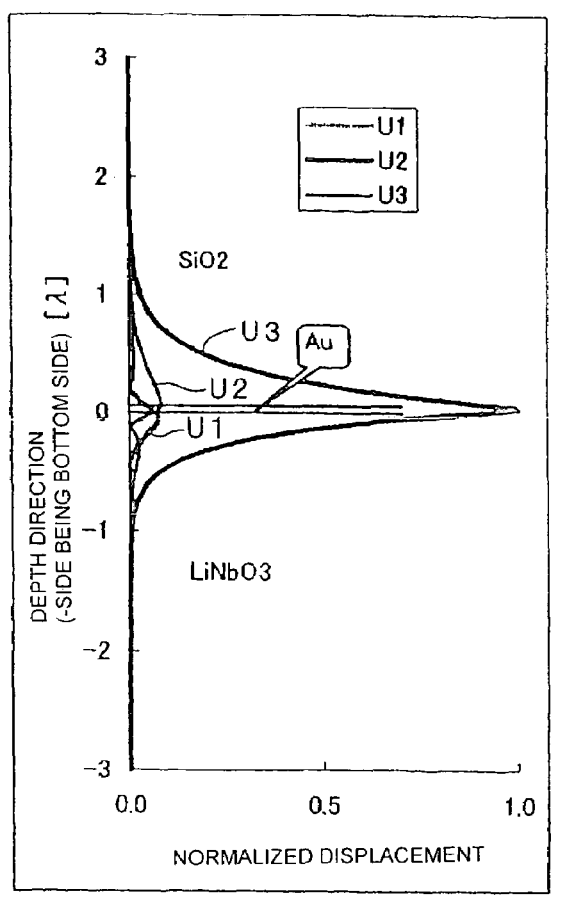
FIG. 73 is a graph showing calculated values of displacement components U1, U2, and U3 of an SH type boundary acoustic wave in a boundary acoustic wave device of EXAMPLE 6.
Figure 74A:
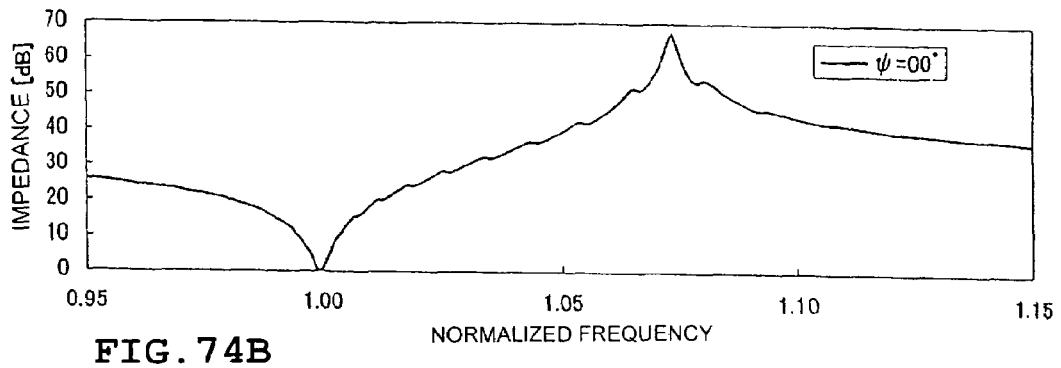
FIGS. 74A to 74D includes graphs showing the impedance properties in the case in which LiNbO₃ having Euler angles (90°, 90°, ψ) is used at ψ in the range of 0° to 35° in EXAMPLE 7.
Figure 74B:
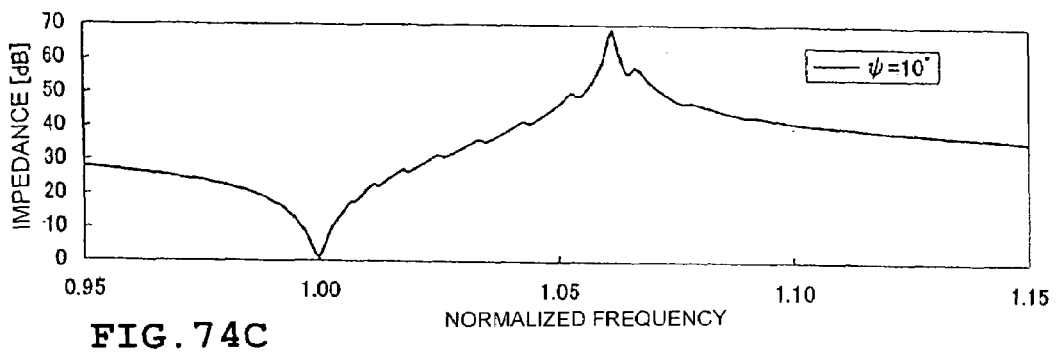
Figure 74C:
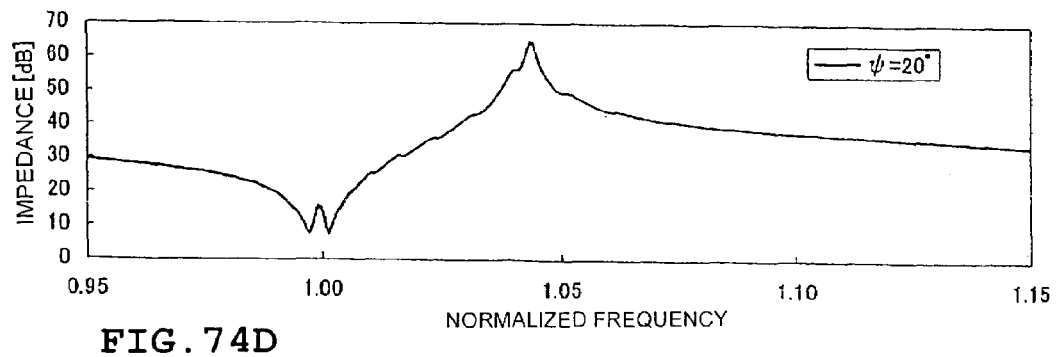
Figure 74D:
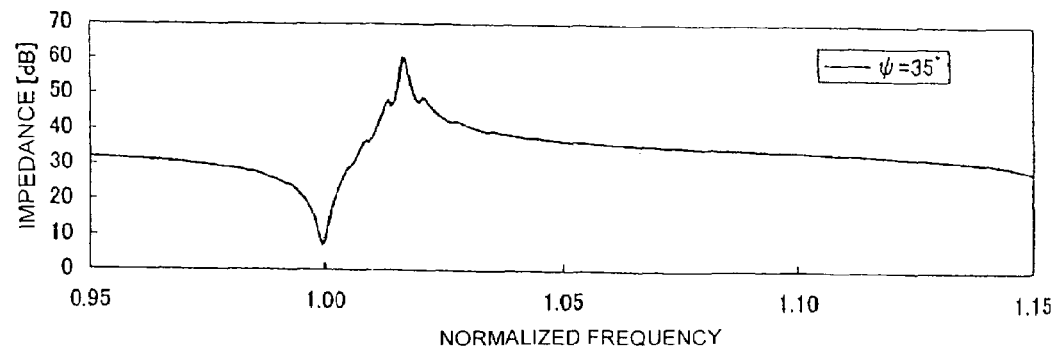

The calculated values of displacement components U1, U2, and U3 of this SH type boundary acoustic wave are shown in FIG. 73. As shown in FIG. 73, the displacements are concentrated around the Au which is the boundary layer and are distributed while leaking into the SiO$_2$ and the LiNbO$_3$. Accordingly, when the electrode thickness is reduced as described above, the SH boundary acoustic wave is affected by the SiO$_2$ and LiNbO$_3$ each having high acoustic velocities, and as a result, the acoustic velocity of the SH type boundary acoustic wave cannot be decreased to less than that of the slow transverse wave of the SiO$_2$. On the other hand, when the electrode thickness is increases in accordance with the condition represented by the equation (5), the acoustic velocity of the SH type boundary acoustic wave can be decreased to less than that of the slow transverse wave of the SiO$_2$.

TABLE 10

| ITEMS | DETAILS |
| --- | --- |
| STRUCTURE | SiO$_2$/Au/LiNbO$_3$ |
| SiO$_2$ THICKNESS | 3 λ |
| Au THICKNESS | 0.055 λ |
| IDT, REFLECTOR PERIOD λ | 2.2 μm |
| IDT CONFIGURATION | NORMAL TYPE SINGLE STRIP, 50 PAIRS, OPEN LENGTH OF 31 λ, CROSS WIDTH of 30 λ |
| REFLECTOR CONFIGURATION | NORMAL TYPE SINGLE STRIP, 51 STRIPS, OPEN LENGTH OF 31 λ |

Example 7

Figure 66:
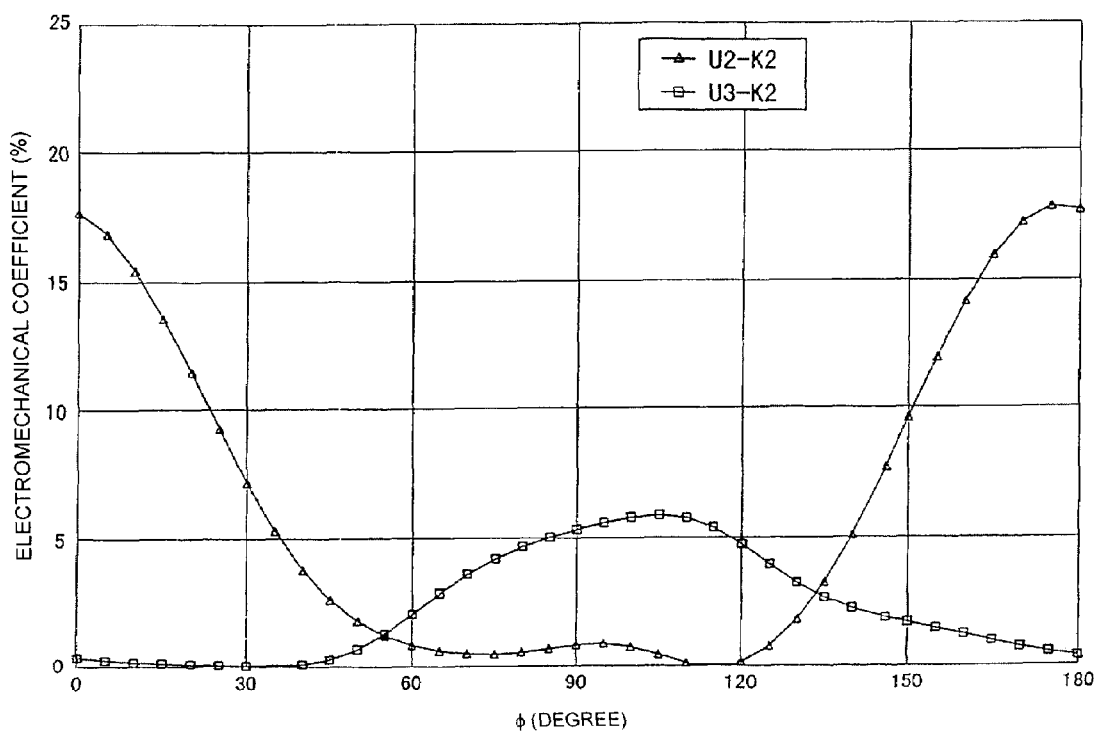
FIG. 66 is a graph showing the relationship between Euler angle ψ and the electromechanical coefficient $k^2$ in the structure in which Au electrodes are formed on a LiNbO₃ substrate having Euler angles (90°, 90°, ψ) and a SiO2 film is formed.
Figure 67:
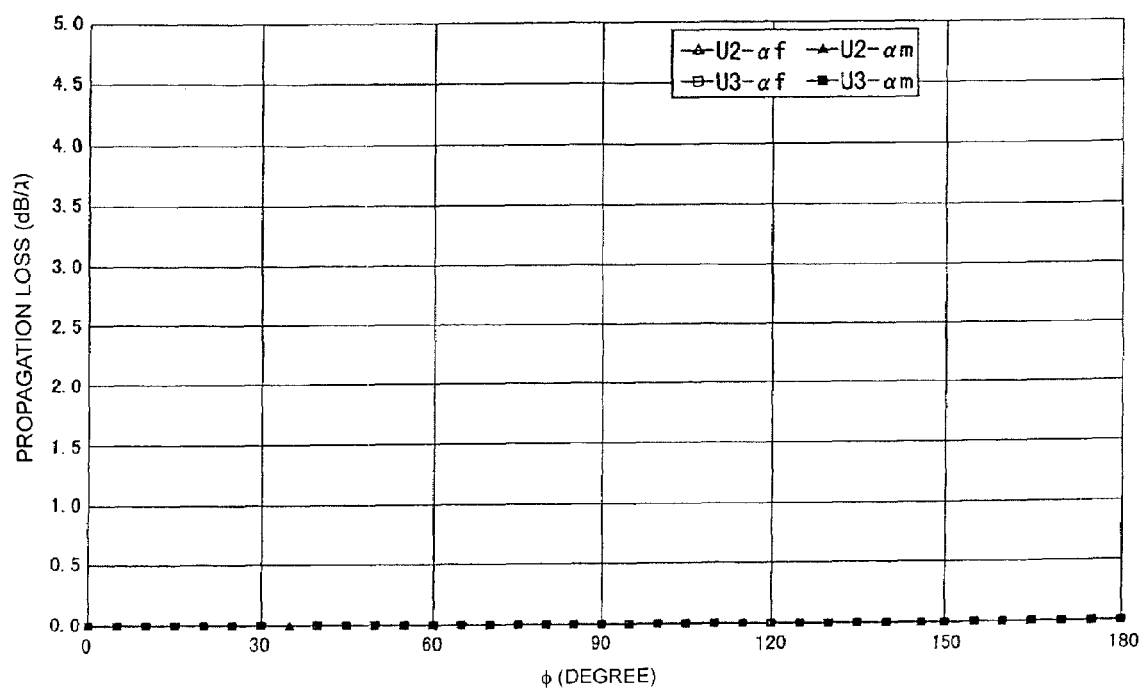
FIG. 67 is a graph showing the relationship between Euler angle ψ and the propagation loss α in the structure in which Au electrodes are formed on a LiNbO₃ substrate having Euler angles (90°, 90°, ψ) and a SiO2 film is formed.
Figure 68:
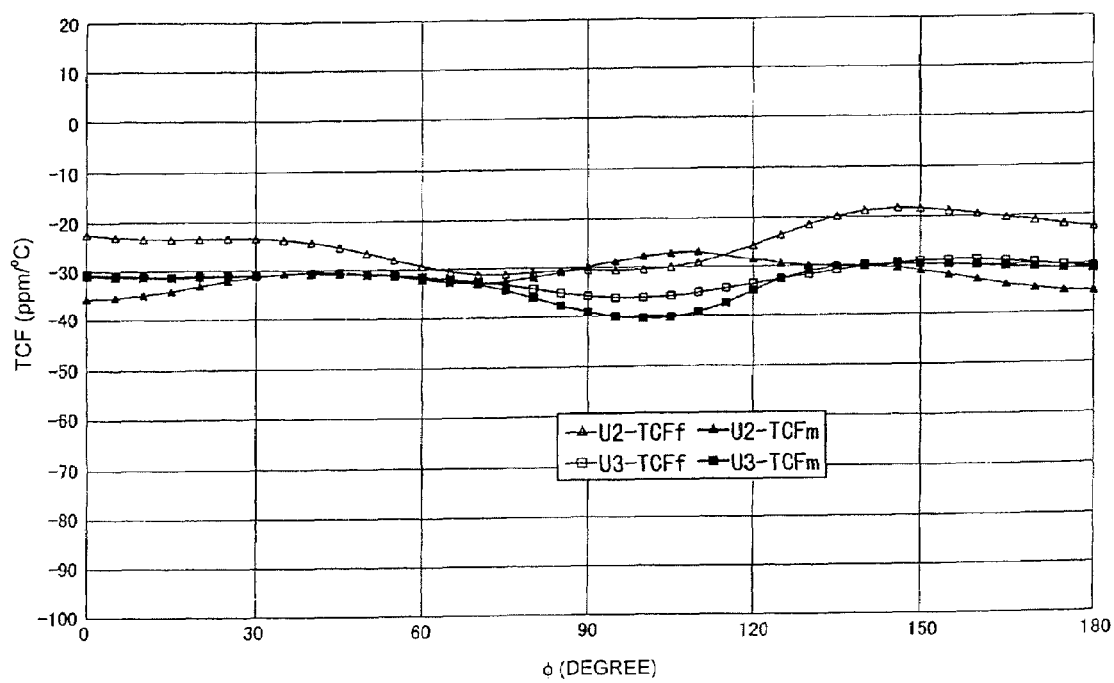
FIG. 68 is a graph showing the relationship between Euler angle ψ and the temperature coefficient of frequency TCF in the structure in which Au electrodes are formed on a LiNbO₃ substrate having Euler angles (90°, 90°, ψ) and a SiO2 film is formed.
Figure 75:
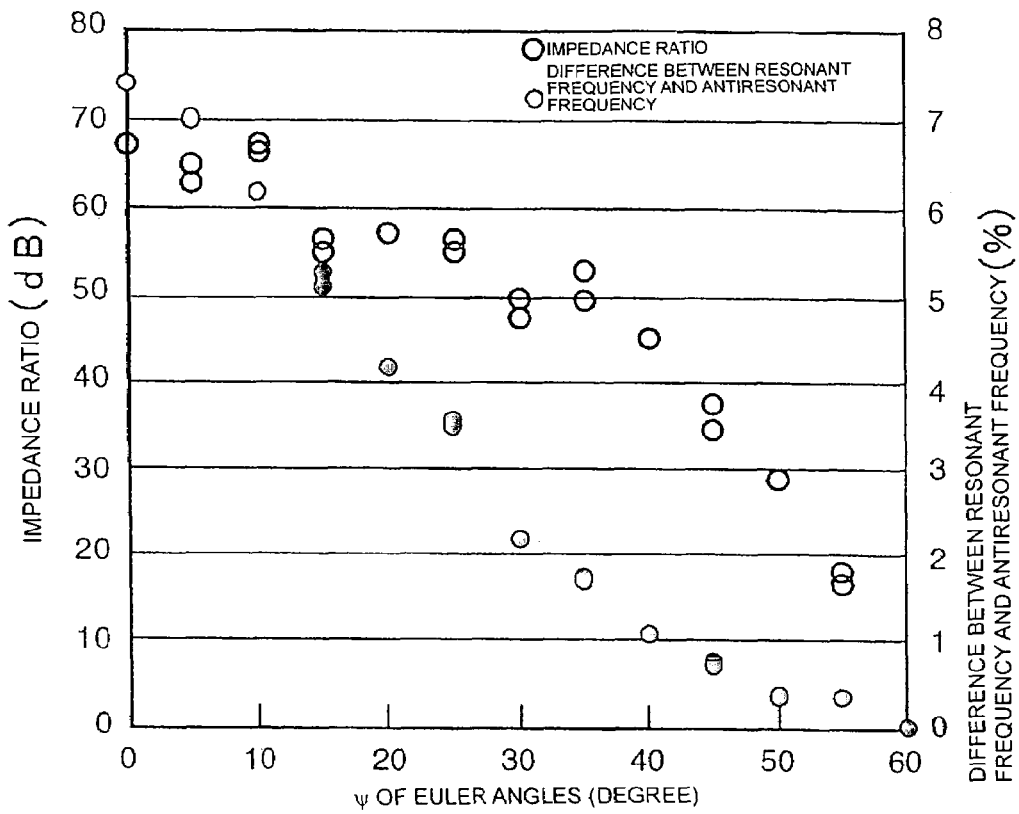
FIG. 75 is a graph showing the relationship of ψ of Euler angles (90°, 90°, ψ) with the difference between a resonant frequency and an antiresonant frequency and the impedance ratio in EXAMPLE 7.

When the band width of a longitudinal coupled resonator filter or that of a ladder type filter and the difference between the resonance frequency and the antiresonance frequency of a resonator can be optionally adjusted, the market for this application is expected to increase. The band width of a longitudinal coupled resonator filter or that of a ladder type filter and the difference between the resonance frequency and the antiresonance frequency of a resonator are in direct proportion to the electromechanical coefficient k$^2$ According to the graph shown in FIG. 66, at Euler angles in the range of (90°, 90°, 0°) to (90°, 90°, 60°) and (90°, 90°, 143°) to (90°, 90°, 180°), the electromechanical coefficient k$^2$ of the SH type boundary acoustic wave, which is a primary response, is about 0.8% to about 17.8%, and that the electromechanical coefficient of the Stoneley wave, which is a spurious response, is small, such as about 2%. Thus, in order to adjust the electromechanical coefficient $k^2$ of the SH type boundary acoustic wave, an SH boundary acoustic wave resonator was formed having the structure shown in Table 11 below. FIG. 74 is a graph showing the impedance properties obtained when a LiNbO$_3$ was used having ψ of Euler angles (90°, 90°, ψ) in the range of 0° to 35°. As shown in FIG. 66, since the electromechanical coefficient $k^2$ is changed from about 17.6% to about 5.3% as ψ is changed from 0° to 35°, the difference between the resonant and the antiresonant frequencies of the resonator is decreased. FIG. 75 is a graph showing the relationship of ψ of Euler angles (90°, 90°, ψ) with the difference between the resonant and the antiresonant frequencies and the impedance ratio. The difference between the resonant and the antiresonant frequencies is decreased when ψ is changed from about 0° to about 60° as is the change in $k^2$ shown in FIG. 66. In addition, it is confirmed that when ψ is in the range of about 0° to about 50°, superior resonant properties having an impedance ratio of at least about 30 dB is obtained. When a ladder type filter or 2IDT or 3IDT longitudinal coupled resonator type filter is formed under the same conditions as described above, as has been well known, the band width of the filter is two times the difference between the resonant and the antiresonant frequencies. Thus, various devices from broad-band resonators and filters to narrow-band resonators and filters can be formed.

TABLE 11

| ITEMS | DETAILS |
| --- | --- |
| STRUCTURE | SiO$_2$/Au/LiNbO$_3$ |
| SiO$_2$ THICKNESS | 3 λ |
| Au THICKNESS | 0.055 λ |
| IDT, REFLECTOR PERIOD λ | 2.2 μm |
| IDT CONFIGURATION | NORMAL TYPE SINGLE STRIP, 50 PAIRS, OPEN LENGTH OF 31 λ, CROSS WIDTH of 30 λ |
| REFLECTOR CONFIGURATION | NORMAL TYPE SINGLE STRIP, 51 STRIPS, OPEN LENGTH OF 31 λ |

When the thickness H of the electrode is reduced, the Stoneley wave is slow as compared to the SH type boundary acoustic wave. However, when the electrode thickness is increased, the SH type boundary acoustic wave becomes slow as compared to the Stoneley wave. The reason for this is believed to be an increased concentration of energy of the SH type boundary acoustic wave at a boundary layer having a slow acoustic velocity as compared to that of the Stoneley wave.

The thickness of the electrode at which the acoustic velocity of the Stoneley wave becomes higher or lower than that of the SH type boundary acoustic wave is changed depending on the Euler angles of the LiNbO$_3$ substrate. However, at an electrode thickness in the range of about 0.01λ to about 0.03λ, the change in relationship therebetween described above occurred. The reason the spurious response caused by the Stoneley wave was generated at a higher frequency side than the response of the SH type boundary acoustic wave in EXAMPLES 2, 4, and 5 is this phenomenon.

As described above, when the response of the Stoneley wave, which is a spurious response, is disposed at a higher frequency side than the response of the SH type boundary acoustic wave, which is a primary response, the acoustic velocity of the Stoneley wave becomes higher than that of the SH type boundary acoustic wave. In this case, when the acoustic velocity of the SH type boundary acoustic wave is decreased to less than that of slow transverse waves of two media forming the boundary, and the acoustic velocity of the Stoneley wave is increased to greater than that of at least one of the slow transverse waves of the two media forming the boundary, the propagation loss of the Stoneley wave is increased, and thus, the spurious response is suppressed. When a boundary acoustic wave device is formed using an IDT, the acoustic velocity of a boundary acoustic wave propagating in the IDT portion is obtained by multiplying the response frequency of the boundary acoustic wave and a strip period λI of the IDT.

In addition, in addition to Au, Ag, Cu, or Al, the electrode may be formed using a conductive film composed of, for example, Fe, Ni, W, Ta, Pt, Mo, Cr, Ti, ZnO, or ITO. In addition, in order to improve adhesion and electric power resistance, onto an electrode layer made of Au, Ag, Cu, Al, or an alloy thereof, at least one second electrode layer made of a different metal material such as Ti, Cr, or a NiCr alloy may be laminated. In this case, the second electrode layer may be provided between a first electrode layer and the piezoelectric substance or between the first electrode layer and the dielectric substance, or the second electrode layers may be provided at both locations described above.

Furthermore, in the boundary acoustic wave device according to preferred embodiments of the present invention, in order to improve the strength of the boundary acoustic wave device or to prevent corrosive gases from entering, a protective layer may be formed outside the laminate composed of the dielectric substance, electrodes, and piezoelectric substance along the lamination direction. In some cases, the boundary acoustic wave device according to preferred embodiments of the present invention may be sealed in a package.

The protective layer described above may be formed of an insulating material such as titanium oxide, aluminum nitride, or aluminum oxide, a metal film such as Au, Al, or W, or a resin such as a urethane, an epoxy, or a silicone resin.

In addition, in preferred embodiments of the present invention, the above-described piezoelectric substance may be a piezoelectric film formed on a dielectric substance.

In preferred embodiments of the present invention, the thickness of the dielectric substance and that of the piezoelectric substance are not required to be infinite as in the model used as the base for calculation and may be sufficient when energy of the boundary acoustic wave is confined around the electrodes which function as the boundary. That is, for example, the thickness may be about 1λ or more.

Example 8

Figure 76:
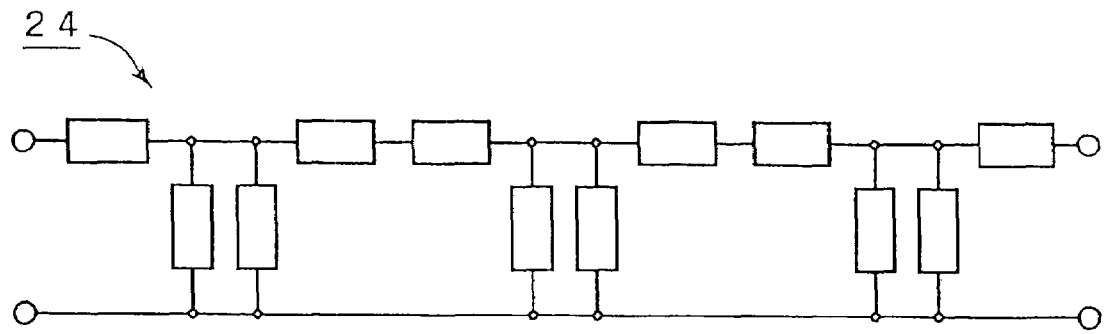
FIG. 76 is a view showing a circuit structure of a ladder type filter formed using an SH type boundary acoustic wave resonator in EXAMPLE 8.

In addition, when the above-described protective layers are formed outside of a boundary acoustic wave structure composed of a dielectric substance, electrodes, and a piezoelectric substance to form the structure, for example, of the protective layer, the dielectric substance, the electrodes, the piezoelectric substance, and the protective layer, and when oscillation is allowed to slightly leak into protective layer portions, the thickness of the dielectric substance and that of the piezoelectric substance can be decreased. For example, in a ladder type filter 24 having a circuit structure shown in FIG. 76 formed by using an SH type boundary acoustic wave resonator having an epoxy resin/SiO$_2$/Au-IDT/LiNbO$_3$ structure, when the thickness of SiO$_2$ was about 1λ, the insertion loss of the propagation properties was about 1.5 dB, and when the thickness was about 0.71λ, the loss was about 1.8 dB. Thus, it was confirmed that although being degraded as the thickness of SiO$_2$ is decreased, the loss is still at an acceptable level. In the boundary acoustic wave device according to preferred embodiments of the present invention, since the IDT is formed using a heavy material, energy of the SH boundary acoustic wave is concentrated at and distributed around the Au-IDT which is the boundary layer, as described above, and the amount of energy leaking from the SiO$_2$ having a small acoustic damping to the epoxy resin having a large damping is small. Hence, even when the thickness of SiO$_2$ is decreased, the degradation in loss is small.

In this case, the thickness of the epoxy resin was about 3λ, the thickness of Au was about 0.054λ, the thickness of LN was about 146λ, and the Euler angles of the LiNbO$_3$ were (0°, 105°, 0°). In addition, in the SH type boundary acoustic wave resonator used for the ladder type filter, the IDT had an open length of about 30λ and 50 pairs having a normal type single strip structure, the reflector had 50 normal type single strip structures, the distance between the IDT and the reflector was about 0.5λ as the distance between the centers of adjacent strips, and the period of the IDT was about 2.4 μm which was equal to that of the reflector.

Furthermore, in preferred embodiments of the present invention, the electrodes may include a sheet electrode film defining a waveguide or a bus bar, an IDT or comb-shaped electrode exciting a boundary acoustic wave, and a reflector reflecting a boundary acoustic wave.

In addition, in this specification, as the Euler angles which represent the cut surface of a substrate and the propagation direction of a boundary acoustic wave, the right-hand Euler angle system is used which has been disclosed in "Acoustic Wave Device Technology Handbook" (edited by Acoustic Wave Device Technology 150th Committee of the Japan Society for the Promotion of Science, first print/first edition issued on Nov. 30, 2001, p. 549). That is, with respect to crystal axes X, Y, and Z of LN, an Xa axis is obtained by φ rotation of the X axis about the Z axis in an counter-clockwise direction. Next, a Z' axis is obtained by θ rotation of the Z axis about the Xa axis in a counter-clockwise direction. A plane including the Xa axis and having the Z' axis as the normal line is set as the cut surface of a substrate. Subsequently, the direction of an X' axis obtained by ψ rotation of the Xa axis about the Z' axis in a counter-clockwise direction is set as the propagation direction of a boundary acoustic wave.

In addition, as for the crystal axes X, Y, and Z of LiNbO$_3$ represented as the initial values of Euler angles, the Z axis is set parallel to the c-axis, the X axis is set parallel to any one of the three equivalent a-axes in three different directions, and the Y axis is set parallel to the normal line of a plane including the X axis and the Z axis.

In addition to the Euler angles (φ, θ, ψ) of LiNbO$_3$ of preferred embodiments of the present invention, Euler angles equivalent thereto from a crystallographic point of view may also used. For example, according to technical document 7 (Journal of the Acoustical Society of Japan, Vol. 36, No. 3, 1980, pp. 140 to 145), since LiNbO$_3$ is a trigonal crystal belonging to the 3 m point group, the following equation (A) holds.

$$F(\phi, \theta, \psi) = F(60° - \phi, -\theta, \psi) \quad \text{Equation (A)}$$
$$= F(60° + \phi, -\theta, 180° - \psi)$$
$$= F(\phi, 180° + \theta, 180° - \psi)$$
$$= F(\phi, \theta, 180° + \psi)$$

In the above equation, F is an optional boundary acoustic-wave property, such as the electromechanical coefficient k$^2$, propagation loss, TCF, PFA, or a natural unidirectional property. As for PFA and natural unidirectional property, for example, when the propagation direction is reversed, although a plus or a minus sign indicating the direction is changed, the absolute value of the property is not changed, and thus, it can be construed that they are practically equivalent to each other. In addition, although the technical document 7 relates to the surface acoustic wave, even when the boundary acoustic wave is discussed, the symmetry of crystal may also be handled in the same manner as disclosed the technical document 7. For example, propagation properties of a boundary acoustic wave at Euler angles (30°, θ, ψ) are equivalent to those at Euler angles (90°, 180°−θ, 180°−ψ). In addition, propagation properties of a boundary acoustic wave at Euler angles (30°, 90°, 45°) are equivalent to those at Euler angles shown in Table 12 below.

In addition, the material constant of the electrode used for calculation in preferred embodiments of the present invention is the value of a polycrystalline substance. However, even in a crystal substance such as an epitaxial film, since the crystal orientation dependence of a substrate substantially influences the boundary acoustic wave properties as compared to that of the film itself, in the case of the equivalent Euler angles represented by the equation (A), equivalent propagation properties which do not cause any practical problems can be obtained.

The present invention is not limited to each of the preferred embodiments described above. Various changes and modifications may be possible within the scope of the claims. An embodiment obtained by appropriately combining the technical means disclosed in different embodiments is also included in the technological scope of the present invention.

The invention claimed is:

1. A boundary acoustic wave device comprising:
    a piezoelectric substance;
    a dielectric substance laminated on one surface of the piezoelectric substance; and
    electrodes disposed at a boundary between the piezoelectric substance and the dielectric substance, the boundary acoustic wave device utilizing an SH type boundary acoustic wave propagating along the boundary; wherein
    the thickness of the electrodes is set such that the acoustic velocity of the SH type boundary acoustic wave is less than that of a slow transverse wave propagating in the dielectric substance and than that of a slow transverse wave propagating in the piezoelectric substance.

2. The boundary acoustic wave device according to claim 1, wherein each of the electrodes primarily comprises an electrode layer which is composed of at least one conductive material selected from the group consisting of Au, Ag, Cu, Al, Fe, Ni, W, Ta, Pt, Mo, Cr, Ti, ZnO, ITO, and an alloy primarily containing at least one of the conductive materials.

3. The boundary acoustic wave device according to claim 2, wherein each of the electrodes further comprises at least one second electrode layer containing a conductive material other than the conductive materials forming the electrode layer.

4. A boundary acoustic wave device comprising:
    a piezoelectric substance primarily composed of LiNbO$_3$;
    a dielectric substance laminated on one surface of the piezoelectric substance; and
    electrodes disposed at a boundary between the piezoelectric substance and the dielectric substance, the boundary acoustic wave device using an SH type boundary acoustic wave propagating along the boundary; wherein
    φ of Euler angles (φ, θ, ψ) of the piezoelectric substance primarily composed of LiNbO$_3$ is in the range of about −31° to about +31°, and θ and ψ are in a region surrounded by points A01 to A13 in Table 1 below:

TABLE 1

| POINT | ψ(°) | θ(°) |
|---|---|---|
| A01 | 0 | 116 |
| A02 | 11 | 118 |
| A03 | 20 | 123 |
| A04 | 25 | 127 |
| A05 | 33 | 140 |
| A06 | 60 | 140 |
| A07 | 65 | 132 |
| A08 | 54 | 112 |
| A09 | 48 | 90 |
| A10 | 43 | 87 |
| A11 | 24 | 90 |
| A12 | 0 | 91 |
| A13 | 0 | 116. |

5. The boundary acoustic wave device according to claim 1, wherein θ and ψ of the Euler angles are in a region surrounded by points D01 to D07 in Table 2 below:

TABLE 2

| POINT | ψ(°) | θ(°) |
|---|---|---|
| D01 | 0 | 126 |
| D02 | 13 | 123 |
| D03 | 25 | 112 |
| D04 | 30 | 96 |
| D05 | 29 | 80 |
| D06 | 0 | 80 |
| D07 | 0 | 126. |

6. The boundary acoustic wave device according to claim 4, wherein the thickness of the electrodes is set such that the acoustic velocity of the SH type boundary acoustic wave is less than that of a slow transverse wave propagating in the dielectric substance and than that of a slow transverse wave propagating in the piezoelectric substance.

7. The boundary acoustic wave device according to claim 4, wherein the electrodes are defined by strips, and a duty ratio of strips defining the electrodes is set such that the acoustic velocity of the SH type boundary acoustic wave is less than that of a slow transverse wave propagating in the dielectric substance and than that of a slow transverse wave propagating in the piezoelectric substance.

8. The boundary acoustic wave device according to claim 4, wherein the density ρ of the electrodes is more than about 3,745 kg/m³.

9. The boundary acoustic wave device according to claim 4, wherein the thickness H of the electrodes satisfies the following equation (1):

$$33,000.39050\rho^{-1.50232} < H < 88,818.90913\rho^{-1.54998} \quad \text{equation (1)}.$$

10. The boundary acoustic wave device according to claim 4, wherein each of the electrodes primarily comprises an electrode layer which is composed of at least one conductive material selected from the group consisting of Au, Ag, Cu, Al, Fe, Ni, W, Ta, Pt, Mo, Cr, Ti, ZnO, ITO, and an alloy primarily containing at least one of the conductive materials.

11. The boundary acoustic wave device according to claim 10, wherein each of the electrodes further comprises at least one second electrode layer containing a conductive material other than the conductive materials forming the electrode layer.

12. A boundary acoustic wave device comprising:
a piezoelectric substance primarily composed of LiNbO₃;
a dielectric substance laminated on one surface of the piezoelectric substance and primarily composed of SiO₂; and
electrodes disposed at a boundary between the piezoelectric substance and the dielectric substance; wherein
when the density of the electrodes, the thickness of the electrodes, and the wavelength of a boundary acoustic wave are represented by ρ (kg/m³), H (λ), and λ, respectively, H>8,261.744ρ⁻¹·³⁷⁶ holds, and Euler angles of the piezoelectric substance are in the range of
(0°, 90°, 0°) to (0°, 90°, 38°), (0°, 90°, 142°) to (0°, 90°, 180°), (90°, 90°, 0°) to (90°, 90°, 36°), (90°, 90°, 140°) to (90°, 90°, 180°), (0°, 55°, 0°) to (0°, 134°, 0°), (90°, 51°, 0°) to (90°, 129°, 0°), or (0°, 90°, 0°) to (180°, 90°, 0°).

13. The boundary acoustic wave device according to claim 12, wherein the Euler angles of the piezoelectric substance are equivalent to Euler angles represented by the following equation (A) at which boundary acoustic wave properties are obtained which are substantially equivalent to those of the piezoelectric substance:

$$F(\phi, \theta, \psi) = F(60° - \phi, -\theta, \psi) \quad \text{equation (A)}$$
$$= F(60° + \phi, -\theta, 180° - \psi)$$
$$= F(\theta, 180° + \theta, 180° - \psi)$$
$$= F(\phi, \theta, 180° + \psi)\ldots.$$

14. The boundary acoustic wave device according to claim 12, wherein the density ρ of the electrodes is more than about 3,745 kg/m³.

15. The boundary acoustic wave device according to claim 12, wherein the thickness H of the electrodes satisfies the following equation (1):

$$33,000.39050\rho^{-1.50232} < H < 88,818.90913\rho^{-1.54998} \quad \text{equation (1)}.$$

16. The boundary acoustic wave device according to claim 12, wherein each of the electrodes primarily comprises an electrode layer which is composed of at least one conductive material selected from the group consisting of Au, Ag, Cu, Al, Fe, Ni, W, Ta, Pt, Mo, Cr, Ti, ZnO, ITO, and an alloy primarily containing at least one of the conductive materials.

17. The boundary acoustic wave device according to claim 16, wherein each of the electrodes further comprises at least one second electrode layer containing a conductive material other than the conductive materials forming the electrode layer.

18. A boundary acoustic wave device comprising:
a piezoelectric substance primarily composed of LiNbO₃;
a dielectric substance laminated on one surface of the piezoelectric substance and primarily composed of SiO₂; and
electrodes disposed at a boundary between the piezoelectric substance and the dielectric substance, the boundary acoustic wave device using an SH type boundary acoustic wave propagating along the boundary; wherein
when the density of the electrodes, the thickness of the electrodes, and the wavelength of the boundary acoustic wave are represented by ρ (kg/m³), H (λ), and λ, respectively, H>8,261.744ρ⁻¹·³⁷⁶ is maintained.

19. The boundary acoustic wave device according to claim 18, wherein the density ρ of the electrodes is more than about 3,745 kg/m³.

20. The boundary acoustic wave device according to claim 18, wherein the thickness H of the electrodes satisfies the following equation (1):

$$33{,}000.39050\rho^{-1.50232} < H < 88{,}818.90913\rho^{-1.54998} \quad \text{equation (1).}$$

21. The boundary acoustic wave device according to claim 18, wherein each of the electrodes primarily comprises an electrode layer which is composed of at least one conductive material selected from the group consisting of Au, Ag, Cu, Al, Fe, Ni, W, Ta, Pt, Mo, Cr, Ti, ZnO, ITO, and an alloy primarily containing at least one of the conductive materials.

22. The boundary acoustic wave device according to claim 21, wherein each of the electrodes further comprises at least one second electrode layer containing a conductive material other than the conductive materials forming the electrode layer.

23. A boundary acoustic wave device comprising a boundary acoustic-wave propagation structure in which an SH type boundary acoustic wave and a Stoneley wave propagate, wherein the acoustic velocity of the SH type boundary acoustic wave is less than that of slow transverse waves of two media forming a boundary, and the acoustic velocity of the Stoneley wave is greater than that of at least one of the slow transverse waves of the two media.

24. The boundary acoustic wave device according to claim 23, wherein each of the electrodes primarily comprises an electrode layer which is composed of at least one conductive material selected from the group consisting of Au, Ag, Cu, Al, Fe, Ni, W, Ta, Pt, Mo, Cr, Ti, ZnO, ITO, and an alloy primarily containing at least one of the conductive materials.

25. The boundary acoustic wave device according to claim 24, wherein each of the electrodes further comprises at least one second electrode layer containing a conductive material other than the conductive materials forming the electrode layer.

* * * * *